US008639204B2

(12) United States Patent
Corman et al.

(10) Patent No.: US 8,639,204 B2
(45) Date of Patent: *Jan. 28, 2014

(54) MULTI-BEAM ACTIVE PHASED ARRAY ARCHITECTURE

(75) Inventors: David W. Corman, Gilbert, AZ (US); Rob Zienkewicz, Chandler, AZ (US); David R Saunders, Scottsdale, AZ (US)

(73) Assignee: ViaSat, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/412,901

(22) Filed: Mar. 6, 2012

(65) Prior Publication Data

US 2012/0184229 A1   Jul. 19, 2012

Related U.S. Application Data

(63) Continuation of application No. 12/759,059, filed on Apr. 13, 2010, now Pat. No. 8,160,530.

(60) Provisional application No. 61/237,967, filed on Aug. 28, 2009, provisional application No. 61/259,375, filed on Nov. 9, 2009, provisional application No. 61/234,513, filed on Aug. 17, 2009, provisional application No. 61/222,354, filed on Jul. 1, 2009, provisional application No. 61/168,913, filed on Apr. 13, 2009, provisional application No. 61/259,049, filed on Nov. 6, 2009, provisional application No. 61/234,521, filed on Aug. 17, 2009, provisional application No. 61/265,605, filed on Dec. 1, 2009, provisional application No. 61/222,363, filed on Jul. 1, 2009.

(51) Int. Cl.
*H04B 1/38* (2006.01)
*H01Q 19/00* (2006.01)

(52) U.S. Cl.
USPC ................... 455/276.1; 455/273; 455/63.4

(58) Field of Classification Search
USPC .............. 455/269, 272, 273, 276.1, 289, 290, 455/291, 292, 63.4, 562.1; 343/756
See application file for complete search history.

(56) References Cited

U.S. PATENT DOCUMENTS 3,119,965 A   1/1964   Phillips
4,857,777 A   8/1989   Altes
(Continued)

FOREIGN PATENT DOCUMENTS

EP   0762660   3/1997
EP   1193861   4/2002
(Continued)

OTHER PUBLICATIONS

Notice of Allowance dated Aug. 14, 2012 in U.S. Appl. No. 12/759,123.

(Continued)

*Primary Examiner* — Blane J Jackson
(74) *Attorney, Agent, or Firm* — Snell & Wilmer LLP

(57) ABSTRACT

In an exemplary embodiment, a phased array antenna comprises multiple subcircuits in communication with multiple radiating elements. The radio frequency signals are adjusted for both polarization control and beam steering. In a receive embodiment, multiple RF signals are received and combined into at least one receive beam output. In a transmit embodiment, at least one transmit beam input is divided and transmitted through multiple radiating elements. In an exemplary embodiment, the phased array antenna provides multi-beam formation over multiple operating frequency bands. The wideband nature of the active components allows for operation over multiple frequency bands simultaneously. Furthermore, the antenna polarization may be static or dynamically controlled at the subarray or radiating element level.

20 Claims, 29 Drawing Sheets

(56) References Cited

U.S. PATENT DOCUMENTS

| | | | |
|---|---|---|---|
| 4,896,374 | A | 1/1990 | Waugh et al. |
| 4,965,602 | A | 10/1990 | Kahrilas et al. |
| 4,994,773 | A | 2/1991 | Chen et al. |
| 5,045,822 | A | 9/1991 | Mohwinkel |
| 5,270,719 | A | 12/1993 | Roth |
| 5,907,815 | A | 5/1999 | Grimm et al. |
| 5,942,929 | A | 8/1999 | Aparin |
| 5,966,049 | A | 10/1999 | Yuen et al. |
| 6,005,515 | A | 12/1999 | Allen et al. |
| 6,061,553 | A | 5/2000 | Matsuoka et al. |
| 6,232,837 | B1 | 5/2001 | Yoo et al. |
| 6,326,845 | B1 | 12/2001 | Miyaji et al. |
| 7,089,859 | B2 | 8/2006 | Caban et al. |
| 7,319,345 | B2 | 1/2008 | Farjad-rad et al. |
| 7,355,470 | B2 | 4/2008 | Sorrells et al. |
| 7,378,902 | B2 | 5/2008 | Sorrells et al. |
| 7,400,193 | B2 | 7/2008 | Wyatt |
| 7,408,507 | B1 | 8/2008 | Paek et al. |
| 7,420,423 | B2 | 9/2008 | Lee et al. |
| 7,421,036 | B2 | 9/2008 | Sorrells et al. |
| 7,436,370 | B2 | 10/2008 | Blanton |
| 7,620,129 | B2 | 11/2009 | Sorrells et al. |
| 7,672,653 | B2 | 3/2010 | Cowley et al. |
| 7,728,784 | B2 | 6/2010 | Mohamadi |
| 7,746,764 | B2 | 6/2010 | Rawlins et al. |
| 7,750,733 | B2 | 7/2010 | Sorrells et al. |
| 7,755,430 | B2 | 7/2010 | Imagawa |
| 7,885,682 | B2 | 2/2011 | Sorrells et al. |
| 8,013,784 | B2 | 9/2011 | Margomenos et al. |
| 2002/0113648 | A1 | 8/2002 | Miyaji et al. |
| 2003/0016085 | A1 | 1/2003 | Yamazaki |
| 2003/0162566 | A1 | 8/2003 | Shapira et al. |
| 2004/0095190 | A1 | 5/2004 | Klaren |
| 2004/0121750 | A1 | 6/2004 | Nation |
| 2004/0229584 | A1 | 11/2004 | Fischer et al. |
| 2005/0113052 | A1 | 5/2005 | Rabinovich et al. |
| 2005/0151698 | A1 | 7/2005 | Mohamadi |
| 2006/0170499 | A1 | 8/2006 | Rahman et al. |
| 2007/0248186 | A1 | 10/2007 | Sorrells et al. |
| 2007/0275674 | A1 | 11/2007 | Chien |
| 2007/0280384 | A1 | 12/2007 | Hidaka |
| 2008/0129408 | A1 | 6/2008 | Nagaishi et al. |
| 2008/0129634 | A1 | 6/2008 | Pera |
| 2008/0218424 | A1 | 9/2008 | Blanton |
| 2009/0091384 | A1 | 4/2009 | Sorrells et al. |
| 2010/0039174 | A1 | 2/2010 | Teetzel |
| 2010/0073085 | A1 | 3/2010 | Sorrells et al. |
| 2010/0097138 | A1 | 4/2010 | Sorrells et al. |
| 2010/0225389 | A1 | 9/2010 | Teetzel |
| 2010/0321107 | A1 | 12/2010 | Honcharenko |

FOREIGN PATENT DOCUMENTS

| | | |
|---|---|---|
| JP | 2003168938 | 6/2003 |
| WO | 99/45609 | 8/1999 |
| WO | 0003456 | 1/2000 |
| WO | 02/41442 | 5/2002 |
| WO | 03/036756 | 5/2003 |

OTHER PUBLICATIONS

Notice of Allowance dated Aug. 20, 2012 in U.S. Appl. No. 12/759,148.
Office Action dated Aug. 21, 2012 in U.S. Appl. No. 12/759,113.
Final Office Action dated Sep. 17, 2012 in U.S. Appl. No. 12/759,043.
Office Action dated Aug. 2, 2012 in U.S. Appl. No. 12/758,996.
Notice of Allowance dated May 10, 2012 in U.S. Appl. No. 12/759,130.
Office Action dated May 17, 2012 in U.S. Appl. No. 12/759,043.
Supplemental Notice of Allowability dated May 29, 2012 in U.S. Appl. No. 12/759,130.
Office Action dated May 29, 2012 in U.S. Appl. No. 12/759,123.
Final Office Action dated Jun. 5, 2012 in U.S. Appl. No. 12/759,148.
Supplemental Notice of Allowability dated Jun. 11, 2012 in U.S. Appl. No. 12/759,130.
Notice of Allowance dated Nov. 8, 2012 in U.S. Appl. No. 12/759,043.
Notice of Allowance dated Dec. 6, 2012 in U.S. Appl. No. 13/540,394.
Office Action dated Dec. 19, 2012 in U.S. Appl. No. 12/758,914.
Notice of Allowance dated Dec. 21, 2012 in U.S. Appl. No. 12/759,113.
Notice of Allowance dated Jan. 30, 2013 in U.S. Appl. No. 12/758,996.
A Q-Band (40-45 GHz) 16-Element Phased-Array Transmitter in 0.18-μm SiGe BiCMOS Technology.
An X- and Ku-Band 8-Element Phased-Array Receiver in 0.18-μm SiGe BiCMOS Technology.
Tokumitsu et al.—Active isolator, combiner, divider, and magic-T as miniaturized function blocks.
Aminghasem Safarian et al., "Distributed Active Power Combiners and Splitters for Multi-Antenna UWB Transceivers".
Viallon et al. "An Original SiGe Active Differential Output Power Splitter for MMW Application".
Hsiao "Analysis of Interleaved Arrays of Waveguide Elements".
International Preliminary Report on Patentability dated Jul. 21, 2011 from PCT/US10/30906.
International Preliminary Report on Patentability dated Jul. 20, 2011 from PCT/US10/30892.
Notice of Allowance dated Jul. 27, 2011 in U.S. Appl. No. 12/759,064.
Kwang-Jin, Koh, Gabriel M. Rebeiz, 0.13-mu m CMOS phase shifters for X-, Ku, and K-band phased arrays, IEEE Journal of Solid State Circuits, 2007, 14 pages.
Kwang-Jin, Koh, Jason W. May, Gabriel M. Rebeiz a Q-Band (40-45 GHz) 16-Element Phased-Array Transmitter in 0.18-μm SiGe BiCMOS Technology, IEEE Radio Frequency Integrated Circuits Symposium, 2008, 4 pages.
Kwang-Jin, Koh, Gabriel M. Rebeiz, an X- and Ku-Band 8-Element Phased-Array Receiver in 0.18-μm SiGe BiCMOS Technology, IEEE Journal of Solid State Circuits, Jun. 2008, 12 pages.
Tokumitsu et al.—Active isolator, combiner, divider and magic-T as miniaturized function blocks dated Nov. 6, 1998, pp. 273-276.
Aminghasem Safarian et al., "Distributed Active Power Combiners and Splitters for Multi-Antenna UWB Transceivers" Sep. 2006, pp. 138-141.
Viallon et al. "An Original SiGe Active Differential Output Power Splitter for MMW Application" 2003, 4 pages.
Hsiao "Analysis of Interleaved Arrays of Waveguide Elements" IEEE Transactions on Antennas and Propadation, vol. AP-19, No. 6 Nov. 1971, pp. 729-735.
Office Action dated May 21, 2013 in U.S. Appl. No. 12/759,112.
Notice of Allowance dated Jul. 5, 2013 in U.S. Appl. No. 12/758,914.
0.13-mu m CMOS phase shifters for X-, Ku, and K-band phased arrays.
Zheng et al., "Full 360 degree Vector-Sum Phase-Shifter for Microwave System Applications," IEEE Transactions on Circuits and Systems I: Regular Papers, Downloaded on Jul. 8, 2009, pp. 1-7.
Ayari et al., "Automatic Test Vector Generation for Mixed-Signal Circuits," 1995, Ecole Polytechnique of the University of Montreal, 6 pages.
Strassberg, Dan, "RF-vector-signal generator combines high throughput, low phase noise," EDN, Oct. 6, 2009, 2 pages, UBM Electronics.
International Search Report and Written Opinion dated Jul. 19, 2010 from PCT US10/030881.
International Search Report and Written Opinion dated Aug. 23, 2010 from PCT US10/030864.
International Search Report and Written Opinion dated Oct. 27, 2010 from PCT US10/030876.
International Search Report and Written Opinion dated Nov. 18, 2010 from PCT/US10/30871.
International Search Report and Written Opinion dated Nov. 26, 2010 from PCT/US10/30868.
International Search Report and Written Opinion dated Nov. 26, 2010 from PCT/US10/30877.

(56) References Cited

OTHER PUBLICATIONS

International Search Report and Written Opinion dated Nov. 26, 2010 from PCT/US/30866.
International Search Report and Written Opinion dated Nov. 26, 2010 from PCT/US10/30892.
International Search Report and Written Opinion dated Nov. 30, 2010 from PCT/US10/30906.
International Search Report and Written Opinion dated Nov. 26, 2010 from PCT/US10/30872.
Office Action dated Apr. 7, 2011 in U.S. Appl. No. 12/759,064.
International Preliminary Report on Patentability dated Jul. 21, 2011 from PCT/US2010/030877.
International Preliminary Report on Patentability dated Jul. 21, 2011 from PCT/US10130906.
International Preliminary Report on Patentability dated Jul. 20, 2011 from PCT/US10130892.
Notice of Allowance dated Jul. 27, 2011 in US U.S. Appl. No. 12/759,064.
Office Action dated Sep. 29, 2011 in U.S. Appl. No. 12/759,059.
International Preliminary Report on Patentability dated Oct. 27, 2011 from PCT US10/030864.
International Preliminary Report on Patentability dated Oct. 27, 2011 from PCT/US10/30868.
International Preliminary Report on Patentability dated Oct. 27, 2011 from PCT US10/030881.
International Preliminary Report on Patentability dated Oct. 27, 2011 from PCT/US10/30872.
International Preliminary Report on Patentability dated Oct. 27, 2011 from PCT/US10/30871.
International Preliminary Report on Patentability dated Oct. 27, 2011 from PCT/US/30866.
International Preliminary Report on Patentability dated Oct. 27, 2011 from PCT US10/030876.
Office Action dated Jan. 4, 2012 from U.S. Appl. No. 12/759,148.
Office Action dated Feb. 27, 2012 in U.S. Appl. No. 12/759,130.
Notice of Allowance dated Feb. 28, 2012 in U.S. Appl. No. 12/759,059.
Office Action dated May 7, 2012 in U.S. Appl. No. 12/759,113.
Notice of Allowance dated Nov. 6, 2013 in U.S. Appl. No. 13/306,937.
Notice of Allowance dated Sep. 3, 2013 in U.S. Appl. No. 13/692,683.
Office Action dated Sep. 24, 2013 in U.S. Appl. No. 13/771,884.
Office Action dated Sep. 6, 2013 in U.S. Appl. No. 12/759,112.
Notice of Allowance dated Nov. 26, 2013 in U.S. Appl. No. 13/692,683.

Distribution Pattern         Practical Distribution Illustration

MULTI-BEAM ACTIVE PHASED ARRAY ARCHITECTURE

CROSS. REFERENCE TO RELATED APPLICATIONS

This application is a continuation of U.S. application Ser. No. 12/759,059, entitled "MULTI-BEAM ACTIVE PHASED ARRAY ARCHITECTURE," which was filed on Apr. 13, 2010, which is a non-provisional of U.S. Provisional Application No. 61/237,967, entitled "ACTIVE BUTLER AND BLASS MATRICES," which was filed on Aug. 28, 2009. This application is also a non-provisional of U.S. Provisional Application No. 61/259,375, entitled "ACTIVE HYBRIDS FOR ANTENNA SYSTEMS," which was filed on Nov. 9, 2009. This application is a non-provisional of U.S. Provisional Application No. 61/234,513, entitled "ACTIVE FEED FORWARD AMPLIFIER," which was filed on Aug. 17, 2009. This application is a non-provisional of U.S. Provisional Application No. 61/222,354, entitled "ACTIVE PHASED ARRAY ARCHITECTURE," which was filed on Jul. 1, 2009. This application is a non-provisional of U.S. Provisional Application No. 61/168,913, entitled "ACTIVE COMPONENT PHASED ARRAY ANTENNA," which was filed on Apr. 13, 2009. This application is also a non-provisional of U.S. Provisional Application No. 61/259,049, entitled "DYNAMIC REAL-TIME POLARIZATION FOR ANTENNAS," which was filed on Nov. 6, 2009. This application is a non-provisional of U.S. Provisional Application No. 61/234,521, entitled "MULTI-BAND MULTI-BEAM PHASED ARRAY ARCHITECTURE," which was filed on Aug. 17, 2009. This application is a non-provisional of U.S. Provisional Application No. 61/265,605, entitled "HALF-DUPLEX PHASED ARRAY ANTENNA SYSTEM," which was filed on Dec. 1, 2009. This application is a non-provisional of U.S. Provisional Application No. 61/222,363, entitled "BIDIRECTIONAL ANTENNA POLARIZER," which was filed on Jul. 1, 2009. All of the contents of the previously identified applications are hereby incorporated by reference for any purpose in their entirety.

BACKGROUND

A phased array antenna uses multiple radiating elements to transmit, receive, or transmit and receive radio frequency (RF) signals. Phased array antennas are used in various capacities, including communications on the move (COTM) antennas, satellite communication (SATCOM) airborne terminals, SATCOM mobile communications, and SATCOM earth terminals. The application of mobile terminals typically requires the use of automatic tracking antennas that are able to track the beam in azimuth, elevation, and polarization to follow the satellite position while the vehicle is in motion. Moreover, the antenna should be "low-profile", small and lightweight, thereby fulfilling the stringent aerodynamic and mass constraints encountered in the typical mounting.

One well known type of phased array antenna is an electronically steerable phased array antenna. The electronically steerable phased array antenna has full electronic steering capability and is more compact and lower profile than a comparable mechanical phased array antenna. The main drawback of fully electronic steering is that the antenna usually requires the integration of a lot of expensive analog RF electronic components which may prohibitively raise the cost for commercial applications. A typical electronically steerable phased array antenna comprises an assembly of phase shifters, power splitters, power combiners, and quadrature hybrids. Additionally, a typical electronically steerable phased array requires at least a few of these components at every element in the phased array, which increases the cost and complexity of the architecture.

In a typical prior art embodiment and with reference to FIG. 1, a phased array antenna 100 comprises a radiating element 101 that communicates dual linear signals to a hybrid coupler 102 (either 90° or 180°) and then through low noise amplifiers 103, 104. Furthermore, the dual orthogonal signals are individually phase adjusted by phase shifters 105, 106 before passing through a power combiner 107. In addition, the typical components in a phased array antenna are distributed components that are frequency sensitive and designed for specific frequency bands.

Phase shifters are used in a phased array antenna in order to steer the beam of the signals by controlling the respective phases of the RF signals communicated through the phase shifters. A typical digital phase shifter uses switched delay lines, is physically large, and operates over a narrow band of frequencies due to its distributed nature. Another typical digital phase shifter implements a switched high-pass low-pass filter architecture which has better operating bandwidth compared to a switched delay line but is still physically large.

Also, the phase shifter is often made on gallium arsenide (GaAs). Though other materials may be used, GaAs is a higher quality material designed and controlled to provide good performance of electronic devices. However, in addition to being a higher quality material than the other possible materials, GaAs is also more expensive and more difficult to manufacture. The typical phased array components take up a lot of area on the GaAs, and result in higher costs. Furthermore, a standard phase shifter has high RF loss, which is typically about n+1 dB of loss, where n is the number of phase bits in the phase shifter. Another prior art embodiment uses RF MEMS switches and has lower loss but still consumes similar space and is generally incompatible with monolithic solutions.

Quadrature hybrids or other differential phase generating hybrids are used in a variety of RF applications. In an exemplary embodiment, quadrature hybrids are used for generating circular polarization signals, power combining, or power splitting. In an exemplary embodiment, the outputs of a quadrature hybrid have equal amplitude and a nominally 90° phase difference. In another typical embodiment, the quadrature hybrid is implemented as a distributed structure, such as a Lange coupler, a branchline coupler, and/or the like. A 180° hybrid, such as a magic tee or a ring hybrid, results in a nominally 180° phase shift. In general, quadrature hybrids and 180° hybrids are limited in frequency band and require significant physical space. Additionally, since the structures are distributed in nature, their physical size increases with decreasing frequency. Moreover, the quadrature hybrids and 180° hybrids are typically made of GaAs and have associated RF power loss on the order of 3-4 dB per hybrid when used as a power splitter, and an associated power loss of about 1 dB when used as a power combiner.

In-phase power combiners and in-phase power splitters are also used in a variety of RF applications. In an exemplary embodiment, the outputs of an in-phase hybrid have equal amplitude and a substantially zero differential phase difference. In another exemplary embodiment, the inputs of an in-phase hybrid configured as a power combiner encounter substantially zero differential phase and amplitude shift. In a prior art embodiment, the in-phase hybrid is implemented as a distributed structure such as a Wilkinson coupler. In general, an in-phase hybrid is limited in frequency band and requires significant physical space. Additionally, since the structure is distributed in nature, the physical size increases with decreasing frequency. The in-phase hybrid is typically made of GaAs. Moreover, the in-phase hybrid generally has associated RF power loss on the order of 3-4 dB per hybrid when used as a power splitter and an associated RF power loss of about 1 dB when used as a power combiner.

In addition to the different components in a phased array antenna, an antenna signal can have different polarizations, namely linear, elliptical, or circular. Linear polarization consists of vertical polarization and horizontal polarization, whereas circular polarization consists of left-hand circular polarization (LHCP) and right-hand circular polarization (RHCP). Elliptical polarization is similar to circular polarization but occurs with different values for the vertical and horizontal component magnitudes or if the phase difference between the vertical and horizontal components is a value other than 90°.

Conventional antennas utilize a fixed polarization that is hardware dependant. The basis polarization is generally set during installation of the satellite terminal, at which point the manual configuration of the polarizer hardware is fixed. For example, a polarizer is generally set for LHCP or RHCP and fastened into position. To change polarization would require unfastening the polarizer, rotating it 90° to the opposite circular polarization, and then refastening the polarizer. Clearly this could not be done with much frequency and only a limited number (on the order of 10 or maybe 20) of transceivers could be switched per technician in a given day.

Unlike a typical prior art single polarization antenna, some devices are configured to change polarizations without disassembling the antenna terminal. As an example and with reference to FIG. 2, a prior embodiment is the use of "baseball" switches to provide electronically commandable switching between polarizations. As can be understood by the block diagram, the rotation of the "baseball" switches causes a change in polarization by connecting one signal path to a waveguide while terminating the other signal path. However, each "baseball" switch is physically large and requires a separate rotational actuator with independent control circuitry, which increases the cost of the device such that this configuration is typically not used in consumer broadband terminals.

Furthermore, another approach is to have a system with duplicate transmit and receive hardware for each polarization. The polarization selection is achieved by maintaining the path of the desired signal and deselecting the undesired signal. However, doubling the hardware greatly increases the cost of the terminal. In yet another embodiment, a system may implement solid state diode or FET-based switches. The use of these electronic components may lead to high loss and limited power handling in microwave and mm-wave applications. These alternatives are size, power, and cost prohibitive for most applications, including phased arrays and low cost commercial applications.

Additionally, typical phased array antennas only form a single beam at a time and are often not capable of switching polarization. In order to form additional beams and/or have polarization switching ability from the same radiating aperture, additional phase shifting and power splitting or combining components are required at every radiating element. These additional components are typically distributed in nature, require significant physical space, are lossy, and only operate over relatively narrow frequency bands. For these reasons, polarization agile, multiple beam phased array antennas that can operate over multiple frequency bands are difficult to realize in practice.

Thus, a need exists for a phased array antenna architecture that is not frequency limited or polarization specific, and that is reconfigurable for different polarizations and able to transmit and/or receive over multiple frequencies and form multiple beams. Furthermore, the antenna architecture should be able to be manufactured on a variety of materials and with no associated RF loss. Also, a need exists for a phased array antenna that uses less space than a similar capability prior art architecture, is suitable for a monolithic implementation, and has components with a physical size that is independent of operating frequency.

SUMMARY

An active phased array architecture may replace traditional distributed and GaAs implementations for the necessary functions required to operate electronically steerable phased array antennas. The architecture combines active versions of vector generators, power splitters, power combiners, and/or RF hybrids in a novel fashion to realize a fully or substantially monolithic solution for a wide range of antenna applications that can be realized with radiating elements having dual-polarized feeds.

Overall, an active antenna polarizer is a digitally controlled active implementation for processing an RF signal. In accordance with an exemplary receive embodiment, the polarization and amplitude of the RF signal communicated through a phased array radiating element is adjustable by operating two vector generators in parallel and feeding one or both output signals of the two vector generators to the radiating element in spatially orthogonal fashion. The phased array antenna is configured to electrically change between polarizations and/or support beam steering. For example, the phased array antenna may alternate between linear polarization, elliptical polarization, and circular polarization. In accordance with an exemplary embodiment, in order to operate in these different polarizations, vector generators control the relative phase of the antenna signal. In an exemplary embodiment, the basic transmit embodiment and receive embodiment are used iii any frequency band and with different polarizations.

In an exemplary embodiment, an active antenna polarizer is part of a phased array antenna that may be configured to transmit or receive an RF signal. In one embodiment, the active antenna polarizer communicates a signal with linear polarization. In another embodiment, the active antenna polarizer communicates a signal with dual polarization. In yet another embodiment, a differential signal may be communicated using either linear polarization or dual polarization. Furthermore, the implementation of dual-polarized feeds facilitates the operation of phased arrays where the polarization can be statically or dynamically controlled on a subarray or element basis.

In an exemplary embodiment, a phased array antenna comprises multiple subcircuits in communication with multiple radiating elements. The radio frequency signals are adjusted for both polarization control and beam steering. In a receive embodiment, multiple RF signals are received and combined into at least one receive beam output. In a transmit embodiment, at least one transmit beam input is divided and transmitted through multiple radiating elements.

In an exemplary embodiment, the phased array antenna provides multi-beam formation over multiple operating frequency bands. The phased array antenna replaces traditional distributed components and GaAs functions with active components to operate an electronically steerable multiple beam phased array antenna. The wideband nature of the active components allows for operation over multiple frequency bands simultaneously. Furthermore, the antenna polarization may be static or dynamically controlled at the subarray or radiating element level.

Advantages of the exemplary phased array antenna include increased system capacity and flexibility. Furthermore, an antenna that can operate over multiple frequency bands optimizes system availability. This system may be implemented in mobile applications, or fixed position applications where multiple systems are desired. Also, a single antenna can communicate with multiple systems and/or users, allowing for increased capacity and availability.

BRIEF DESCRIPTION OF THE DRAWING FIGURES

A more complete understanding of the present invention may be derived by referring to the detailed description and claims when considered in connection with the drawing figures, wherein like reference numbers refer to similar elements throughout the drawing figures, and:

DETAILED DESCRIPTION OF THE INVENTION

Figure 1:
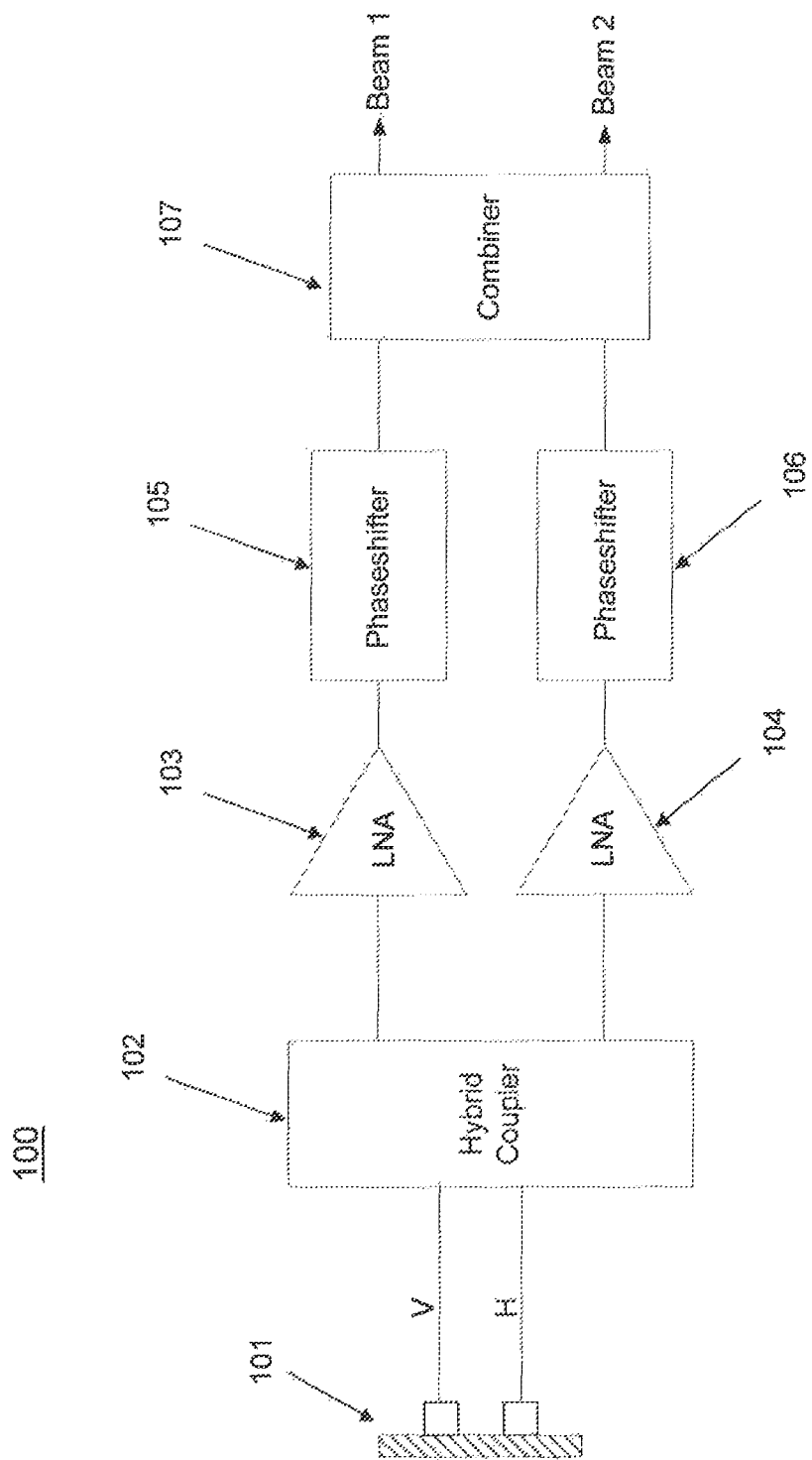
FIG. 1 illustrates a prior art example of a phased array antenna element and control electronics.
Figure 2:
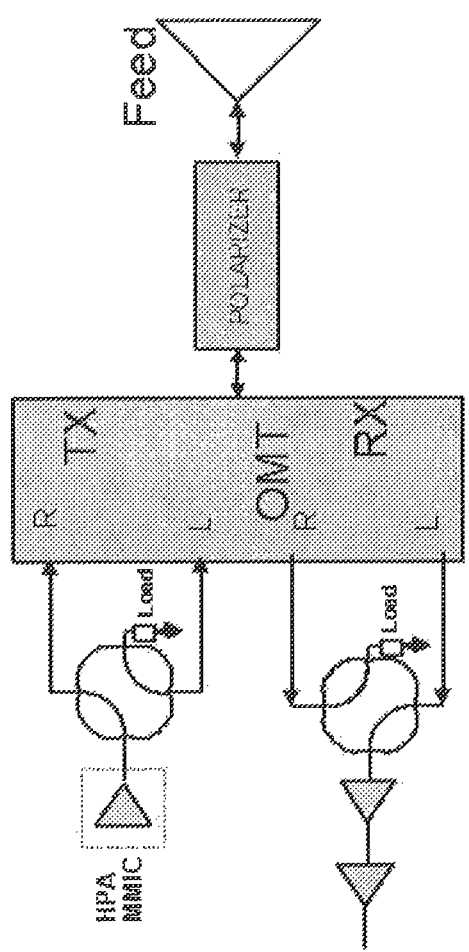
FIG. 2 illustrates a prior art example of an antenna with polarization switching.

While exemplary embodiments are described herein in sufficient detail to enable those skilled in the art to practice the invention, it should be understood that other embodiments may be realized and that logical material, electrical, and mechanical changes may be made without departing from the spirit and scope of the invention. Thus, the following detailed description is presented for purposes of illustration only.

An electronically steerable phased array antenna may be used in various scenarios. For example, the phased array antenna may be implemented in COTM antennas, SATCOM airborne terminals, SATCOM mobile communications, and SATCOM earth terminals. In an exemplary embodiment, a phased array antenna comprises a layout of various active component building blocks, such as balms, power splitters, power combiners, hybrids, and vector generators. Although throughout the application reference may be made to "active power splitters, vector generators, and active power combiners" in various exemplary embodiments, only one or more of those devices may be used in various embodiments, as opposed to all three devices.

A phased array antenna generally comprises multiple radiating elements, with each radiating element having a polarization component. In an exemplary embodiment, the radiating element has spatially orthogonal linear polarizations, spatially and electrically orthogonal circular polarizations, or spatially orthogonal and electrically non-orthogonal elliptical polarizations. In an exemplary embodiment, a phased array antenna comprises various components. The various components may include a vector generator, an active power splitter, an active power combiner, or the like. Furthermore, in an exemplary embodiment, the phased array antenna comprises a patch antenna. Though a patch antenna is illustrated in the figures and described herein, other types of radiating elements may be implemented. Such radiating elements include a fragmented radiator, a feed horn antenna, a slot antenna, and the like.

In an exemplary embodiment, each radiating element has two feed ports and results in an unbalanced feed system. In yet another exemplary embodiment, each radiating element has three feed ports and results in a partially balanced feed system. In another exemplary embodiment, each radiating element has four feed ports and results in a fully balanced feed system.

In an exemplary embodiment, a phased array antenna with two feed ports is configured to generate and control different polarizations. Exemplary polarization states include a single circular polarization state, a single elliptical polarization state, a single linear polarization state, and two orthogonal linear polarization states.

The radiating elements may be in communication with an RF integrated circuit (RFIC). In an exemplary embodiment, the RFIC is configured to divide, alter, and re-combine the basis polarizations to other orthogonal polarization states. The RE signal corresponding to the net polarization state in the RFIC may additionally be combined in a beam-forming network of the array.

Figure 3:
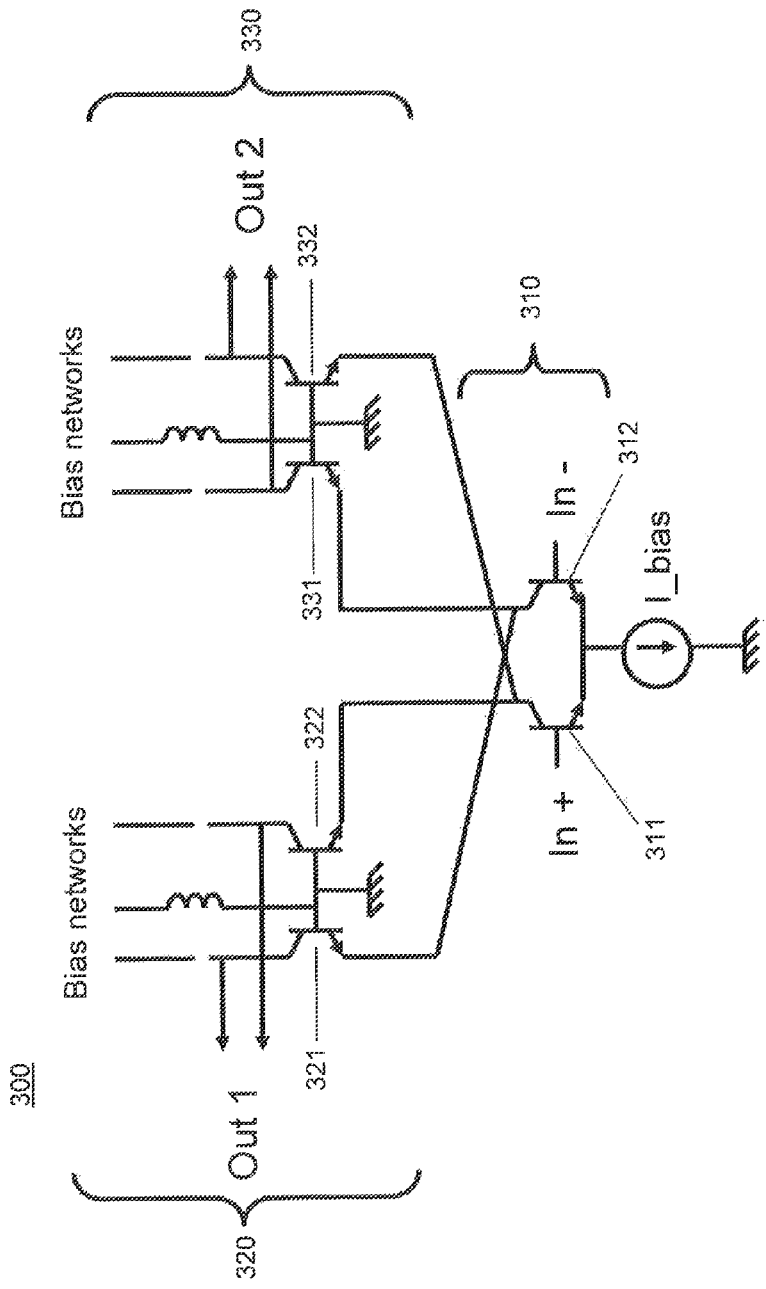
FIG. 3 illustrates an exemplary embodiment of an active power splitter.

Active Splitter:

FIG. 3 illustrates a schematic of an exemplary active power splitter. In an exemplary embodiment, an active power splitter 300 comprises a differential input subcircuit 310, a first differential output subcircuit 320, and a second differential output subcircuit 330. The differential input subcircuit 310 has paired transistors 311, 312 with a common emitter node and is constant current biased, as is typical in a differential amplifier. An input signal is communicated to the base of paired transistors 311, 312 in the differential input subcircuit 310. Both the first and second differential output subcircuits 320, 330 comprise a pair of transistors with a common base node and each common base is connected to ground.

The first differential output subcircuit 320 has a first transistor 321 emitter connected to the collector of one of the input subcircuit transistors 312. The emitter of the second output subcircuit transistor 322 is connected to the collector of the other input subcircuit transistor 311. In the exemplary embodiment, the first output is drawn from the collectors of transistors 321, 322 of the first differential output subcircuit 320. Furthermore, the second differential output subcircuit 330 is similarly connected, except the transistor 331, 332 emitters are inversely connected to the input subcircuit transistor 311, 312 collectors with respect to transistors 321, 322.

By inverting the input subcircuit transistor collector connections between the first and second differential output subcircuits, the first output and the second output are approximately 180° out of phase with each other. In another exemplary embodiment, transistor 331, 332 emitters are non-inversely connected to input subcircuit transistor 311, 312 collectors, causing the first output and the second output to be approximately in phase with each other. In general, the absolute phase shift of the output signals through the power splitter is not as important as the relative phasing between the first and second output signals.

In an exemplary embodiment, active power splitter 300 converts an input RF signal into two output signals. The output signal levels may be equal in amplitude, though this is not required. For a prior art passive power splitter, each output signal would be about 3 dB lower in power than the input signal. In contrast, an exemplary active splitter, such as active power splitter 300, can provide gain and the relative power level between the input signal and output signal is adjustable and can be selectively designed. In an exemplary embodiment, the output signal is configured to achieve a substantially neutral or positive power gain over the input signal. For example, the output signal may achieve a 3 dB signal power gain over the input signal. In an exemplary embodiment, the output signal may achieve a power gain in the 0 dB to 5 dB range. Moreover, the output signal may be configured to achieve any suitable power gain.

In accordance with an exemplary embodiment, active power splitter 300 produces output signals with a differential phase between the two signals that is zero or substantially zero. The absolute phase shift of output signals through the active power splitter may not be as important as the differential phasing between the output signals.

In another exemplary embodiment, active power splitter 300 additionally provides matched impedances at the input and output ports. The matched impedances may be 50 ohms, 75 ohms, or other suitable impedances. Furthermore, in an exemplary embodiment, active splitter 300 provides isolation between the output ports of the active power splitter. In one exemplary embodiment, active power splitter 300 is manufactured as a radio frequency integrated circuit (RFIC) with a compact size that is independent of the operating frequency due to a lack of distributed components.

Figure 4:
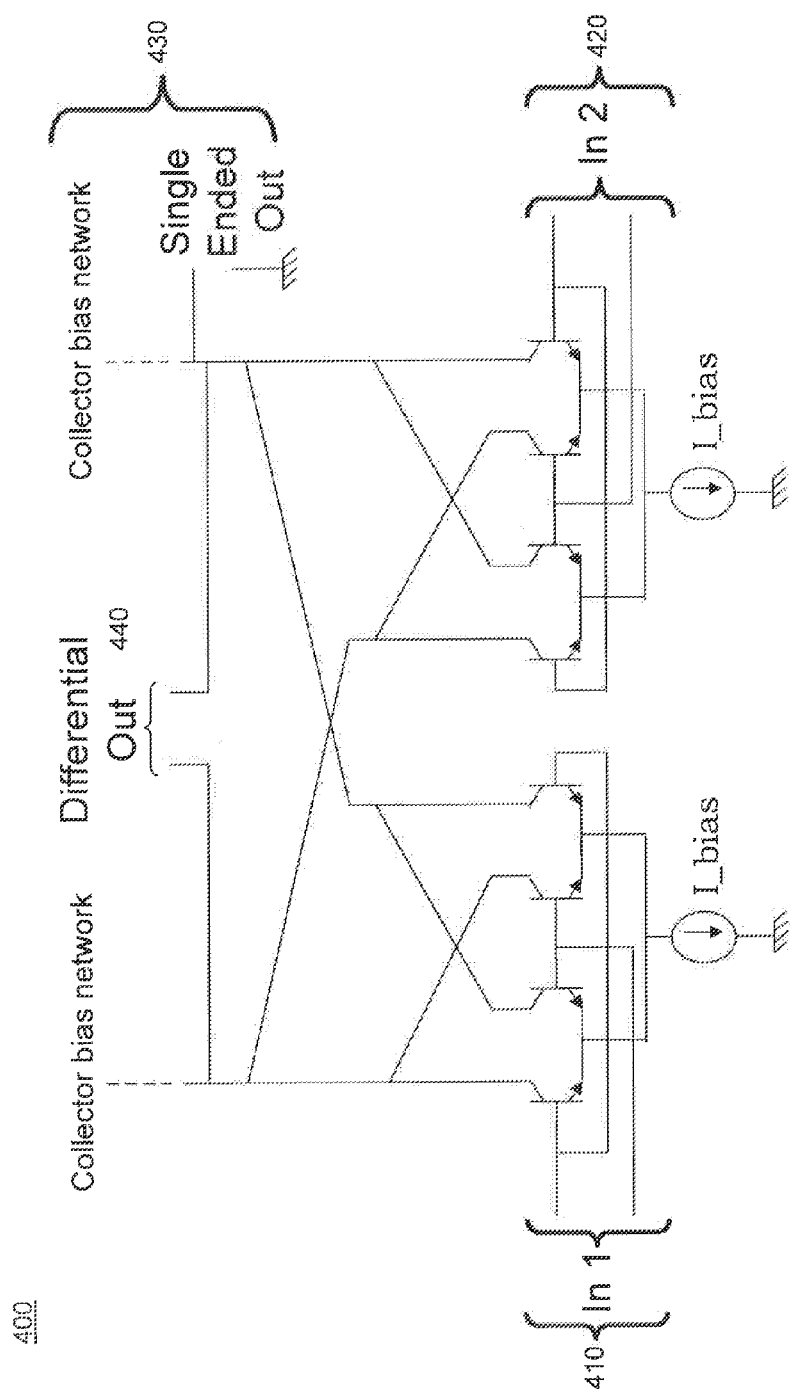
FIG. 4 illustrates an exemplary embodiment of an active power combiner.

Active Combiner:

In an exemplary embodiment and with reference to FIG. 4, an active power combiner 400 comprises a first differential input subcircuit 410, a second differential input subcircuit 420, a single ended output subcircuit 430, and a differential output subcircuit 440. Each differential input subcircuit 410, 420 includes two pairs of transistors, with each transistor of each differential input subcircuit 410, 420 having a common emitter node with constant current biasing, as is typical in a differential amplifier.

A first input signal is communicated to the bases of the transistors in first differential input subcircuit 410. For example, a first line of input signal In1 is provided to one transistor of each transistor pair in first differential input subcircuit 410, and a second line of input signal In1 is provided to the other transistor of each transistor pair. Similarly, a second input signal is communicated to the bases of the transistors in second differential input subcircuit 420. For example, a first line of input signal In2 is provided to one transistor of each transistor pair in first differential input subcircuit 420, and a second line of input signal In2 is provided to the other transistor of each transistor pair. Furthermore, in an exemplary embodiment, a differential output signal is formed by a combination of signals from collectors of transistors in first and second differential input subcircuits 410, 420.

In an exemplary embodiment, active power combiner 400 converts two input RF signals into a single output signal. The output signal can either be a single ended output at single ended output subcircuit 430, or a differential output at differential output subcircuit 440. In other words, active power combiner 400 performs a function that is the inverse of active power splitter 300. The input signal levels can be of arbitrary amplitude and phase. Similar to an active power splitter, active power combiner 400 can provide gain and the relative power level between the inputs and output is also adjustable and can be selectively designed. In an exemplary embodiment, the output signal achieves a substantially neutral or positive signal power gain over the input signal. For example, the output signal may achieve a 3 dB power gain over the sum of the input signals. In an exemplary embodiment, the output signal may achieve a power gain in the 0 dB to 5 dB range. Moreover, the output signal may achieve any suitable power gain.

In an exemplary embodiment, active power combiner 400 additionally provides matched impedances at the input and output ports. The matched impedances may be 50 ohms, 7.5 ohms, or other suitable impedances. Furthermore, in an exemplary embodiment, active power combiner 400 provides isolation between the input ports of the power combiner. In one exemplary embodiment, active power combiner 400 is manufactured as a RFIC with a compact size that is independent of the operating frequency due to a lack of distributed components.

Vector Generator:

In an exemplary embodiment, a vector generator converts an RF input signal into an output signal (sometimes referred to as an output vector) that is shifted in phase and/or amplitude to a desired level. This replaces the function of a typical phase shifter and adds the capability of amplitude control. In other words, a vector generator is a magnitude and phase control circuit. In the exemplary embodiment, the vector generator accomplishes this function by feeding the RF input signal into a quadrature network resulting in two output signals that differ in phase by about 90°. The two output signals are fed into parallel quadrant select circuits, and then through parallel variable gain amplifiers (VGAs). In an exemplary embodiment, the quadrant select circuits receive commands and may be configured to either pass the output signals with no additional relative phase shift between them or invert either or both of the output signals by an additional 180°. In this fashion, all four possible quadrants of the 360° continuum are available to both orthogonal signals. The resulting composite output signals from the current summer are modulated in at least one of amplitude and phase.

Figure 5:
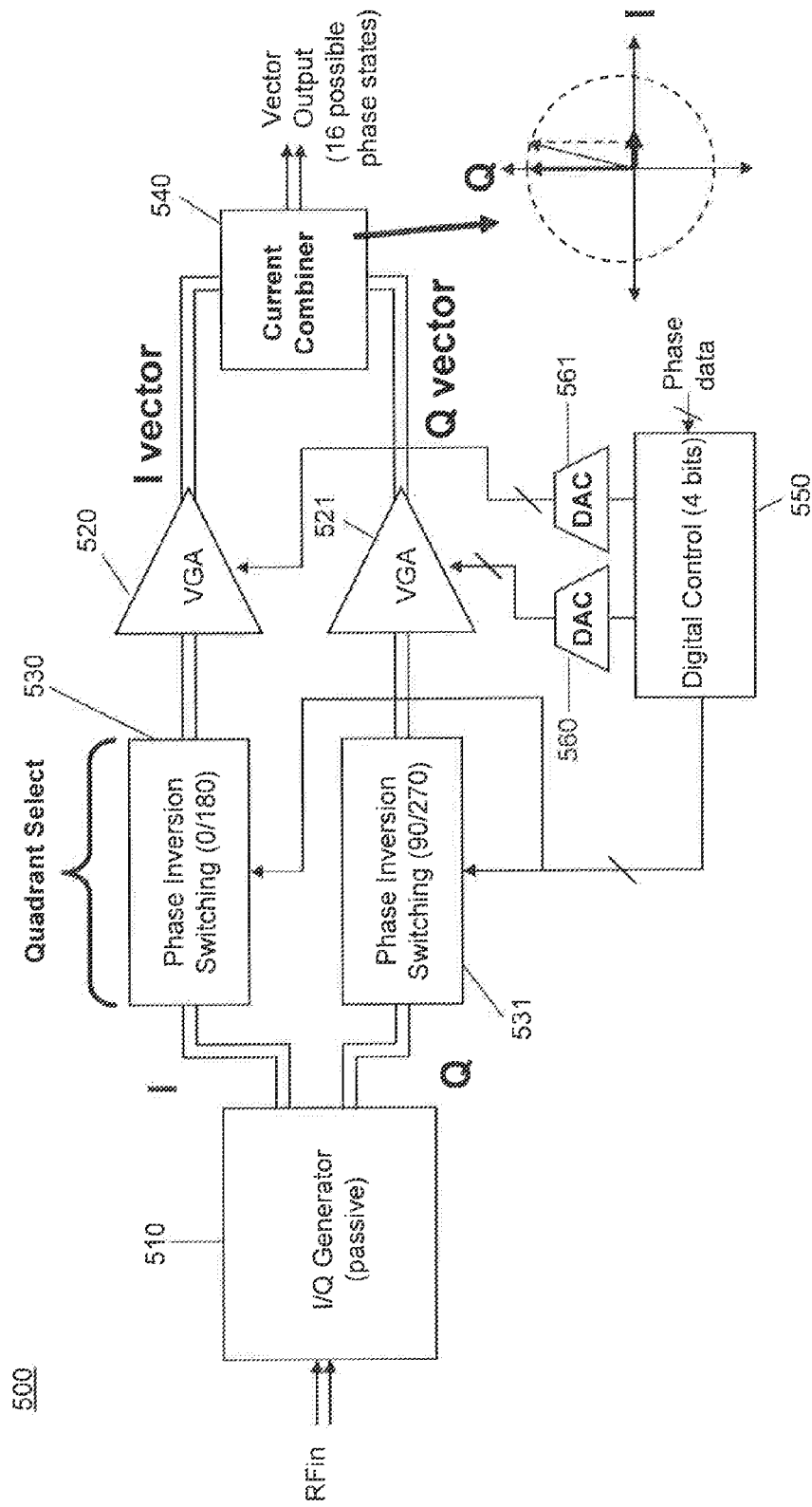
FIG. 5 illustrates an exemplary embodiment of an active vector generator.

In accordance with an exemplary embodiment and with reference to FIG. 5, a vector generator 500 comprises a passive I/Q generator 510, a first VGA 520 and a second VGA 521, a first quadrant select 530 and a second quadrant select 531 each configured for phase inversion switching, and a current summer 540. The first quadrant select 530 is in communication with I/Q generator 510 and first VGA 520. The second quadrant select 531 is in communication with I/Q generator 510 and second VGA 521. Furthermore, in an exemplary embodiment, vector generator 500 comprises a digital controller 550 that controls a first digital-to-analog converter (DAC) 560 and a second DAC 561. The first and second DACs 560, 561 control first and second VGAs 521, 520, respectively. Additionally, digital controller 550 controls first and second quadrant selects 530, 531.

In an exemplary embodiment, vector generator 500 controls the phase and amplitude of an RF signal by splitting the RF signal into two separate vectors, the in-phase (I) vector and the quadrature-phase (Q) vector. In one embodiment, the RF signal is communicated differentially. The differential RF signal communication may be throughout vector generator 500 or limited to various portions of vector generator 500. In another exemplary embodiment, the RF signals are communicated non-differentially. The I vector and Q vector are processed in parallel, each passing through the phase inverting switching performed by first and second quadrant selects 530, 531. The resultant outputs of the phase inverting switches comprise four possible signals: a non-inverted I, an inverted I, a non-inverted Q, and an inverted Q. In this manner, all four quadrants of a phasor diagram are available for further processing by VGAs 520, 521. In an exemplary embodiment, two of the four possible signals non-inverted I, inverted I, non-inverted Q, and inverted Q are processed respectively through VGAs 520, 521, until the two selected signals are combined in current summer 540 to form a composite RF signal. The current summer 540 outputs the composite RF signal with phase and amplitude adjustments. In an exemplary embodiment, the composite RF signal is in differential signal form. In another exemplary embodiment, the composite RF signals are in single-ended form.

In an exemplary embodiment, control for the quadrant shifting and VGA functions is provided by a pair of DACs. In an exemplary embodiment, reconfiguration of digital controller 550 allows the number of phase bits to be digitally controlled after vector generator 500 is fabricated if adequate DAC resolution and automatic gain control (AGC) dynamic range exists. In an exemplary embodiment with adequate DAC resolution and AGC dynamic range, any desired vector phase and amplitude can be produced with selectable fine quantization steps using digital control. In another exemplary embodiment, reconfiguration of DACs 560, 561 can be made after vector generator 500 is fabricated in order to facilitate adjustment of the vector amplitudes.

Figure 6:
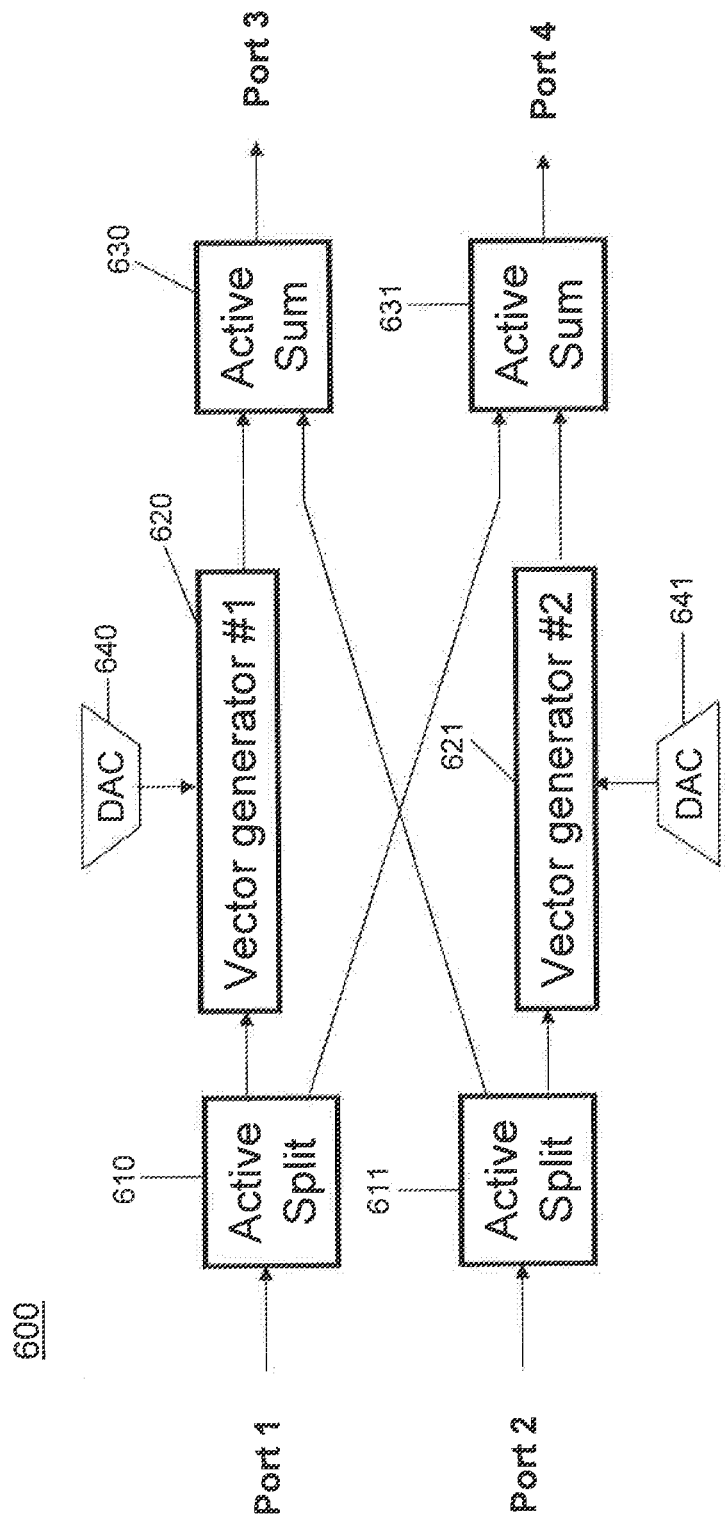
FIG. 6 illustrates an exemplary embodiment of an active RF hybrid.

Active RF Hybrid:

In an exemplary embodiment, and with reference to FIG. 6, an active RF hybrid 600 comprises a first active power splitter 610, a second active power splitter 611, a first vector generator 620, a second vector generator 621, a first active power combiner 630, a second active power combiner 631, a first digital-to-analog converter (DAC) 640 and a second DAC 641. In accordance with the exemplary embodiment, first active power splitter 610 receives an input at Port 1 and communicates the input to first vector generator 620 and second active power combiner 631. Likewise, second active power splitter 611 receives an input at Port 2 and communicates the input to second vector generator 621 and first active power combiner 630. Vector generators 620, 621 are controlled in part by respective DACs 640, 641. In an exemplary embodiment, a 4-bit DAC is used but any number of bits many be used.

Furthermore, the output of first vector generator 620 is communicated to first active power combiner 630, and the output of second vector generator 621 is communicated to second active power combiner 631. In the exemplary embodiment, first active power combiner 630 receives input from first vector generator 620 and second active power splitter 611, and outputs a signal to Port 3. Similarly, second active power combiner 631 receives input from second vector generator 621 and first active power splitter 610, and outputs a signal to Port 4.

Active RF hybrid 600 may be used to replace various distributed components, such as a branchline coupler, Lange coupler, directional coupler, or 180° hybrid. In accordance with an exemplary embodiment, an active RF hybrid provides similar functionality in comparison to a traditional distributed hybrid. For example, active RF hybrid 600 may be dynamically configured to have variable phase differences between the output ports, which could be 90°, 180°, or some other phase difference. Another example is that active RE hybrid 600 provides port-to-port isolation and matched impedances at the input/output ports. Additional information regarding active RF hybrids is disclosed in the U.S. patent application Ser. No. 12/759,043, entitled "ACTIVE HYBRIDS FOR ANTENNA SYSTEMS," filed the same day as this application, which is hereby incorporated by reference.

Furthermore, the active RF hybrid 600 has various advantages over a traditional passive distributed hybrid. In an exemplary embodiment, the active RF hybrid 600 does not result in a loss of power, but instead has a gain or is at least gain neutral. In another exemplary embodiment, the active RE hybrid 600 does not rely on distributed elements and is capable of operating over very wide bandwidths. In yet another exemplary embodiment, the active RF hybrid 600 implements identical building block components as used in an exemplary active phased array architecture. In one exemplary embodiment, the active RF hybrid 600 is manufactured as a MMIC with a compact size that is independent of the operating frequency due to a lack of distributed components.

The components described above may be implemented in various phased array antenna embodiments. The various phased array antenna embodiments include variations on transmit or receive embodiments, number of beams, different polarizations including linear, circular, and elliptical, and the use of single ended signals or differentially fed signals.

In an exemplary embodiment, an electronically steerable phased array antenna comprises a radiating element array, an active vector generator, and a DAC. In one exemplary embodiment, the DAC is reconfigurable to operate the phased array antenna in numerous configurations. For example, the phased array antenna can support multiple frequency bands and be reprogrammed to change between different polarization types. The reconfiguration can be made after the antenna architecture is fabricated.

In accordance with an exemplary embodiment, a phased array antenna comprises active components manufactured on silicon germanium (SiGe) in a monolithic solution. Other materials may be used, such as GaAs, silicon, or other suitable materials now known or hereinafter devised. A monolithic SiGe embodiment using active components results in certain advantages over the distributed/passive network in the prior art, including lower cost, smaller physical size, wider operating bandwidths, and the ability to provide power gain rather than a power loss.

Additionally, other advantages over the prior art embodiments are possible, depending on the phased array architecture. Some of the advantages include extensive system flexibility and very compact antenna systems because no distributed structures are required. In one embodiment, the size of the control function components of the phased array architecture is compact and independent of operating frequency. Furthermore, some embodiments employ differential signaling to improve signal isolation when the RF signal is in analog form.

Some of the main advantages include that RF signals undergo a neutral or slight positive gain when being communicated through the antenna system, rather than losses that occur in the passive prior art systems. Another advantage is that the antenna system is not band limited. In other words, the antenna system is applicable to all frequency bands, including X, K, Ku, Ka, and Q bands. Furthermore, in an exemplary embodiment, the antenna system is configured to operate, after manufacture or installation, at a first frequency range and subsequently operate at a second frequency range not equal to the first frequency range. In another exemplary embodiment, the antenna system is configured to operate at the first frequency range and the second frequency range simultaneously. In an exemplary embodiment, multi-band antennas are a practical option as a product.

Reconfigurability of the antenna system is also an advantage. This includes the ability to reconfigure the number of phase bits over full product life, being able to reconfigure the amplitude taper of the system over full product life, and being able to reconfigure the system polarization over full product life.

Described below are various specific phased array antenna system embodiments. The embodiments vary in terms of polarization, transmit or receive modes, and whether differential signaling is implemented.

Active Antenna Polarizer:

Overall, an active antenna polarizer is a digitally controlled active implementation for processing an RF signal. In accordance with an exemplary embodiment, the polarization and amplitude of a phased array radiating element is adjustable by operating two vector generators in parallel and feeding both output signals of the two vector generators to the radiating element in a spatially orthogonal fashion. The phased array antenna is configured to electrically change between polarizations. For example, the phased array antenna may alternate between linear polarization and circular polarization. In a first embodiment, the system achieves linear polarization by using a single vector generator to drive the radiating element. In a second embodiment, the system achieves circular polarization by using two vector generators to drive the radiating element in a spatially orthogonal fashion with two vectors that are electrically 90° out of phase from each other. In a third embodiment, the system achieves elliptical polarization by using two vector generators to drive the radiating element in a spatially orthogonal fashion with two vectors that are electrically out of phase by a value other than 90° with each other.

In an exemplary embodiment, the active antenna polarizer comprises discrete active components. In another exemplary embodiment, an active polarizer comprises a monolithic solution of active components. In yet another exemplary embodiment, the active antenna polarizer comprises a combination of discrete components and a monolithic solution.

Figure 7:
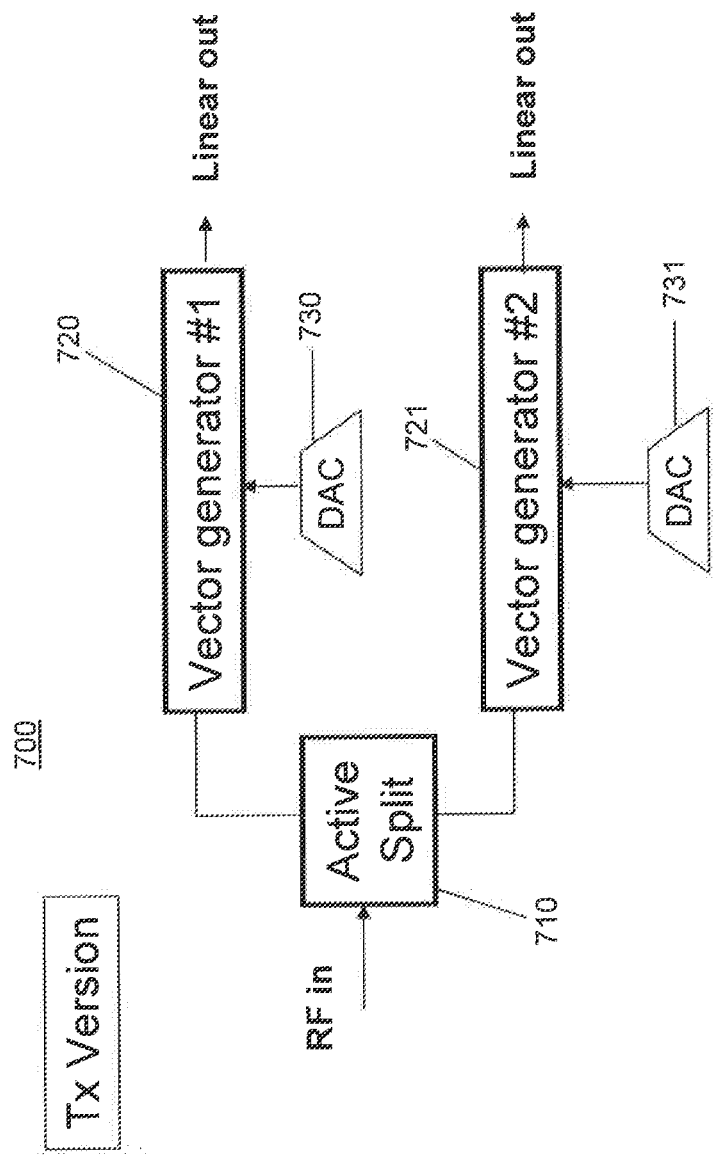
FIG. 7 illustrates an exemplary embodiment of an active antenna signal polarizer.

In an exemplary embodiment and with reference to FIG. 7, a transmit active antenna polarizer 700 comprises an active power splitter 710, two vector generators 720, 721, and two DACs 730, 731. An RF input signal is actively split and transmitted through two vector generators 720, 721 in parallel. The vector generators 720, 721 are controlled by DACs 730, 731 respectively, and each vector generator produces a linear output signal. These two linear outputs can be used to energize/drive the spatially orthogonal feed ports of a radiating element (not shown).

The transmit active antenna polarizer 700 may be considered a basic transmit embodiment, which is configured to be implemented in a variety of different phased array antenna architectures. In an exemplary embodiment, the basic transmit embodiment is used in any frequency band and with different polarizations. For example, and as described below, the basic transmit embodiment may be used as the basis for at least one of beam steering and the phased array antenna transmitting in linear polarization, circular polarization, or elliptical polarization. In accordance with an exemplary embodiment, in order to operate in these different polarizations, vector generators 720, 721 control the phase of the antenna signal. In another embodiment, vector generators 720, 721 are configured for beam steering in conjunction with polarization control.

In an exemplary embodiment, reconfiguration of DACs 730, 731 allows the number of phase bits to be digitally controlled after transmit active antenna polarizer 700 is fabricated if adequate DAC resolution and AGC dynamic range exists. In an exemplary embodiment with adequate DAC resolution and AGC dynamic range, any desired vector phase and amplitude can be produced with selectable fine quantization steps using digital control. In another exemplary embodiment, reconfiguration of DACs 730, 731 can be made after transmit active antenna polarizer 700 is fabricated in order to facilitate adjustment of the signal amplitudes.

Reconfigurability of the antenna system is also an advantage. In an exemplary embodiment, the antenna system includes the ability to reconfigure the number of phase bits in a DAC over full product life. In another exemplary embodiment, the antenna system is able to reconfigure the amplitude taper of the system over full product life. In yet another exemplary embodiment, the antenna system is able to reconfigure the system polarization over full product life. Moreover, in an exemplary embodiment with adequate DAC resolution and AGC dynamic range, any desired vector phase and amplitude can be produced with selectable fine quantization steps using digital control.

In an exemplary embodiment, the vector generators are controlled by software and digital hardware, and the antenna polarization is software definable. In other words, software may be implemented to control the antenna polarization by modifying the operating parameters of the vector generators via the DACs or other digital control. The operating parameters, for example, may include the relative phase between the outputs of the vector generators. In an exemplary embodiment, software controls the phase change by programming the DACs to achieve the desired phase relationship. Moreover, in an exemplary embodiment, the polarization of the energy radiated from the antenna is controlled in real-time. This results in a completely electronic technique where software allows continuous dynamic adjustment of the polarization of dual polarization feed antennas.

A receive active antenna is similar to a transmit active antenna as already described. In an exemplary embodiment, two RF input signals are communicated from a radiating element. The two RF input signals are processed in parallel through two vector generators before being combined by an active combiner. A receive active antenna polarizer may be considered a basic receive embodiment which is configured to be implemented in a variety of different phased array antenna architectures. In an exemplary embodiment, the basic receive embodiment is used in any frequency band and with different polarizations. For example, the basic receive embodiment may be used as the basis for at least one of beam steering and the phased array antenna receiving in linear polarization, circular polarization, or elliptical polarization. In accordance with an exemplary embodiment, in order to operate in these different polarizations, the vector generators control the phase of the antenna signal as described herein.

In accordance with an exemplary embodiment, an active antenna polarizer is configured to dynamically change the polarization of an antenna using radiating elements with dual-polarized feeds. Furthermore, in an exemplary embodiment, an antenna is configured to statically or dynamically control the polarization of the antenna on a subarray or individual element basis in order to optimize a performance characteristic associated with polarization. Examples of such polarization associated characteristics include polarization loss factors and polarization efficiency. In an exemplary embodiment, the use of dual-polarized feeds facilitates the performance optimization. For example, in an exemplary embodiment, a maximum signal level may be obtained by varying the polarization around an expected value until the optimal level is set. The difference between the expected value and the optimal value may occur due to various factors. For example, objects may be present in the signal path. As another example, manufacturing tolerances may result in the physical structure being in a less-optimal position. In still another example, inclement weather can result in one polarization performing better than another polarization. In other words, an exemplary antenna is configured to adjust the polarization in order to compensate for manufacturing tolerances, weather, inferring objects, and the like. In an exemplary embodiment, a polarization sweep is performed in order to receive different signals which can be used for signal identification.

Figure 8:
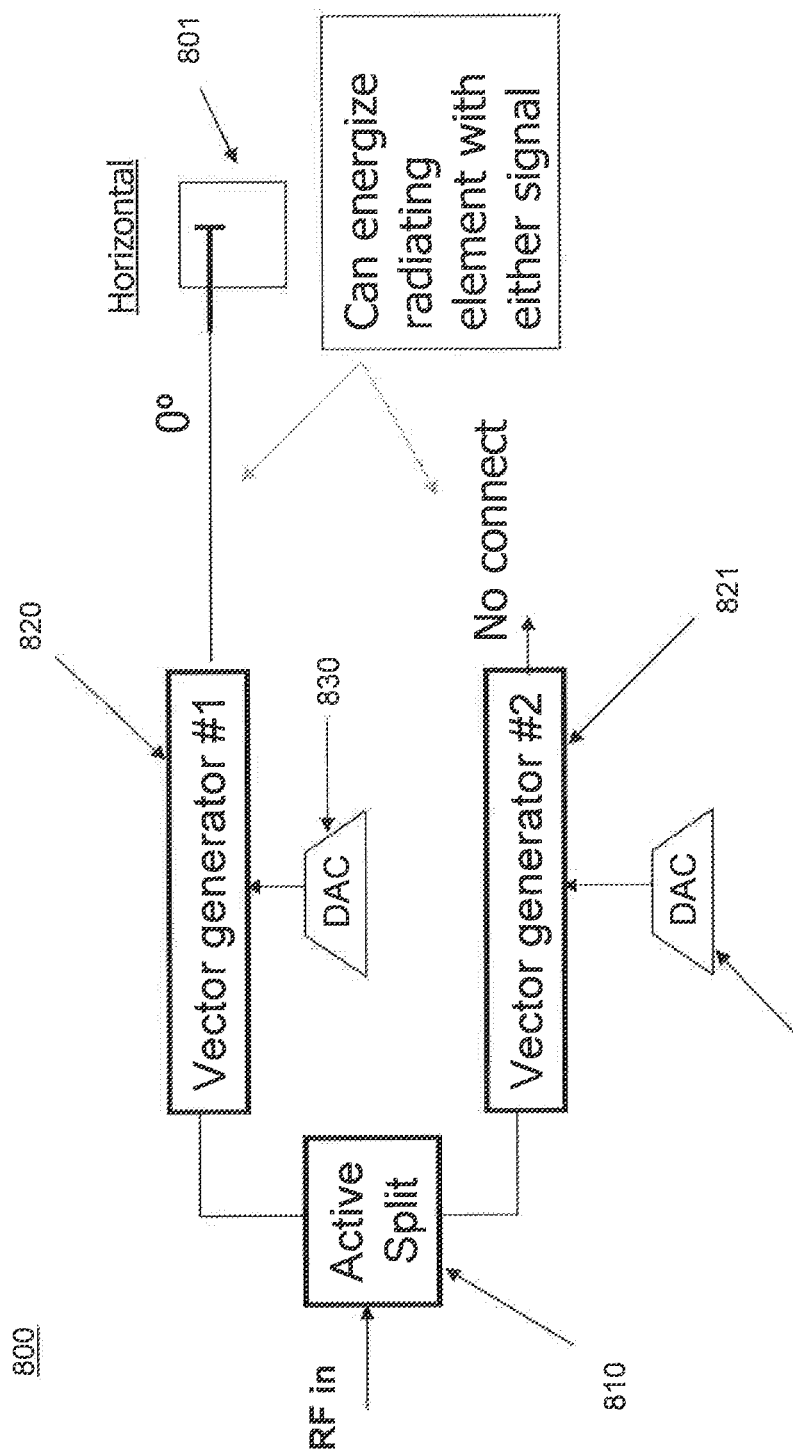
FIG. 8 illustrates an exemplary embodiment of a phased array antenna with horizontal linear polarization for transmit mode.

FIG. 8 shows an exemplary embodiment of a phased array antenna 800 configured to transmit a signal with linear polarization. Phased, array antenna 800 comprises an active power splitter 810, a first vector generator 820, a second vector generator 821, a first DAC 830, and a second DAC 831. Phased array antenna 800 is a basic transmit embodiment with an output signal of first vector generator 820 energizing a radiating element 801 and with second vector generator 821 not in communication with radiating element 801. In an alternative but similar embodiment, second vector generator 821 energizes radiating element 801 with first vector generator 820 not in communication with radiating element 801. Additionally, radiating element 801 can have a "horizontal" orientation or a "vertical" orientation. In the exemplary embodiment, the basic transmit embodiment with two vector generators 820, 821 is implemented in order to demonstrate that a standard architecture may used in numerous antenna types. This enables cost benefits because the same underlying component is used instead of different, more customized components.

In another exemplary embodiment, a phased array antenna, configured to transmit as signal with linear polarization, comprises only one vector generator and a controlling DAC. As one skilled in the art understands, the embodiments described herein that manipulate only one vector generator output can comprise only a single vector generator. In other words, in one embodiment, phased array antenna 800 comprises first vector generator 820 but not second vector generator 821 or active power splitter 810.

Figure 9:
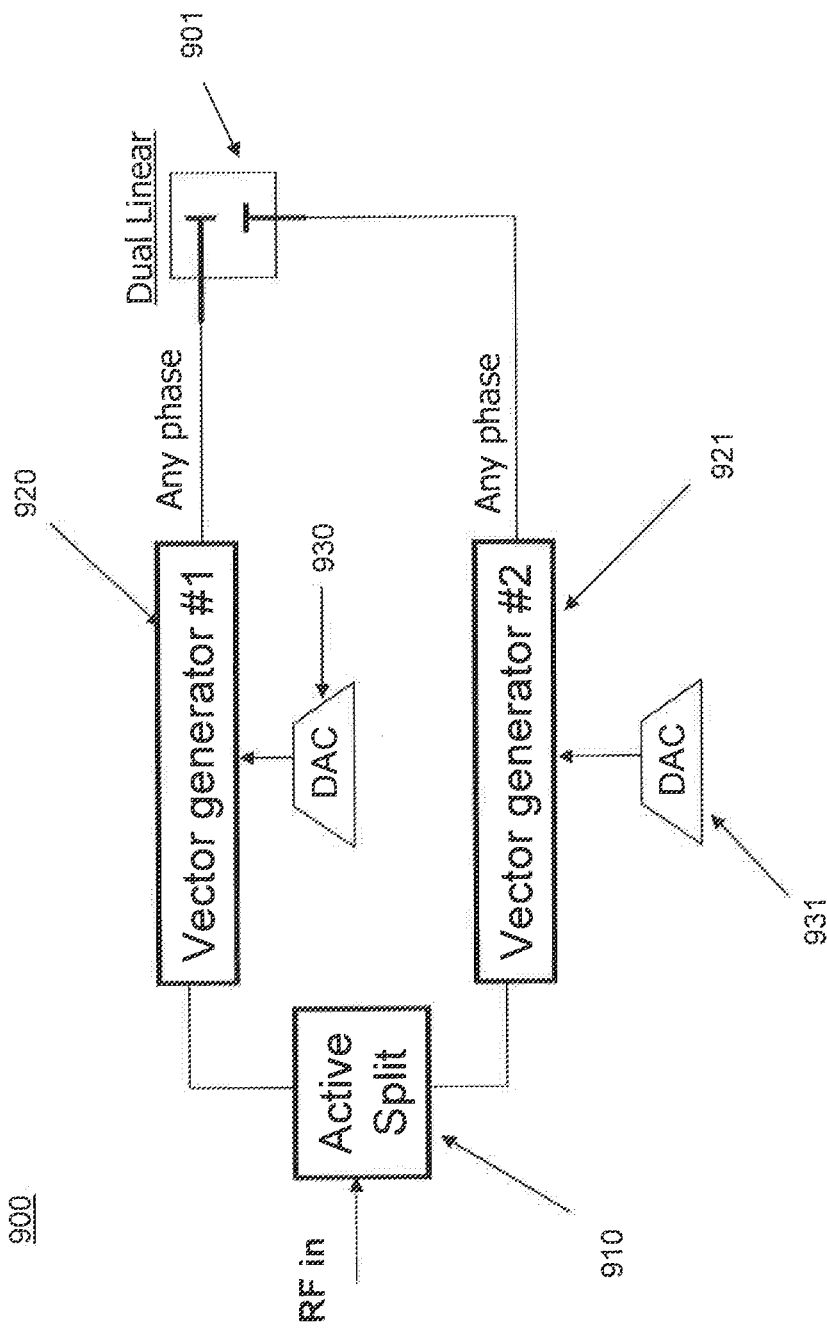
FIG. 9 illustrates an exemplary embodiment of a phased array antenna with dual linear polarization for transmit mode.

In contrast, a dual linear polarization antenna communicates two signals to a radiating element. In an exemplary embodiment and with reference to FIG. 9, a phased array antenna 900 is configured to transmit a signal with dual linear polarization. Phased array antenna 900 comprises an active power splitter 910, a first vector generator 920, a second vector generator 921, a first DAC 930, and a second DAC 931. Phased array antenna 900 is a basic transmit embodiment with the two vector generator output signals energizing a radiating element 901, in both the horizontal and vertical orientations. Furthermore, the output signals of vector generators 920, 921 can have any relative phase between the two signals. In a circular polarization embodiment, the output signal of vector generator 920 has a +/−90° relative phase difference with the output signal of vector generator 921 when energizing radiating element 901, in an exemplary embodiment with elliptical polarization, the output signal of vector generator 920 has a relative phase difference other than +/−90° with the output signal of vector generator 921 when energizing radiating element 901.

Figure 10:
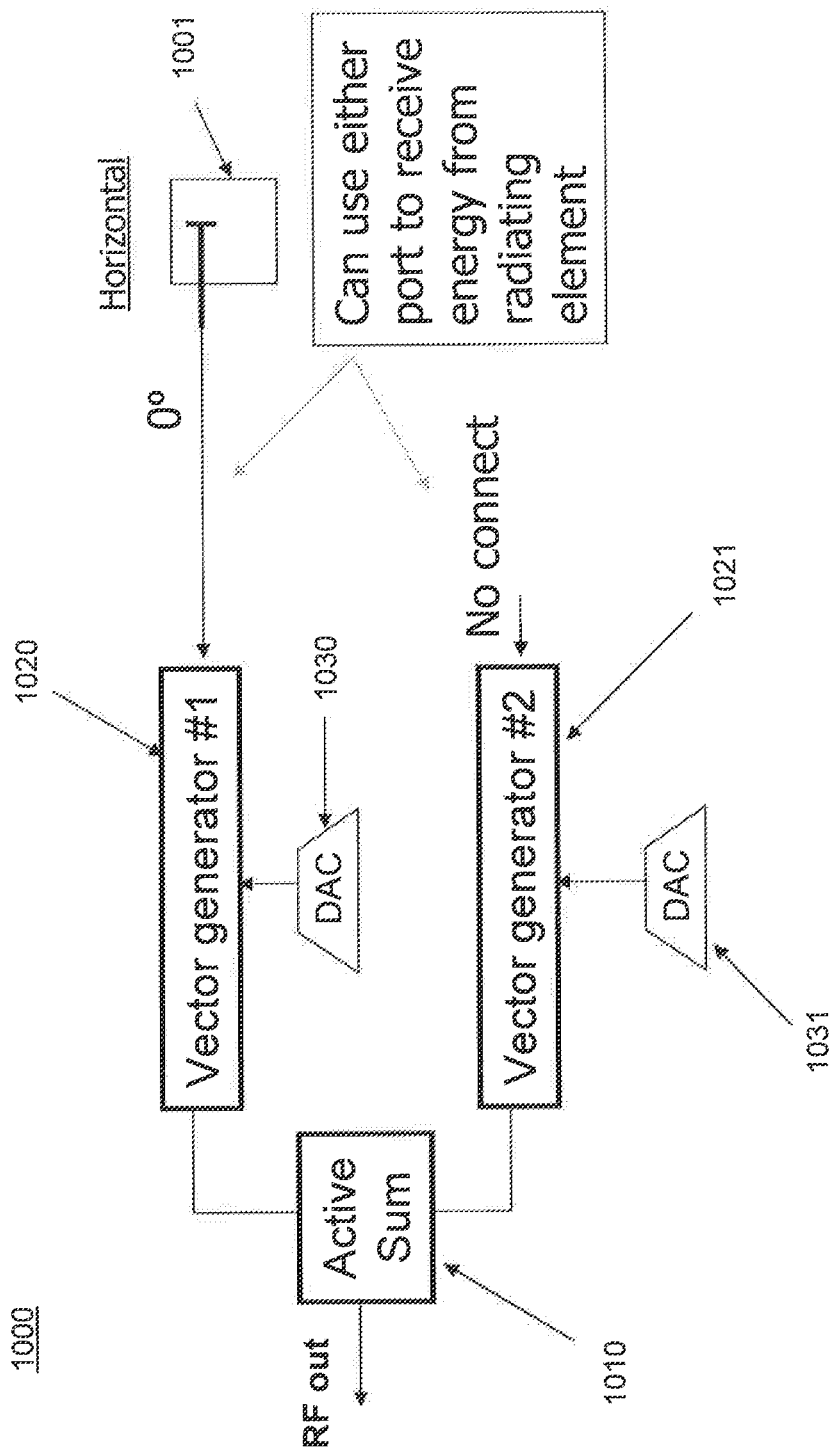
FIG. 10 illustrates an exemplary embodiment of a pleased array antenna with horizontal linear polarization for receive mode.

FIG. 10 shows an exemplary embodiment of a phased array antenna 1000 configured to receive a signal with linear polarization. Phased array antenna 1000 comprises an active power combiner 1010, a first vector generator 1020, a second vector generator 1021, a first DAC 1030 and a second DAC 1031. Phased array antenna 1000 is a basic receive embodiment with one of vector generators 1020, 1021 communicating a signal from a radiating element 1001 to active power combiner 1010 and the other of vector generators 1020, 1021 not being in communication with radiating element 1001. Additionally, radiating element 1001 can have a horizontal or vertical orientation.

In another exemplary embodiment, a phased array antenna is configured to receive a signal with linear polarization and comprises only one vector generator and corresponding controlling DAC. As would be known to one skilled in the art, various embodiments described herein that manipulate only one vector generator output may comprise only one vector generator, in other words, in one embodiment, phased array antenna 1000 comprises first vector generator 1020 but not second vector generator 1021 or active combiner 1010.

Figure 11:
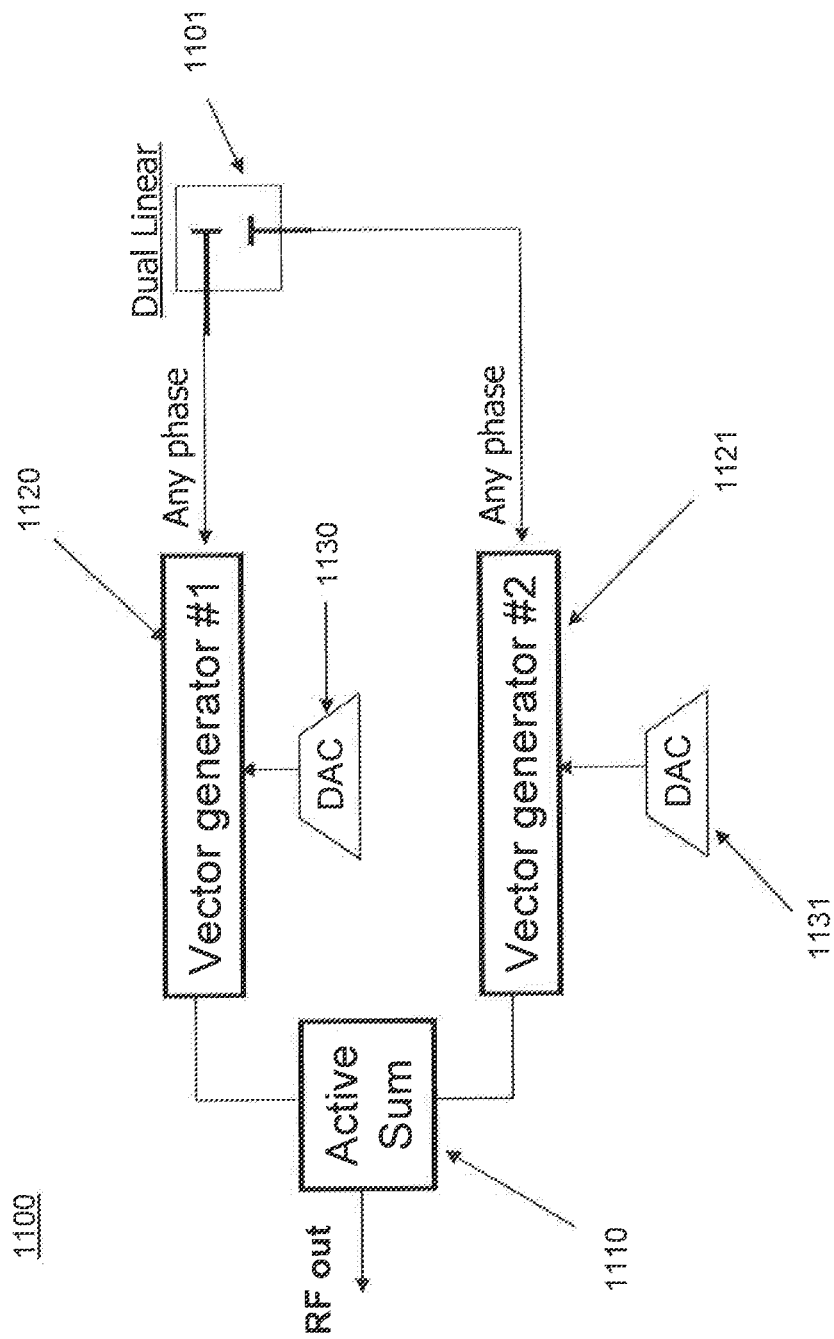
FIG. 11 illustrates an exemplary embodiment of a phased array antenna with dual linear polarization for receive mode.

In contrast, a dual linear polarization antenna communicates two signals from a radiating element. In an exemplary embodiment and with reference to FIG. 11, a phased array antenna 1100 is configured to receive a signal with dual linear polarization. Phased array antenna 1100 comprises an active power combiner 1110, a first vector generator 1120, a second vector generator 1121, a first DAC 1130, and a second DAC 1131. Phased array antenna 1100 is a basic receive embodiment with vector generators 1120, 1121 receiving individual polarized signals from radiating element 1101 as input signals. The individual polarized signals may be a horizontal oriented signal and a vertical oriented signal. Furthermore, the input signals of vector generators 1120, 1121 can have any relative phase between the two signals. In a circular polarization embodiment, the input signal of vector generator 1120 has a +/−90° relative phase difference with the input signal of vector generator 1121 when received from radiating element 1101. In an exemplary embodiment with elliptical polarization, the input signal of vector generator 1120 has a relative phase difference other than +/−90° with the input signal of vector generator 1121 when received from radiating element 1101.

Figure 12:
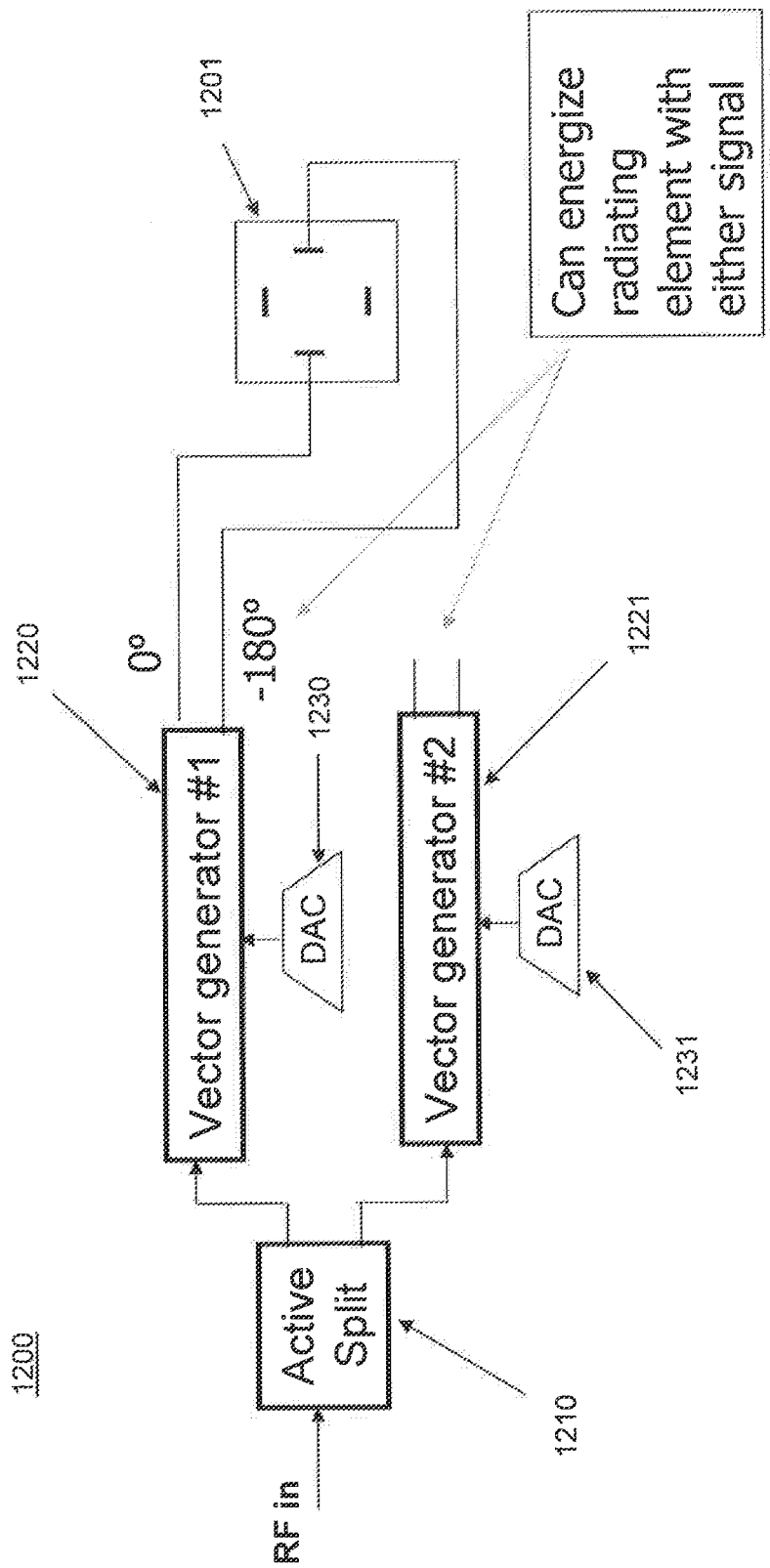
FIG. 12 illustrates an exemplary embodiment of a phased array antenna with differentially fed horizontal linear polarization for transmit mode.

FIG. 12 shows an exemplary embodiment of a phased array antenna 1200 configured to transmit a signal with differentially fed linear polarization. Phased array antenna 1200 comprises an active, power splitter 1210, a first vector generator 1220, a second vector generator 1221, a first DAC 1230 and a second DAC 1231. Phased array antenna 1200 is a basic transmit embodiment with a differential output signal from one of vector generators 1220, 1221 energizing a radiating element 1201. As is known to one in the art, a differential signal has two signals are 180° out of phase from each other. In various embodiments, the differential signal may be fed into the "horizontal" portions of radiating element 1201 or into the "vertical" portions of radiating element 1201.

In another exemplary embodiment, a phased array antenna configured to transmit a differential signal with linear polarization comprises only one vector generator and a controlling DAC. As one skilled in the art understands, the embodiments described herein that manipulate only one vector generator output can comprise only a single vector generator. In other words, in one embodiment, phased array antenna 1200 comprises first vector generator 1220 but not second vector generator 1221 or active power splitter 1210.

Figure 13:
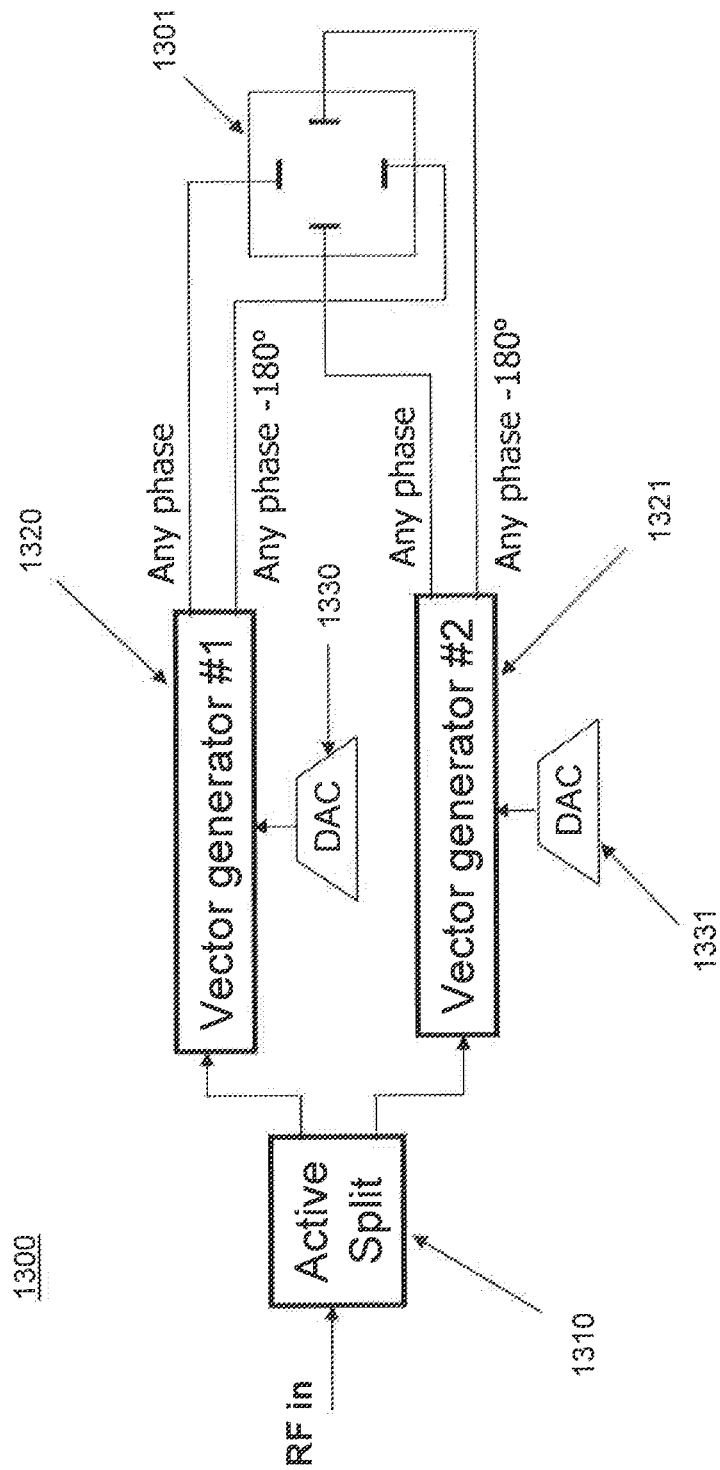
FIG. 13 illustrates an exemplary embodiment of a phased array antenna with differentially fed dual linear polarization for transmit mode.

In contrast, a dual linear polarization antenna communicates two differentially fed signals to a radiating element. In an exemplary embodiment and with reference to FIG. 13, a phased array antenna 1300 is configured to transmit differential signals with dual linear polarization. Phased array antenna 1300 comprises an active power splitter 1310, a first vector generator 1320, a second vector generator 1321, a first DAC 1330, and a second DAC 1331. Phased array antenna 1300 is a basic transmit embodiment with a first differentially fed output signal of vector generator 1320 and a second differentially fed output signal of vector generator 1321 energizing a radiating element 1301. In an exemplary embodiment, the first differentially fed output signal is fed into radiating element 1301 in a vertical orientation. Furthermore, in the exemplary embodiment, the second differentially fed output signal is fed into radiating element 1301 in a horizontal orientation. Moreover, the first differentially fed output signal of vector generator 1320 and the second differentially fed output signal of vector generator 1321 can have any relative phase between the two signals. In a circular polarization embodiment, the first differentially fed output signal of vector generators 1320 has a +/−90° relative phase difference with the second differentially fed output signal of vector generator 1321 when energizing radiating element 1301. In an exemplary embodiment with elliptical polarization, the first differentially fed output signal of vector generator 1320 has a relative phase difference other than +/−90° with the second differentially fed output signal of vector generator 1321 when energizing radiating element 1301.

Figure 14:
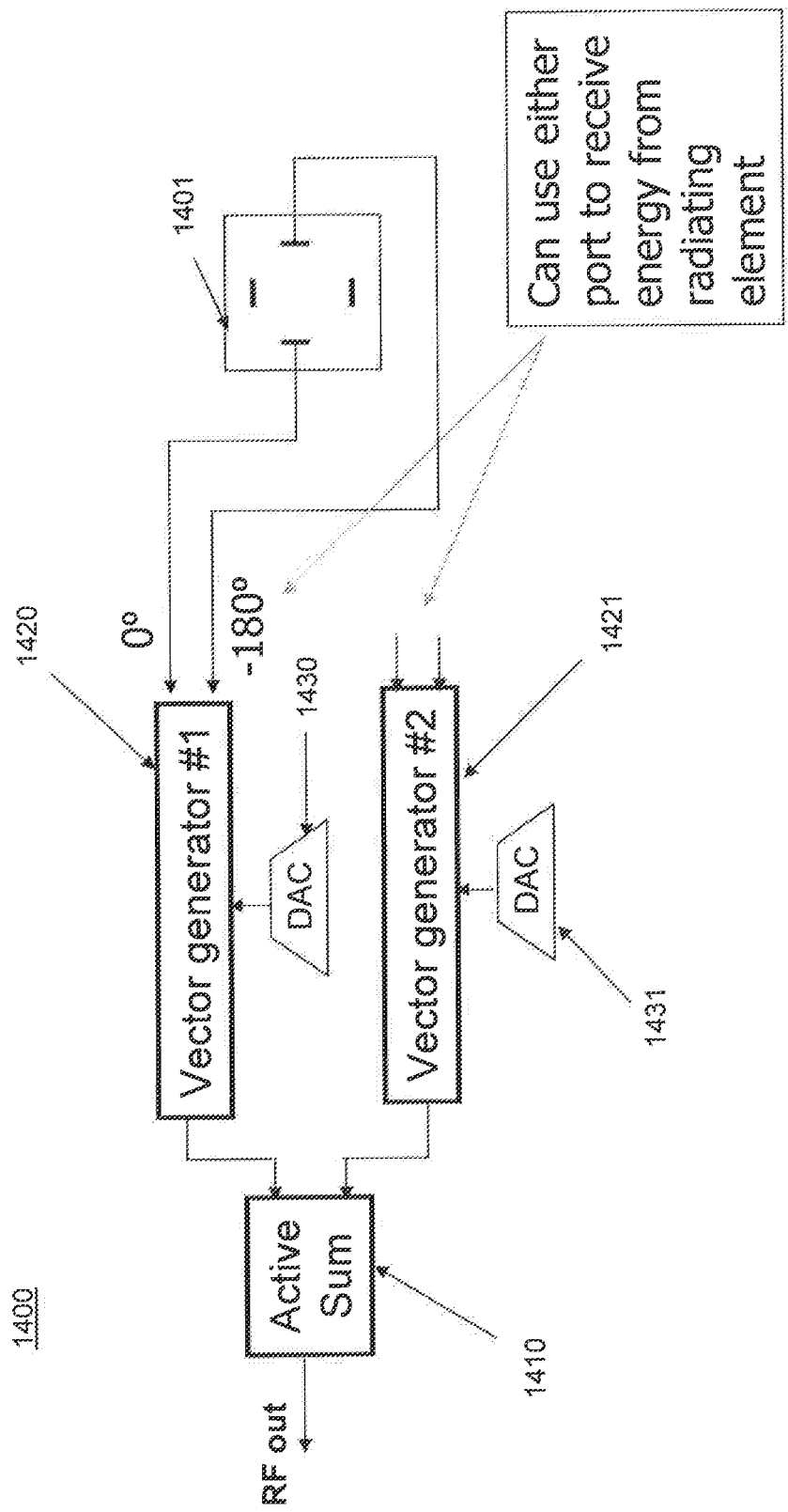
FIG. 14 illustrates an exemplary embodiment of a phased array antenna with differentially fed horizontal linear polarization for receive mode.

FIG. 14 shows an exemplary embodiment of a phased array antenna 1400 configured to receive a signal with differentially fed horizontal linear polarization. Phased array antenna 1400 comprises an active power combiner 1410, a first vector generator 1420, a second vector generator 1421, a first DAC 1430 and a second DAC 1431. Phased array antenna 1400 is a basic receive embodiment with one of vector generators 1420, 1421 receiving a differential input signal from a radiating element 1401 and communicating an output signal to active power combiner 1410. In one embodiment, and similar to phased array antenna 800, the other of vector generators 1420, 1421 is not in communication with radiating element 1401. Furthermore, the differential signal may be received from the "horizontal" portions of radiating element 1401 or from the "vertical" portions of radiating element 1401.

In another exemplary embodiment, a phased array antenna is configured to receive a signal with differentially fed horizontal linear polarization and comprises only one vector generator and corresponding controlling DAC. As would be known to one skilled in the art, various embodiments described herein that manipulate only one vector generator input may comprise only one vector generator. In other words, in one embodiment, phased array antenna 1400 comprises first vector generator 1420 but not second vector generator 1421 or active combiner 1410.

Figure 15:
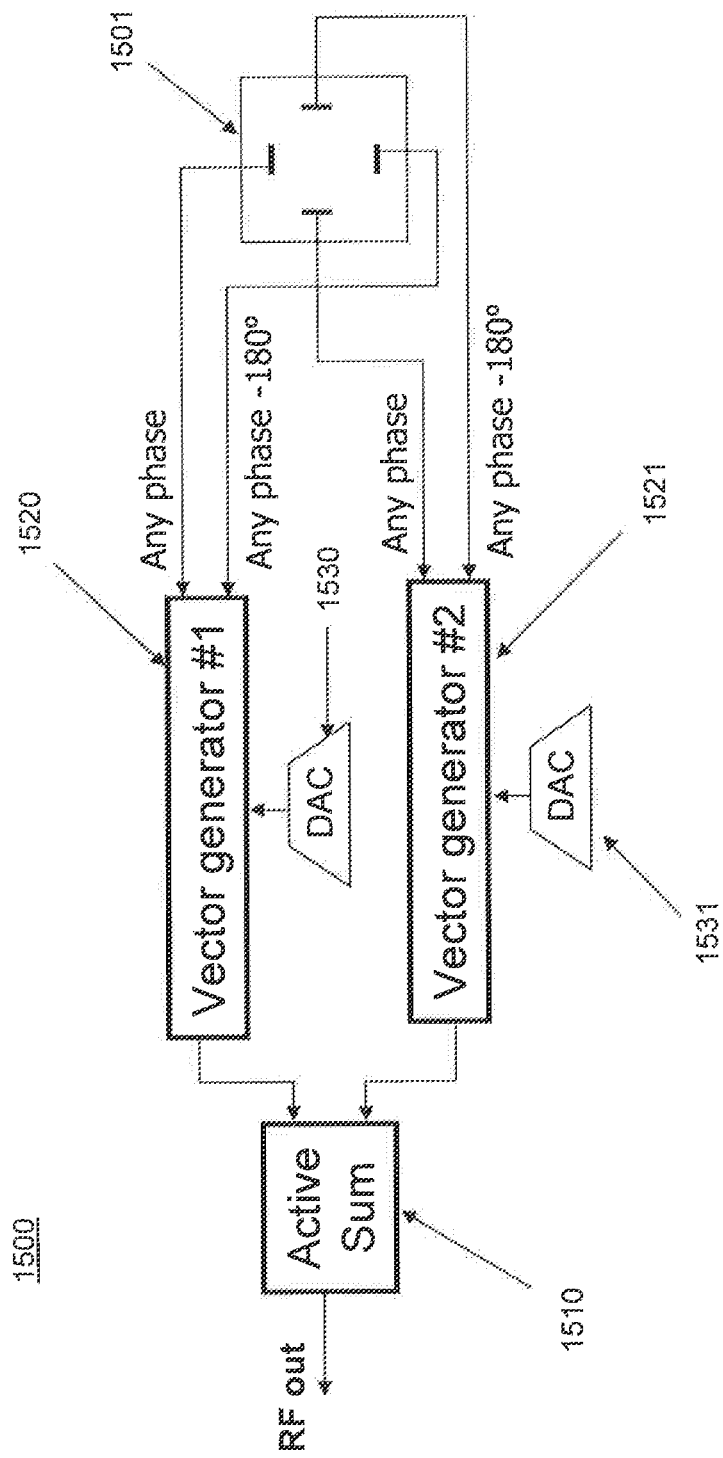
FIG. 15 illustrates an exemplary embodiment of a phased array antenna with differentially fed dual linear polarization for receive mode.

In contrast, a dual linear polarization antenna communicates two differentially fed signals from a radiating element. In an exemplary embodiment and with reference to FIG. 15, a phased array antenna 1500 is configured to receive differential signals with dual linear polarization. Phased array antenna 1500 comprises an active power combiner 1510, a first vector generator 1520, a second vector generator 1521, a first DAC 1530, and a second DAC 1531. Phased array antenna 1500 is a basic receive embodiment with vector generator 1520 receiving a first differentially fed input signal and vector generator 1521 receiving a second differentially fed input signal from a radiating element 1501. In an exemplary embodiment, the first differentially fed input signal is received from radiating element 1501 in a vertical orientation. Furthermore, in the exemplary embodiment, the second differentially fed input signal is received from radiating element 1501 in a horizontal orientation. Moreover, the first and second differentially fed input signals of vector generators 1520, 1521 can have any relative phase between the two signals, in a circular polarization embodiment, the first differentially fed input signal of vector generator 1520 has a +/−90° relative phase difference with the second differentially fed input signal of vector generator 1521 when received from radiating element 1501. In an exemplary embodiment with elliptical polarization, the first differentially fed output signal of vector generator 1520 has a relative phase difference other than +/−90° with the second differentially fed output signal of vector generator 1521 when energizing radiating element 1501.

The various phased array antenna embodiments described above may be implemented into a multiple radiating element architecture. Furthermore, the multiple radiating elements are scalable in terms of both radiating elements and beam forming. An embodiment with vector generators in communication with individual radiating elements facilitates additional beams while using the same radiating aperture. Furthermore, the radiating element transmitter/receiver may comprise various numbers of radiating elements. For example, the antenna architecture could comprise multiple radiating elements in the range of 2-20.

Figure 16:
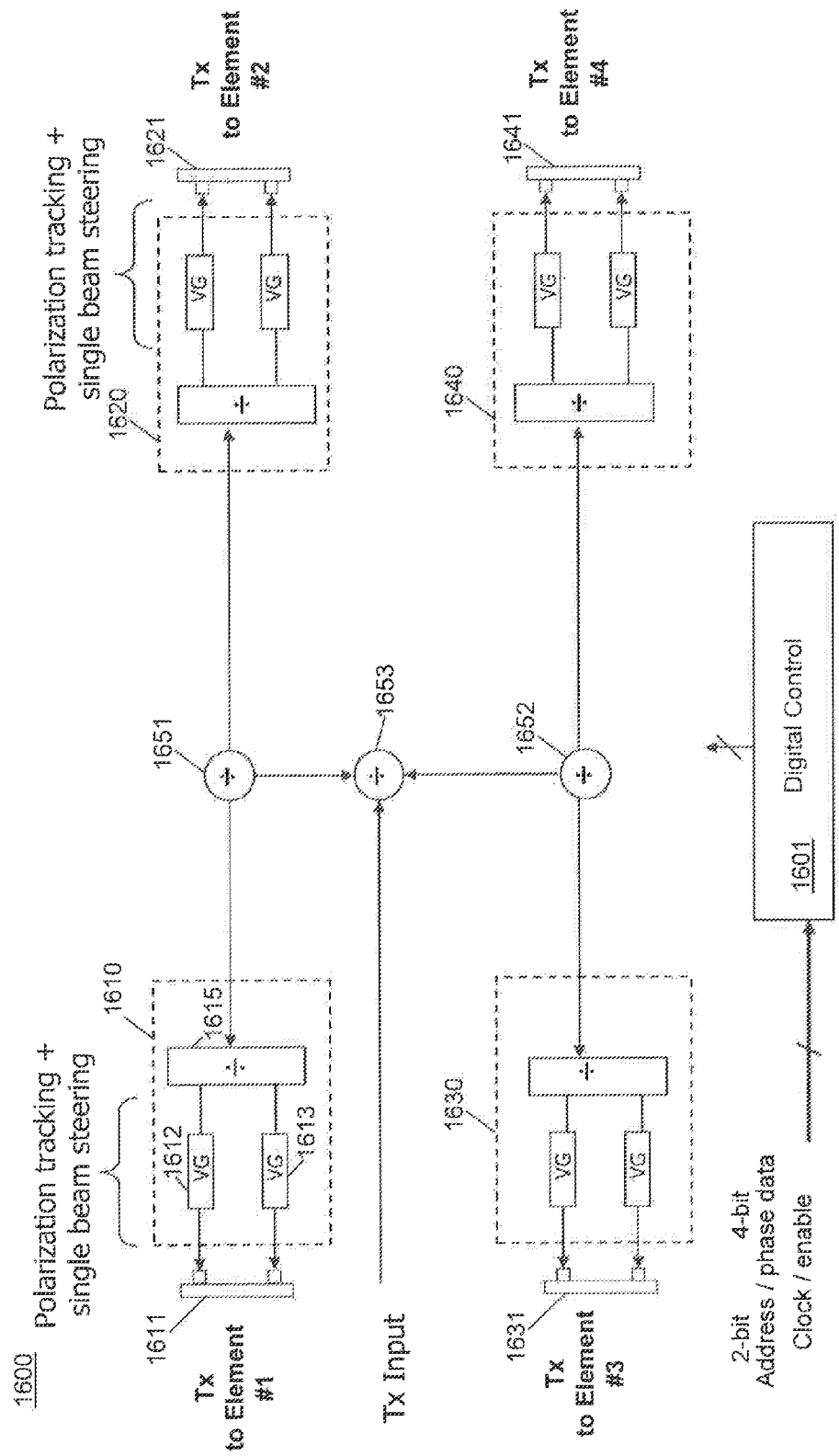
FIG. 16 illustrates an exemplary embodiment of a phased array integrated circuit configured as a 1-beam, 4-element transmitter.

In accordance with an exemplary embodiment, and with reference to FIG. 16, a phased array integrated circuit ("IC") 1600 is configured as a 4-radiating element transmitter. The phased array IC 1600 comprises a first subcircuit 1610 in communication with a first radiating element 1611, a second subcircuit 1620 in communication with a second radiating element 1621, a third subcircuit 1630 in communication with a third radiating element 1631, and a fourth subcircuit 1640 in communication with a fourth radiating element 1641. Each subcircuit 1610, 1620, 1630, 1640 receives an input signal and transmits the signal to the spatially orthogonal ports of the respective radiating element 1611, 1621, 1631, 1641.

In accordance with an exemplary embodiment, an RE input signal is provided to phased array IC 1600. In an exemplary embodiment, multiple splitters are used to divide the RE input signal that is communicated to each of four subcircuits 1610, 1620, 1630, 1640 as input signals. In a more specific exemplary embodiment, a balun may be implemented to convert the RF input signal into a differential RE input signal. Differential signaling may improve signal isolation and interference rejection if the RE signal is in analog form. An active splitter 1653 is configured to divide the differential RE input signal into two separate signals that are communicated to an active splitter 1651 and an active splitter 1652, respectively. At the next stage, active splitter 1651 is configured to divide the communicated signal and communicate the divided signals to first subcircuit 1610 and second subcircuit 1620. Similarly, active splitter 1652 is configured to divide the communicated signals and communicate the divided signals to third subcircuit 1630 and fourth subcircuit 1640.

The structure and function of each subcircuit 1610, 1620, 1630, 1640 is substantially similar. Thus, only first subcircuit 1610 will be discussed in detail. Moreover, subcircuit 1610 is substantially similar to transmit active antenna polarizer 700. In accordance with an exemplary embodiment, first subcircuit 1610 comprises a first vector generator 1612 controlled by a first DAC (not shown), a second vector generator 1613 controlled by a second DAC (not shown), and an active splitter 1615. Though the signals communicated in phased array IC 1600 may be described as differential, the signals may also be single-ended. Active splitter 1615 receives a differential signal from active splitter 1651, and divides the differential signal once again. In an exemplary embodiment, vector generators 1612, 1613 individually receive a differential signal from active splitter 1615. Furthermore, vector generators 1612, 1613 are configured to adjust the phase and polarization of the signals to be transmitted so that individual beam steering and polarization control may be achieved. Vector generators 1612, 1613 afford two degrees of freedom to polarization track and beam steer. For circular or elliptical polarization and single beam steering, one of the vector generators can provide the beam steering while the other vector generator can provide an offset phase to track the polarization.

The polarized signals are then communicated from vector generators 1612, 1613 to the spatially orthogonal ports of radiating element 1611 for transmission. In an exemplary embodiment, a digital control 1601 communicates polarization and beam steering commands to vector generators 1612, 1613 via the respective DACs.

Figure 17:
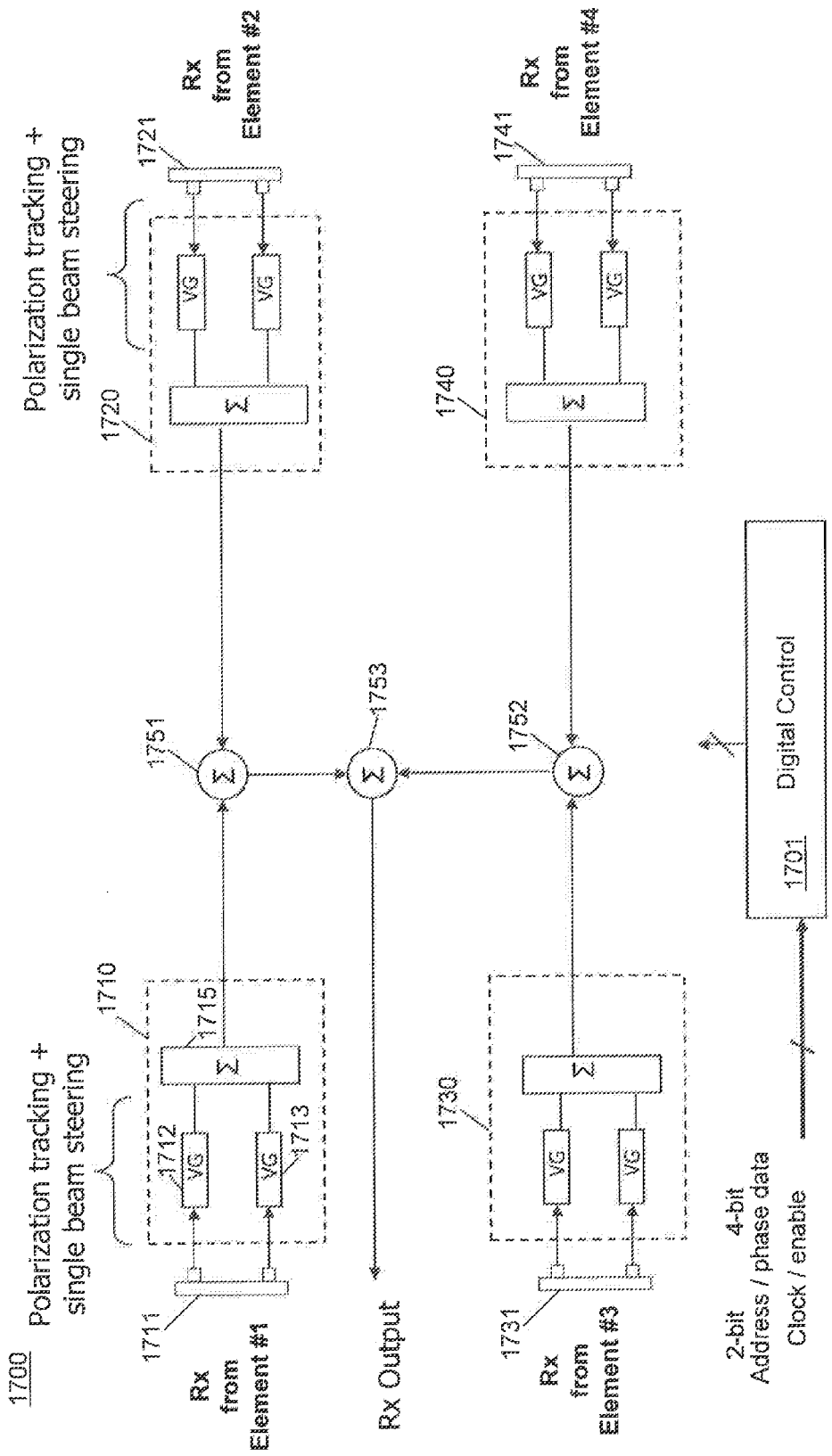
FIG. 17 illustrates an exemplary embodiment of a phased array integrated circuit configured as a 1-beam, 4-element receiver.

In addition to a 1-beam, 4-radiating element transmitter, a similar structure may be configured as a 1-beam, 4-radiating element receiver. In an exemplary embodiment and with reference to FIG. 17, a phased array integrated circuit 1700 is configured as a 1-beam, 4-radiating element receiver. The phased array IC 1700 comprises a first subcircuit 1710 in communication with a first radiating element 1711, a second subcircuit 1720 in communication with a second radiating element 1721, a third subcircuit 1730 in communication with a third radiating element 1731, and a fourth subcircuit 1740 in communication with a fourth radiating element 1741. Each subcircuit 1710, 1720, 1730, 1740 receives a pair of spatially orthogonal RF signals from the respectively coupled radiating element 1711, 1721, 1731, 1741 and generates a single output signal.

The structure and function of each subcircuit 1710, 1720, 1730, 1740 is substantially similar. Thus, only first subcircuit 1710 will be discussed in detail. In accordance with an exemplary embodiment, first subcircuit 1710 has a polarization tracking and single beam steering portion comprising two vector generators 1712, 1713. The two vector generators 1712, 1713 are configured to receive the RF input signal from radiating element 1711, provide beam steering, track the polarization of the signals, and communicate the vector generator output signals to an active power combiner 1715. Vector generators 1712, 1713 afford two degrees of freedom to polarization track and beam steer. For circular or elliptical polarization and single beam steering, one of the vector generators can provide the beam steering while the other vector generator can provide an offset phase to track the polarization. The active power combiner 1715 combines the two vector generator output signals and generates a composite output signal.

In an exemplary embodiment, a digital control 1701 communicates polarization and beam steering commands to vector generators 1712, 1713, for example, via corresponding DACs.

In accordance with an exemplary embodiment, a receive beam output is generated by combining the single output signal from each of four subcircuits 1710, 1720, 1730, 1740. In an exemplary embodiment, multiple combiners are used to combine the subcircuit output signals into a receive beam. In a more specific exemplary embodiment, an active combiner 1751 is configured to combine the single outputs from first and second subcircuits 1710, 1720. Also in the exemplary embodiment, an active combiner 1752 is configured to combine the single outputs from third and fourth subcircuits 1730, 1740. At the next stage, an active combiner 1753 is configured to combine the combined outputs of active combiners 1751, 1752 to form a receive beam output.

Figure 18:
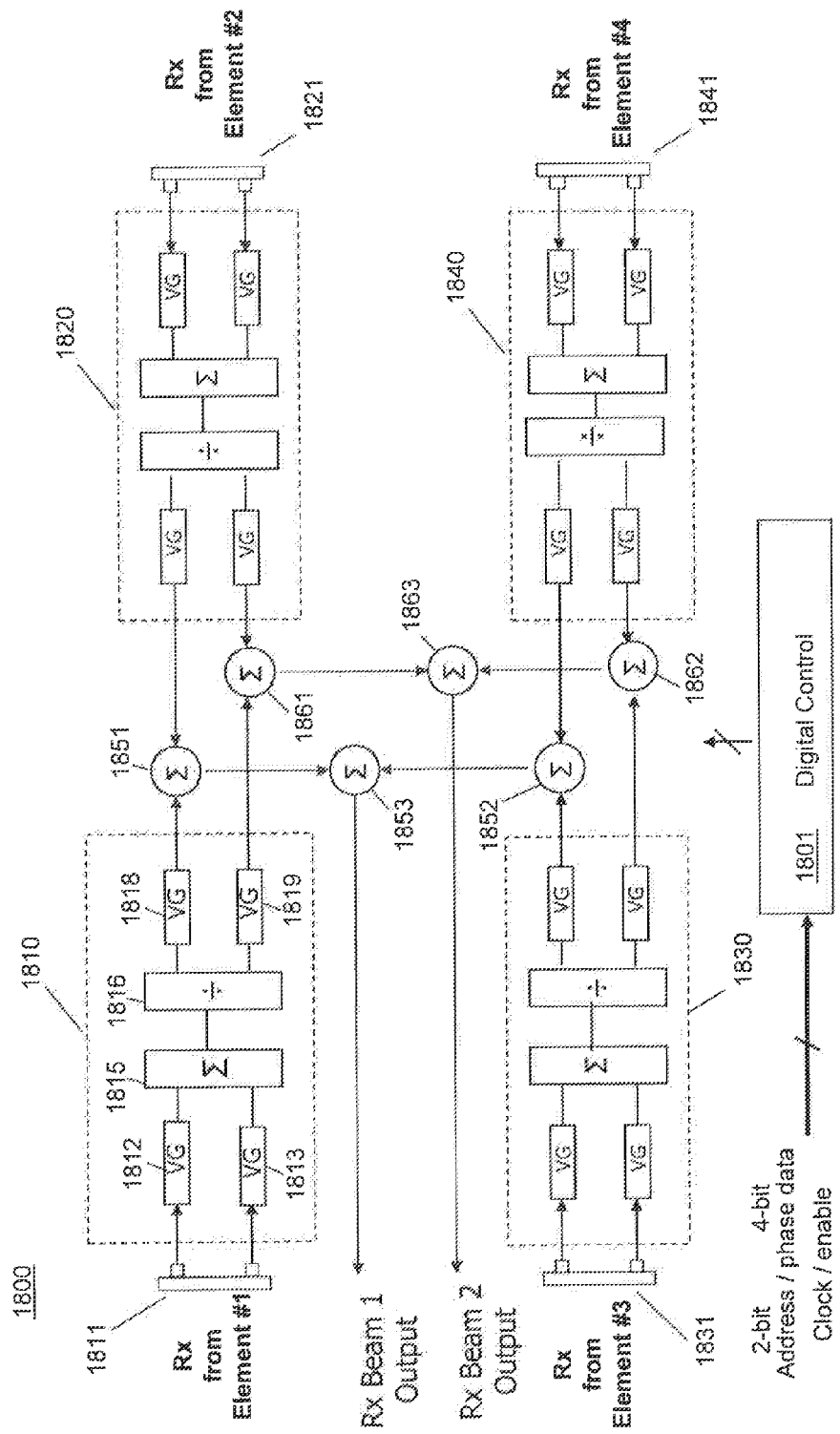
FIG. 18 illustrates an exemplary embodiment of a phased array integrated circuit configured as a 2-beam, 4-element receiver.

In addition to a 1-beam 4-radiating element antenna, a similar structure may be configured as a 2-beam 4-radiating element antenna. In an exemplary embodiment and with reference to FIG. 18, a phased array integrated circuit 1800 is configured as a 2-beam, 4-radiating element receiver. The phased array IC 1800 comprises a first subcircuit 1810 in communication with a first radiating element 1811, a second subcircuit 1820 in communication with a second radiating element 1821, a third subcircuit 1830 in communication with a third radiating element 1831, and a fourth subcircuit 1840 in communication with a fourth radiating element 1841. Each subcircuit 1810, 1820, 1830, 1840 receives a pair of spatially orthogonal RF signals from the respectively coupled radiating element 1811, 1821, 1831, 1841 and generates two output signals, one for each beam to be formed.

The structure and function of each subcircuit 1810, 1820, 1830, 1840 is substantially similar. Thus, only first subcircuit 1810 will be discussed in detail. In accordance with an exemplary embodiment, first subcircuit 1810 has a polarization forming portion comprising two vector generators 1812, 1813. The two vector generators 1812, 1813 are configured to receive the RF input signals from radiating element 1811, polarization track the signals, and transmit the vector generator output signals to an active power combiner 1815. The active power combiner 1815 combines the two vector generator output signals and generates a composite intermediate signal. The composite intermediate signal is communicated from active power combiner 1815 to an active power splitter 1816. The active power splitter 1816 divides the intermediate signal into two signals, one for each beam, with each of the two output signals passing through a beam forming portion of subcircuit 1810. The beam forming portion comprises two vector generators 1818, 1819, whose outputs represent independently steered beam components to be combined in the respective beam forming network. In an exemplary embodiment, a digital control 1801 communicates polarization and beam steering commands to vector generators 1812, 1813, 1818, 1819.

In accordance with an exemplary embodiment, a first receive beam output is generated by combining one of the two output signals from each of four subcircuits 1810, 1820, 1830, 1840. A second receive beam output is generated by combining the second of the two output signals from each of four subcircuits 1810, 1820, 1830, 1840. In an exemplary embodiment, multiple combiners are used to combine the subcircuit output signals into a first receive beam output and a second receive beam output.

In a more specific exemplary embodiment, an active combiner 1851 is configured to combine the first of the two outputs from first and second subcircuits 1810, 1820. Furthermore, an active combiner 1861 is configured to combine the second of the two outputs from first and second subcircuits 1810, 1820. Also in the exemplary embodiment, an active combiner 1852 is configured to combine the first of the two outputs from third and fourth subcircuits 1830, 1840. An active combiner 1862 is configured to combine the second of the two outputs from third and fourth subcircuits 1830, 1840.

At the next stage, an active combiner 1853 is configured to combine the combined outputs of active combiners 1851 and 1852 to form a first receive beam output. Furthermore, an active combiner 1863 is configured to combine the combined outputs of active combiners 1861 and 1862 to form a second receive beam output.

Figure 19:
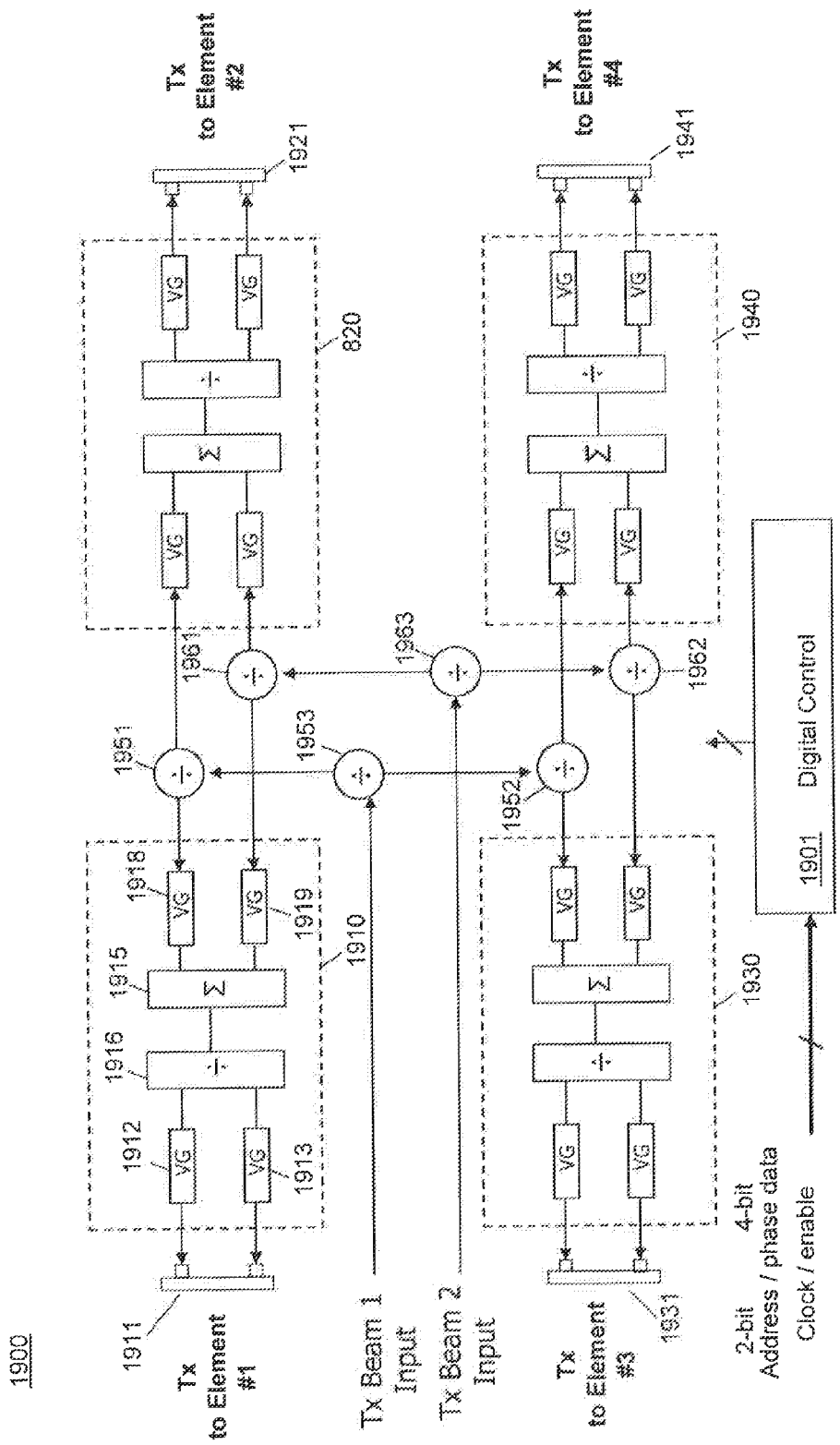
FIG. 19 illustrates an exemplary embodiment of a phased array integrated circuit configured as a 2-beam, 4-element transmitter.

In addition to a 2-beam, 4-radiating element receiver, a similar structure may be configured as a 2-beam, 4-radiating element transmitter. In an exemplary embodiment, and with reference to FIG. 19, a phased array integrated circuit 1900 is configured as a 2-beam, 4-radiating element transmitter. The phased array IC 1900 comprises a first subcircuit 1910 in communication with a first radiating element 1911, a second subcircuit 1920 in communication with a second radiating element 1921, a third subcircuit 1930 in communication with a third radiating element 1931, and a fourth subcircuit 1940 in communication with a fourth radiating element 1941. Each subcircuit 1910, 1920, 1930, 1940 receives two input signals and transmits signals to the spatially orthogonal ports of the respectively coupled radiating element 1911, 1921, 1931, 1941.

In accordance with an exemplary embodiment, a first transmit beam and a second transmit beam are provided to phased array IC 1900. In an exemplary embodiment, multiple splitters are used to divide the first and second transmit beams that are communicated to each of four subcircuits 1910, 1920, 1930, 1940 as input signals.

In a more specific exemplary embodiment, an active splitter 1953 is configured to divide the first transmit beam input into two separate signals that are communicated to an active splitter 1951 and an active splitter 1952, respectively. Similarly, an active splitter 1963 is configured to divide the second transmit beam input into two separate signals that are communicated to an active splitter 1961 and an active splitter 1962, respectively.

At the next stage, active splitters 1951, 1961 are configured to divide the communicated signals and communicate the divided signals to first subcircuit 1910 and second subcircuit 1920. The active splitters 1952, 1962 are configured to divide the communicated signals and communicate the divided signals to third subcircuit 1930 and fourth subcircuit 1940.

The structure and function of each subcircuit 1910, 1920, 1930, 1940 is substantially similar. Thus, only first subcircuit 1910 will be discussed in detail. In accordance with an exemplary embodiment, first subcircuit 1910 has a beam forming portion comprising two vector generators 1918, 1919. The two vector generators 1918, 1919 are configured to individually receive an input signal from active splitters 1951, 1961, respectively and adjust the phase according to beam steering commands.

An active power combiner 1915 combines the two phase-adjusted signals and generates a composite phase-adjusted intermediate signal. The composite phase-adjusted intermediate signal is communicated from active power combiner 1915 to an active power splitter 1916. The active power splitter 1916 divides the intermediate signal into two splitter output signals, with each of the two splitter output signals passing through a polarization modifying portion of first subcircuit 1910. The polarization modifying portion comprises vector generators 1912, 1913, and is configured to polarize the output signals to the desired polarization. The polarized signals are then communicated to the spatially orthogonal ports of radiating element 1911 for transmission. In an exemplary embodiment, a digital control 1901 communicates polarization and beam steering commands to vector generators 1912, 1913, 1918, 1919.

Figure 20:
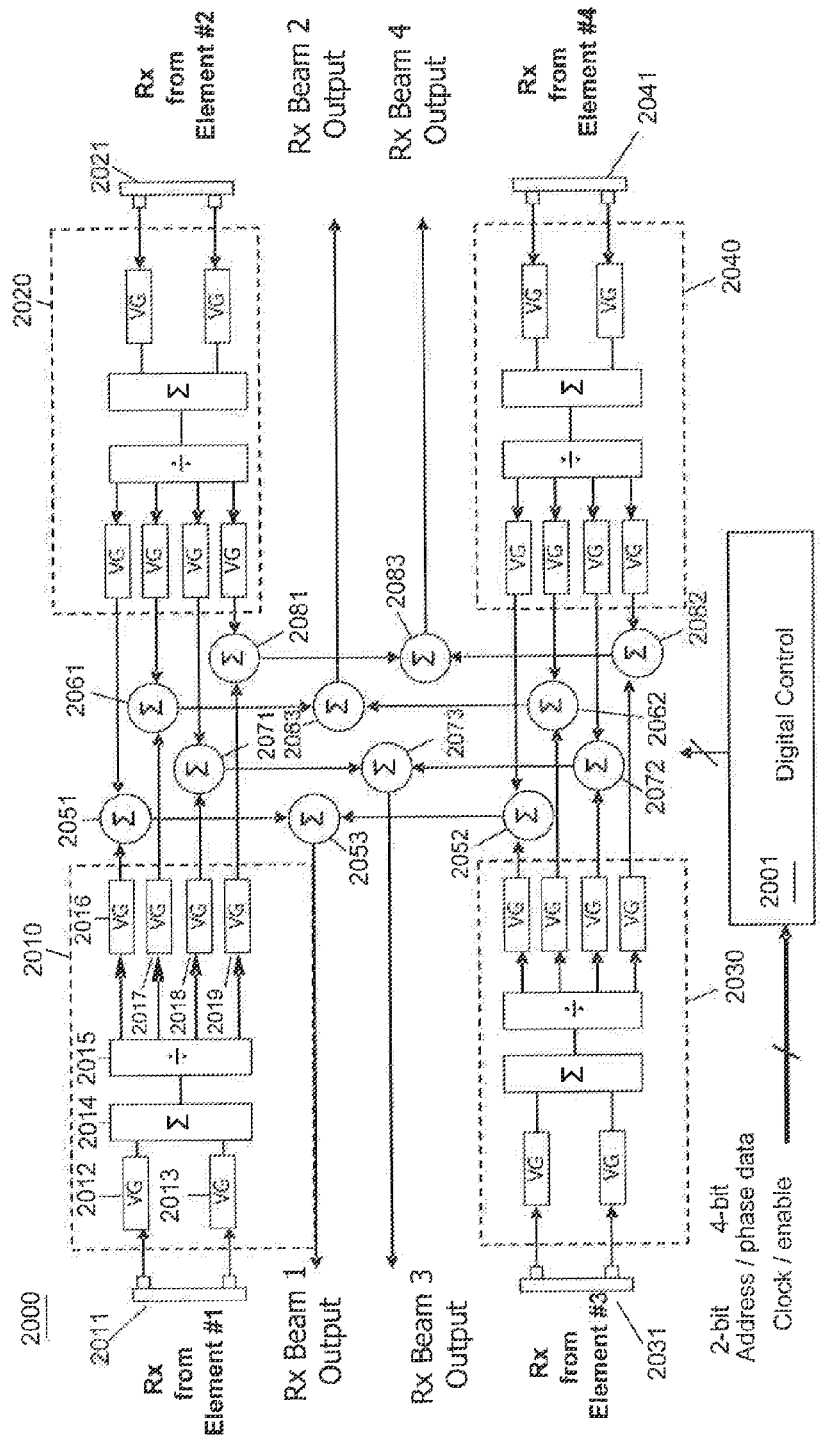
FIG. 20 illustrates an exemplary embodiment of a phased array integrated circuit configured as a 4-beam, 4-element receiver.

In an exemplary embodiment and with reference to FIG. 20, a phased array integrated circuit 2000 is configured as a 4-beam, 4-radiating element receiver. The phased array IC 2000 comprises a first subcircuit 2010 in communication with a first radiating element 2011, a second subcircuit 2020 in communication with a second radiating element 2021, a third subcircuit 2030 in communication with a third radiating element 2031, and a fourth subcircuit 2040 in communication with a fourth radiating element 2041. Each subcircuit 2010, 2020, 2030, 2040 receives a pair of spatially orthogonal RF signals from the respectively coupled radiating element 2011, 2021, 2031, 2041 and generates four output signals, one for each beam to be formed.

The structure and function of each subcircuit 2010, 2020, 2030, 2040 is substantially similar. Thus, only first subcircuit 2010 will be discussed in detail. In accordance with an exemplary embodiment, first subcircuit 2010 has a polarization tracking portion comprising two vector generators 2012, 2013. The two vector generators 2012, 2013 are configured to receive the RF input signal from radiating element 2011, track the polarization of the signals, and transmit vector generator signal outputs to an active power combiner 2014. The active power combiner 2014 combines the two vector generator signal outputs and generates a composite intermediate signal. The composite intermediate signal is communicated from active power combiner 2014 to an active power splitter 2015. The active power splitter 2015 divides the intermediate signal into four signals, with each of the four output signals passing through a beam forming portion of subcircuit 2010. The beam forming portion comprises four vector generators 2016, 2017, 2018 2019, whose outputs represent independently steered beam components to be combined in the respective beam forming network. In an exemplary embodiment, a digital control 2001 communicates polarization and beam steering commands to vector generators 2012, 2013, 2016, 2017, 2018, 2019.

In accordance with an exemplary embodiment, a first receive beam output is generated by combining one of the four output signals from each of four subcircuits 2010, 2020, 2030, 2040. A second receive beam output is generated by combining a second of the four output signals from each of four subcircuits 2010, 2020, 2030, 2040. A third receive beam output is generated by combining a third of the four output signals from each of four subcircuits 2010, 2020, 2030, 2040. A fourth receive beam output is generated by combining a fourth of the four output signals from each of four subcircuits 2010, 2020, 2030, 2040. In an exemplary embodiment, multiple combiners are used to combine the subcircuit output signals into the four receive beam outputs.

In a more specific exemplary embodiment, an active combiner 2051 is configured to combine the first of the four outputs from first and second subcircuits 2010, 2020. Furthermore, an active combiner 2061 is configured to combine the second of the four outputs from first and second subcircuits 2010, 2020. Likewise, an active combiner 2071 is configured to combine the third of the four outputs from first and second subcircuits 2010, 2020. An active combiner 2081 is configured to combine the fourth of the four outputs from first and second subcircuits 2010, 2020.

Also in the exemplary embodiment, an active combiner 2052 is configured to combine the first of the two outputs from third and fourth subcircuits 2030, 2040. An active combiner 2062 is configured to combine the second of the four outputs from third and fourth subcircuits 2030, 2040. Furthermore, an active combiner 2072 is configured to combine the third of the four outputs from third and fourth subcircuits 2030, 2040. An active combiner 2082 is configured to combine the fourth of the four outputs from third and fourth subcircuits 2030, 2040.

At the next stage, an active combiner 2053 is configured to combine the combined outputs of active combiners 2051, 2052 to form a first receive beam output. An active combiner 2063 is configured to combine the combined outputs of active combiners 2061, 2062 to form a second receive beam output. Furthermore, an active combiner 2073 is configured to combine the combined outputs of active combiners 2071, 2072 to form a third receive beam output. An active combiner 2083 is configured to combine the combined outputs of active combiners 2081, 2082 to form a fourth receive beam output.

Figure 21:
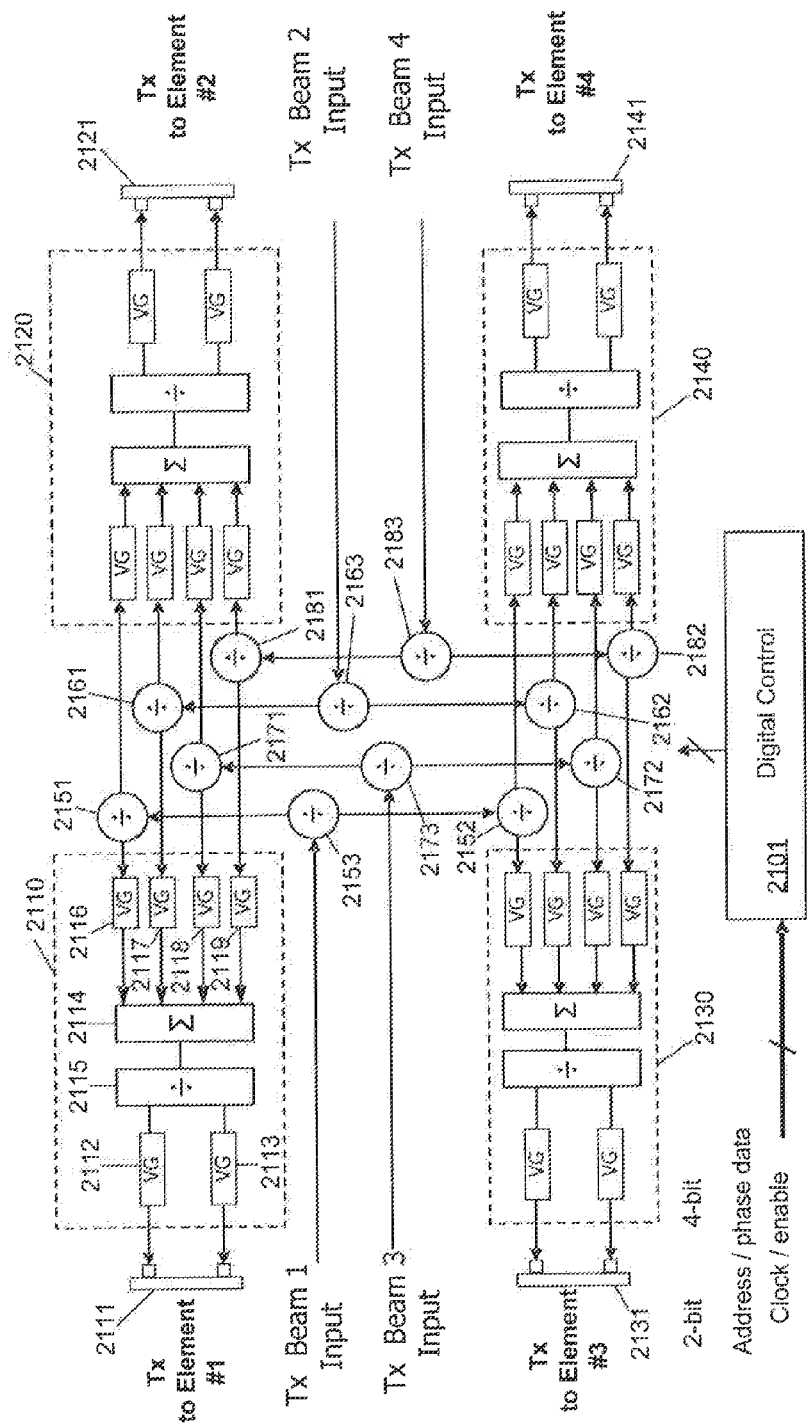
FIG. 21 illustrates an exemplary embodiment of a phased array integrated circuit configured as a 4-beam, 4-element transmitter.

In an exemplary embodiment, and with reference to FIG. 21, a phased array integrated circuit 2100 is configured as a 4-beam, 4-radiating element transmitter. The phased array IC 2100 comprises a first subcircuit 2110 in communication with a first radiating element 2111, a second subcircuit 2120 in communication with a second radiating element 2121, a third subcircuit 2130 in communication with a third radiating element 2131, and a fourth subcircuit 2140 in communication with a fourth radiating element 2141. Each subcircuit 2110, 2120, 2130, 2140 receives four input signals and transmits RF signals to the spatially orthogonal ports of the respectively coupled radiating element 2111, 2121, 2131, 2141.

In accordance with an exemplary embodiment, a first, second, third, and fourth transmit beam are provided to phased array IC 2100. In an exemplary embodiment, multiple splitters are used to divide the first, second, third, and fourth transmit beams that are communicated to each of four subcircuits 2110, 2120, 2130, 2140 as input signals.

In a more specific exemplary embodiment, an active splitter 2153 is configured to divide the first transmit beam input into two separate signals that are communicated to an active splitter 2151 and an active splitter 2152, respectively. Similarly, an active splitter 2163 is configured to divide the second transmit beam input into two separate signals that are communicated to an active splitter 2161 and an active splitter 2162, respectively. In an exemplary embodiment, an active splitter 2173 is configured to divide the third transmit beam input into two separate signals that are communicated to an active splitter 2171 and an active splitter 2172, respectively. Furthermore, an active splitter 2183 is configured to divide the fourth transmit beam input into two separate signals that are communicated to an active splitter 2181 and an active splitter 2182, respectively.

At the next stage, active splitters 2151, 2161, 2171, 2181 are configured to divide the communicated signals and communicate the divided signals to first subcircuit 2110 and second subcircuit 2120. The active splitters 2152, 2162, 2172, 2182 are configured to divide the communicated signals and communicate the divided signals to third subcircuit 2130 and fourth subcircuit 2140.

The structure and function of each subcircuit 2110, 2120, 2130, 2140 is substantially similar. Thus, only first subcircuit 2110 will be discussed in detail. In accordance with an exemplary embodiment, first subcircuit 2110 has a beam forming portion comprising four vector generators 2116, 2117, 2118, 2119. The four vector generators 2116, 2117, 2118, 2119 are configured to individually receive an input signal from active splitters 2151, 2161, 2171, 2181, respectively and adjust the phase according to beam steering commands.

An active power combiner 2114 combines the four phase-adjusted signals and generates a composite phase-adjusted intermediate signal. The composite phase-adjusted intermediate signal is communicated from active power combiner 2114 to an active power splitter 2115. The active power splitter 2115 divides the intermediate signal into two signals, with each of the two output signals passing through a polarization modifying portion of first subcircuit 2110. The polarization modifying portion comprises vector generators 2112, 2113, and is configured to polarize the output signals to the desired polarization. The polarized signals are then communicated to the spatially orthogonal ports of radiating element 2111 for transmission. In an exemplary embodiment, a digital control 2101 communicates polarization and beam steering commands to vector generators 2112, 2113, 2116, 2117, 2118, 2119, for example, via DACs.

Figure 22:
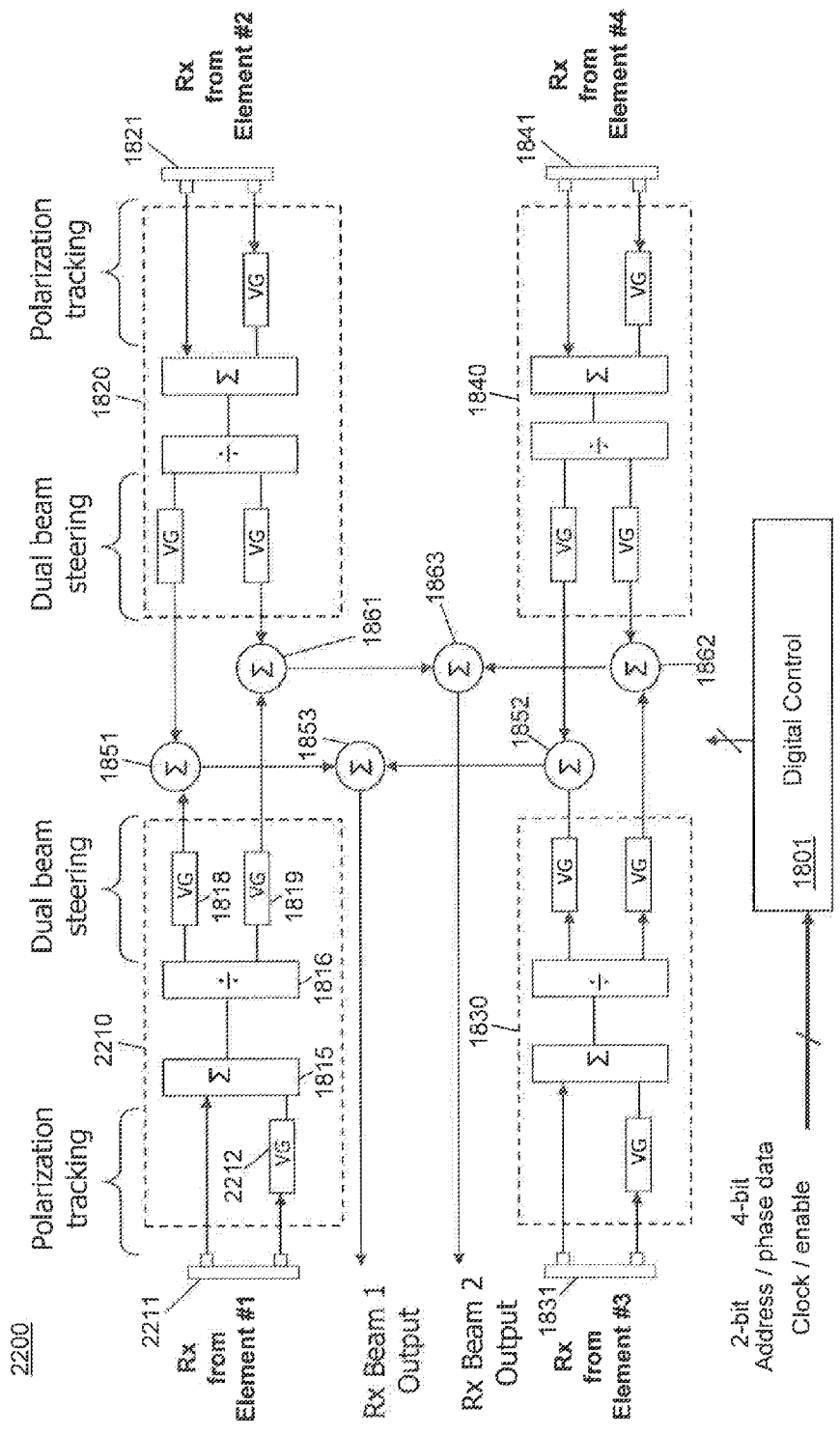
FIG. 22 illustrates another exemplary embodiment of a phased array integrated circuit configured as a 2-beam, 4-element receiver.

In addition to the various embodiments described above, other architectures are possible. For example, in an exemplary embodiment and with reference to FIG. 22, a phased array integrated circuit 2200 is configured as a 2-beam, 4-radiating element receiver for circular or elliptical polarizations. As illustrated in a first subcircuit 2210 of phased array IC 2200, the difference between phased array IC 1810 is that only one vector generator 2212 is present in the polarization forming portion. A single vector generator 2212 is sufficient for polarization tracking of circular or elliptical polarizations. In an exemplary embodiment, vector generator 2212 tracks the polarizations by providing the 90° offset (or non-90° phase offset if elliptical) to the phase of the signal appearing at the alternate spatially orthogonal port of radiating element 2211. The rest of phased array IC 2200 is similar to phased array IC 1810, and will not be described in detail though various components are similarly referenced. Similar variations are possible in the embodiments illustrated in FIGS. 19-21, with circular or elliptical polarization embodiments using only a single vector generator for polarization tracking.

Multi-Beam Operation:

In addition to the multiple radiating elements embodiments described above, various beam forming networks may be designed using multiple radiating elements and forming multiple beams. In accordance with an exemplary embodiment and with reference to FIG. 23, a multi-beam architecture 2300 comprises multiple radiating elements ($RE_1$, $RE_2$, ... $RE_N$) with each radiating element being in communication with an active polarization control ($PC_1$, $PC_2$, ... $PC_N$). The multi-beam architecture 2300 further comprises at least one beam forming network ($BFN_1$, $BFN_2$, ... $BFN_M$) and at least one phase shifter connected to the active polarization control ($PC_1$, $PC_2$, ... $PC_N$) per beam forming network ($BFN_1$, $BFN_2$, ... $BFN_M$). In an exemplary embodiment, each radiating element is in communication with M phase shifters, and each phase shifter is in communication with one of M beam forming networks so that each beam forming network receives a signal from each of the N radiating elements.

In an exemplary embodiment, the phase shifters may be active vector generators or any other component suitable to phase shift the signals. Furthermore, the beam forming networks and summing junctions can be passive or active. Moreover, a multi-beam architecture may similarly be implemented for transmission of RE signals.

Figure 23:
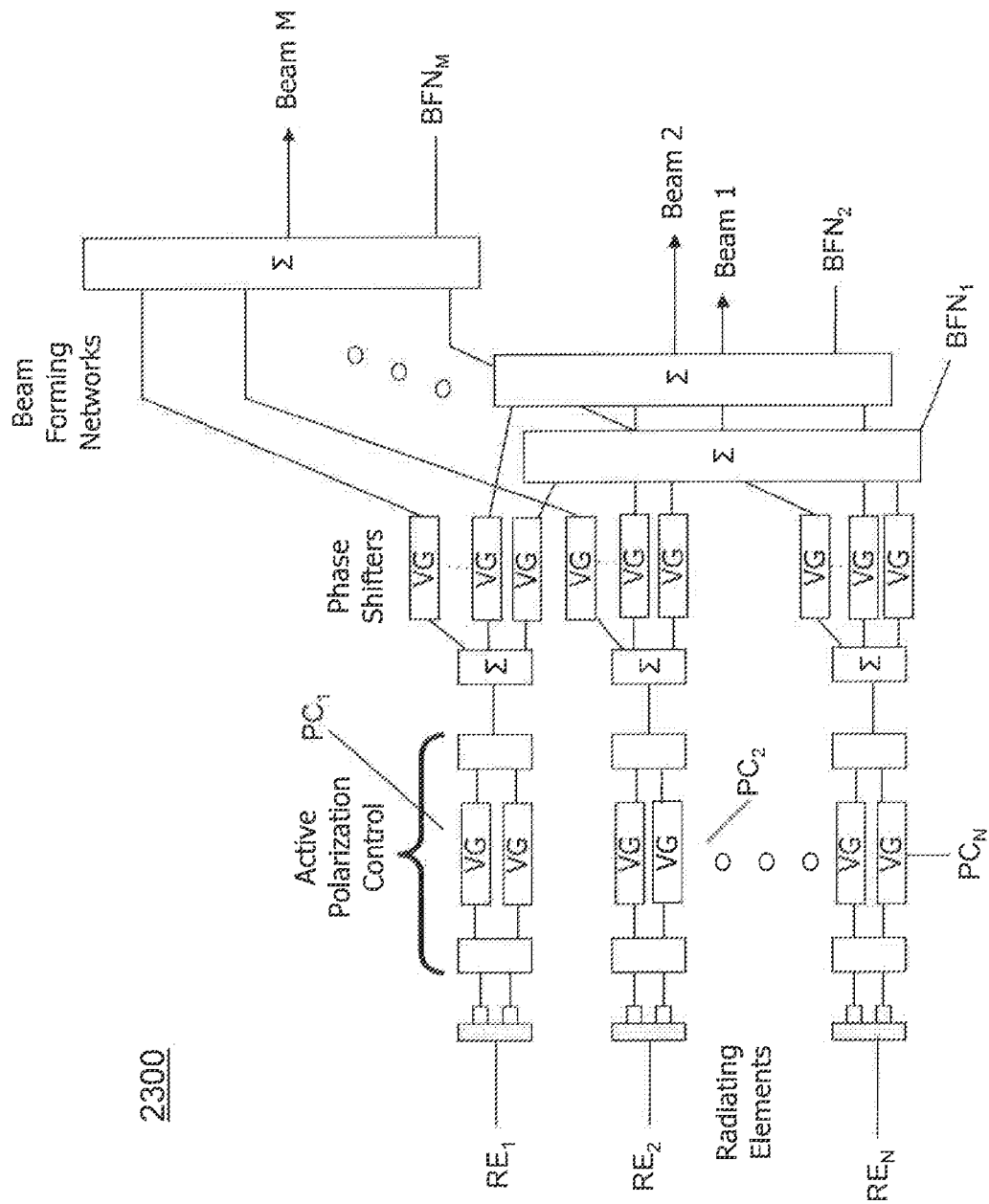
FIG. 23 illustrates an exemplary embodiment of a multi-beam architecture.

With further reference to FIG. 23, the active polarization control functions ($PC_1$, $PC_2$, ... $PC_N$) can be any of the embodiments previously listed herein. Connected to each of the active polarization control functions is a power splitter (for receive applications) or power combiner (for transmit applications). The power splitter or power combiner can be implemented as a passive or active structure as described previously herein. In communication with the power splitter/combiner is a set of vector generators where each vector generator provides a phase shift in support of a particular bean). In an exemplary embodiment, there are M vector generators at each radiating element to support M independently steerable beams. In an exemplary embodiment, the set of vector generators is in communication with a power combiner (for receive applications) or power splitter (for transmit applications) to complete the beam formation process. The power splitter or power combiner can be implemented as a passive or active structure as described previously herein.

In different various embodiments, a multi-beam multi-band architecture with a beam forming network in communication with a single radiating element is configured for forming and detecting circular polarized signals.

Figure 24:
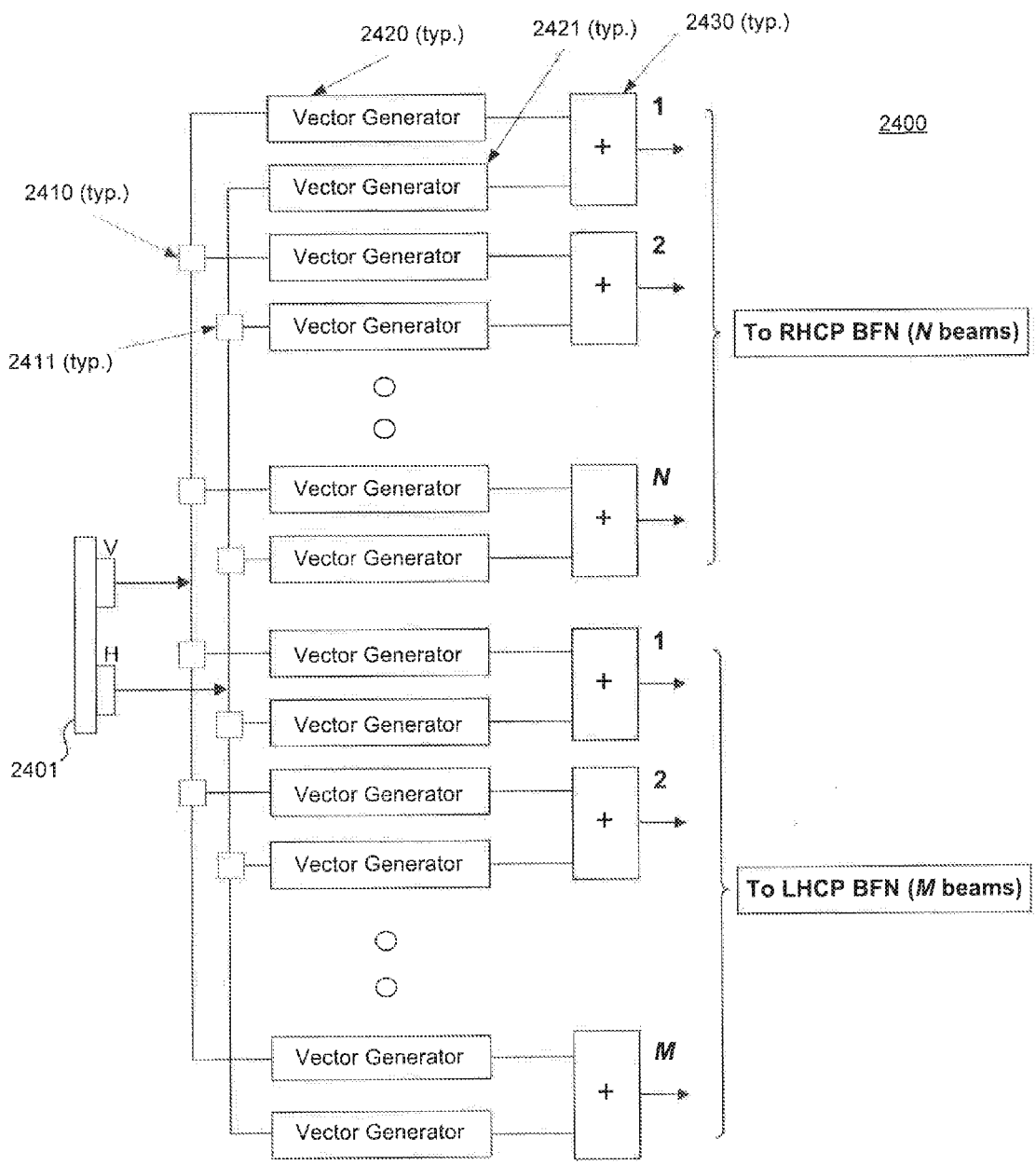
FIG. 24 illustrates an exemplary embodiment of a dual-polarization multi-beam receive architecture.

Receive Architecture:

In accordance with an exemplary embodiment and with reference to FIG. 24, dual-polarization multi-beam receive architecture 2400 comprises active power splitters, vector generators, and active power combiners in communication with a radiating element 2401 to form multiple beams. In an exemplary embodiment, receive architecture 2400 forms at least one right-hand circular polarized (RHCP) beam and forms at least one left-hand circular polarized (LHCP) beam. More specifically, in an exemplary embodiment, receive architecture 2400 forms N RHCP beams and forms M LHCP beams.

Each beam, whether right-band polarized or left-hand polarized, is formed using a similar component configuration. In an exemplary embodiment, a signal is received at radiating element 2401, having a horizontal polarization and a vertical polarization. The vertical polarized signal is communicated to a first active power splitter 2410 and the horizontal polarized signal is communicated to a second active power splitter 2411. Moreover, first active power splitter 2410 may refer to multiple active power splitters, and second active power splitter 2411 may refer to the same number of multiple active power splitters. In an exemplary embodiment, active power splitters 2410, 2411 individually divide the signal into two or more signals, such that the vertical signal polarization and horizontal signal polarization are divided into a certain number of signals.

In an exemplary embodiment, each beam is formed using a first vector generator 2420, a second vector generator 2421, and an active power combiner 2430. The first vector generator 2420 receives a vertical polarized signal from first active power splitter 2410. First vector generator 2420 is configured to adjust at least one of the phase and amplitude of the vertical polarized signal for beam steering. Furthermore, second vector generator 2421 receives a horizontal polarized signal from second active power splitter 2411. Second vector generator 2421 is configured to adjust at least one of the phase and amplitude of the horizontal polarized signal for polarization tracking. In other embodiments, the vertical polarized signal is adjusted for polarization tracking and the horizontal polarized signal is adjusted for beam steering. In accordance with an exemplary embodiment, active power combiner 2430 receives two output signals, one signal from first vector generator 2420 and another signal from second vector generator 2421. Active, power combiner 2430 combines the two signals into a beam. The beam may be RHCP or LHCP, depending on the parameters of vector generators 2420, 2421. In an exemplary embodiment, receive architecture 2400 is configured to provide complete polarization flexibility on a beam by beam basis. However, receive architecture 2400 uses 2*(M+N) vector generators to accomplish this complete flexibility.

Figure 25:
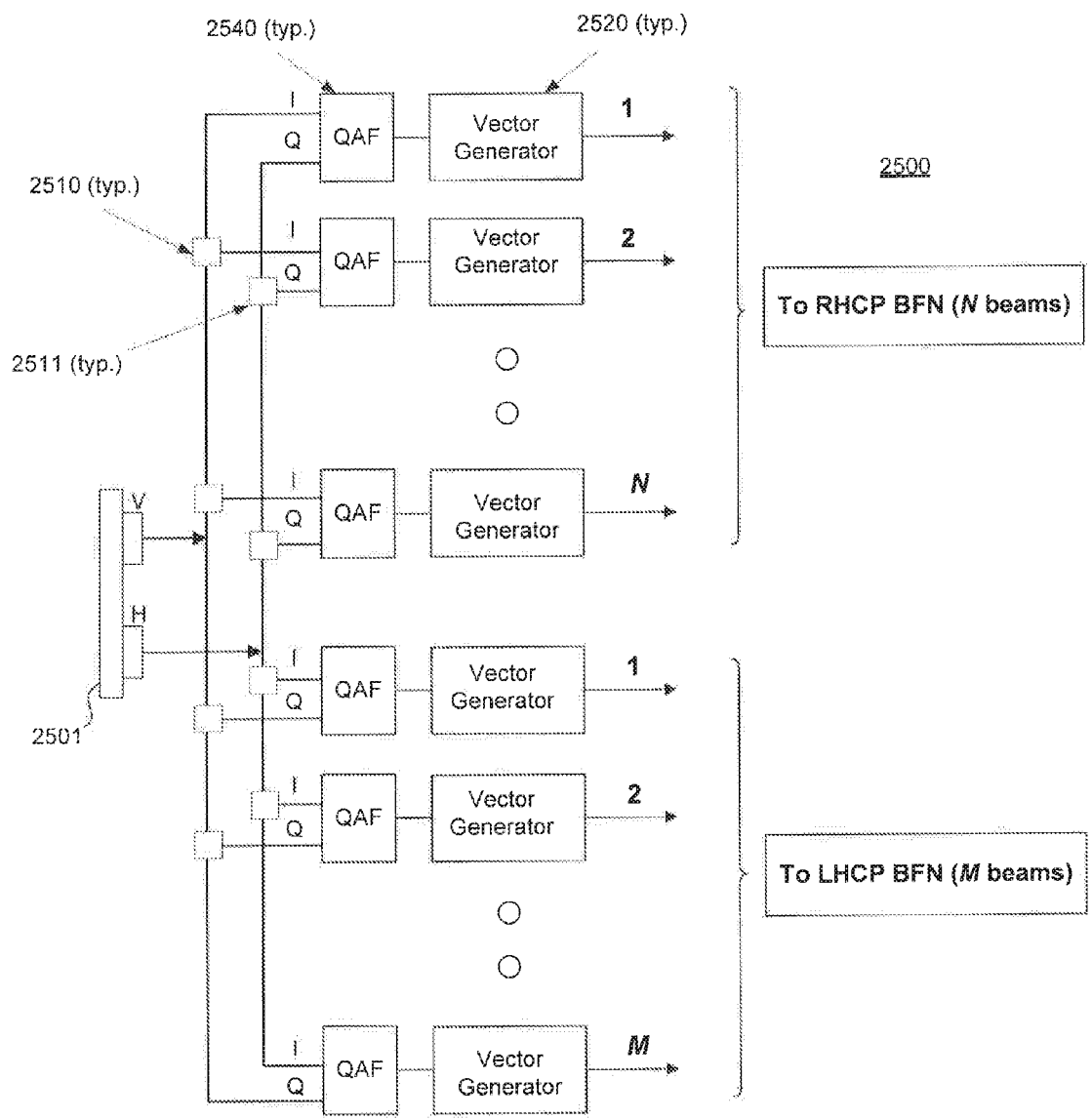
FIG. 25 illustrates another exemplary embodiment of a dual-polarization multi-beam receive architecture.

In a circular polarization embodiment, fewer components are used in comparison to a complete polarization embodiment because circular polarization only needs +/−90° polarization tracking. Therefore, in an exemplary embodiment and with reference to FIG. 25, a dual-polarization multi-beam receive architecture 2500 with circular polarization comprises active power splitters and vector generators in communication with a radiating element 2501 to form multiple beams.

In an exemplary embodiment, receive architecture 2500 forms at least one RHCP beam and forms at least one LHCP beam. As with the complete polarization embodiment, receive architecture 2500 may form up to N RHCP beams and M LHCP beams. Each beam, whether right-hand polarized or left-hand polarized, is formed using a similar component configuration. In an exemplary embodiment, a signal is received at radiating element 2501, having a horizontal polarization component and a vertical polarization component. The vertical polarized signal is communicated to a first active power splitter 2510 and the horizontal polarized signal is communicated to a second active power splitter 2511. Moreover, first active power splitter 2510 may refer to multiple active power splitters, and second active power splitter 2511 may refer to the same number of multiple active power splitters. In an exemplary embodiment, active power splitters 2510, 2511 individually divide the signal into two or more signals, such that the vertical signal polarization and horizontal signal polarization are divided into a certain number of signals.

In an exemplary embodiment, each beam is formed using a vector generator 2520 and a quadrature allpass filter (QAF) 2540. In an exemplary embodiment, QAF 2540 receives a vertical polarized signal from first active power splitter 2510 and a horizontal polarized signal from second active power splitter 2511. QAF 2540 combines the vertical and horizontal polarized signals while injecting a nominally 90° relative phase shift between the two signals. The combined output signal is communicated from QAF 2540 to vector generator 2520. Vector generator 2520 is configured to provide beam steering by adjusting at least one of the phase and amplitude of the combined signal.

The beam may be RHCP or LAM), depending on the signal input connections with QAF 2540. For example, to generate a RHCP beam, a vertical polarized signal is connected to an I vector input of QAF 2540 and a horizontal polarized signal is connected to a Q vector input of QAF 2540. In contrast, to generate a LHCP beam, a vertical polarized signal is connected to the Q vector input of QAF 540 and a horizontal polarized signal is connected to the I vector input of QAF 2540. In an exemplary embodiment, receive architecture 2500 provides circular polarization on each beam using (M+N) vector generators.

In another exemplary embodiment, a simpler component configuration of a dual-polarization multi-beam receive architecture with circular polarization is possible. Similar to receive architecture 2500, in an exemplary embodiment, a receive architecture comprises a first active power splitter, a second active power splitter and a modified vector generator in communication with a radiating element. However, in contrast to receive architecture 2500, no quadrature allpass filters are used. For each beam, and still using receive architecture 2500 as a reference, QAF 2540 is eliminated in conjunction with eliminating the QAF at the input of vector generator 2520, resulting in a modified vector generator.

The elimination of the two QAF components is a result of redundancy. In receive architecture 2500, QAF 2540 receives two input vectors, referred to as a Q vector and an I vector for convenience. With reference to similar vector generator 500, vector generator 2520 also comprises a QAF that is separate and reversed from QAF 2540, in vector generator 2520, the QAF receives a single signal and generates a Q vector and an I vector. In an exemplary embodiment, the cascade of two reversed QAFs performs a redundant function and may be eliminated. In the exemplary embodiment, the vertical and horizontal polarized signals from the radiating element are connected to the phase inversion switches of a modified vector generator. The elimination of QAFs is possible if the QAFs are originally reversed of each other. In other words, reversed back-to-back QAFs injecting opposite phase shifts counteract each other and become expendable.

Eliminating the two QAFs achieves system advantages, such as eliminating the ohmic loss associated with each QAF, which may be about 3 dB. Another advantage is that the QAF is a bandwidth limiting element of the vector generator, resulting in the modified vector generator being capable of an expanded bandwidth.

Figure 26:
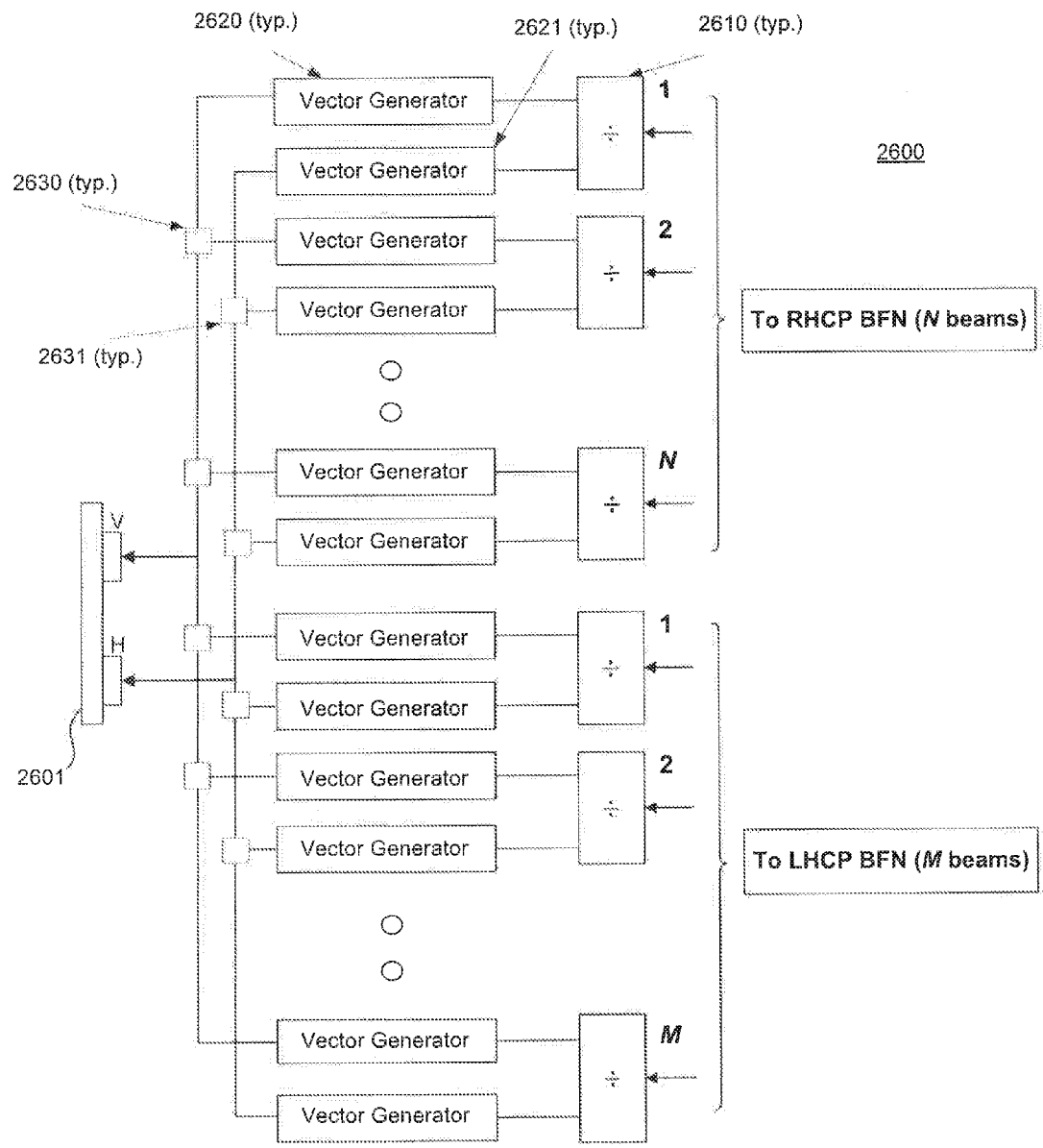
FIG. 26 illustrates an exemplary embodiment of a dual-polarization multi-beam transmit architecture.

Transmit Architecture:

In accordance with an exemplary embodiment and with reference to FIG. 26, dual-polarization multi-beam transmit architecture 2600 comprises active power splitters, vector generators, and active power combiners in communication with a radiating element 2601 to form a dual polarized transmit signal from multiple input beams. In an exemplary embodiment, transmit architecture 2600 generates a dual polarized transmit signal from at least one RHCP beam and from at least one LHCP beam. More specifically, in an exemplary embodiment, transmit architecture 2600 inputs include N RHCP beams and M LHCP beams.

Each beam, whether right-hand polarized or left-hand polarized, is added to the dual polarized output signal using a similar component configuration. In an exemplary embodiment, an active power splitter 2610 receives a beam having either right-hand or left-hand circular polarization and divides the beam into two divided signals. A first vector generator 2620 receives one of the two divided signals at the input. A second vector generator 2621 receives the other of the two divided signals at the input. First vector generator 2620 is configured to adjust at least one of the phase and amplitude of the divided signal for beam steering. Second vector generator 2621 is configured to adjust at least one of the phase and amplitude of the divided signal for polarization tracking. In other embodiments, first vector generator 2620 performs polarization tracking and second vector generator 2621 performs beam steering.

Furthermore, in an exemplary embodiment first vector generator 2620 generates a vertically polarized signal that is combined with other vertically polarized signals in a first active power combiner 2630. The combined output signal of first active power combiner 2630 is transmitted to radiating element 2601 as a vertical polarization signal. Moreover, in the exemplary embodiment second vector generator 2621 generates a horizontally polarized signal that is combined with other horizontally polarized signals in a second active power combiner 2631. The combined output signal of second active power combiner 2631 is transmitted to radiating element 2601 as a horizontal polarization signal. Active power combiner 2630 may refer to multiple active power combiners, and second active power combiner 2631 may refer to the same number of multiple active power combiners. In an exemplary embodiment, transmit architecture 2600 is configured to provide complete polarization flexibility on a beam by beam basis. However, transmit architecture 2600 uses 2*(M+N) vector generators to accomplish this complete flexibility.

In a circular polarization embodiment, fewer components are used in comparison to a complete polarization embodiment because circular polarization only needs +/−90° polarization tracking. Therefore, in an exemplary embodiment and with reference to FIG. 27, a dual-polarization multi-beam transmit architecture 2700 with circular polarization comprises vector generators and active power combiners in communication with a radiating element 2701 to form a dual polarized transmit signal from multiple input beams. In an exemplary embodiment, transmit architecture 2700 generates a dual polarized transmit signal from at least one RHCP beam and from at least one LHCP beam. As with the complete polarization embodiment, transmit architecture 2700 inputs include N RHCP beams and M LHCP beams.

Each beam, whether right-hand polarized or left-hand polarized, is added to the dual polarized output signal using a similar component configuration. In an exemplary embodiment, a vector generator 2720 receives an input beam. Vector generator 2720 is configured to adjust at least one of the phase and amplitude of the input beam. The output signal of vector generator 2720 is communicated to a QAF 2740. In an exemplary embodiment, QAF 2740 divides output signal into a vertical signal and a horizontal signal while injecting a nominally 90° relative phase shift between the two signals to generate vertical and horizontal polarizations.

Furthermore, in an exemplary embodiment QAF 2740 generates a vertically polarized signal that is combined with other vertically polarized signals in a first active power combiner 2730. The combined output signal of first active power combiner 2730 is transmitted to radiating element 2701 as a vertical polarization signal. Moreover, in the exemplary embodiment QAF 2740 also generates a horizontally polarized signal that is combined with other horizontally polarized signals in a second active power combiner 2731. The combined output signal of second active power combiner 2731 is transmitted to radiating element 2701 as a horizontal polarization signal. Active power combiner 2730 may refer to multiple active power combiners, and second active power combiner 2731 may refer to the same number of multiple active power combiners.

Figure 27:
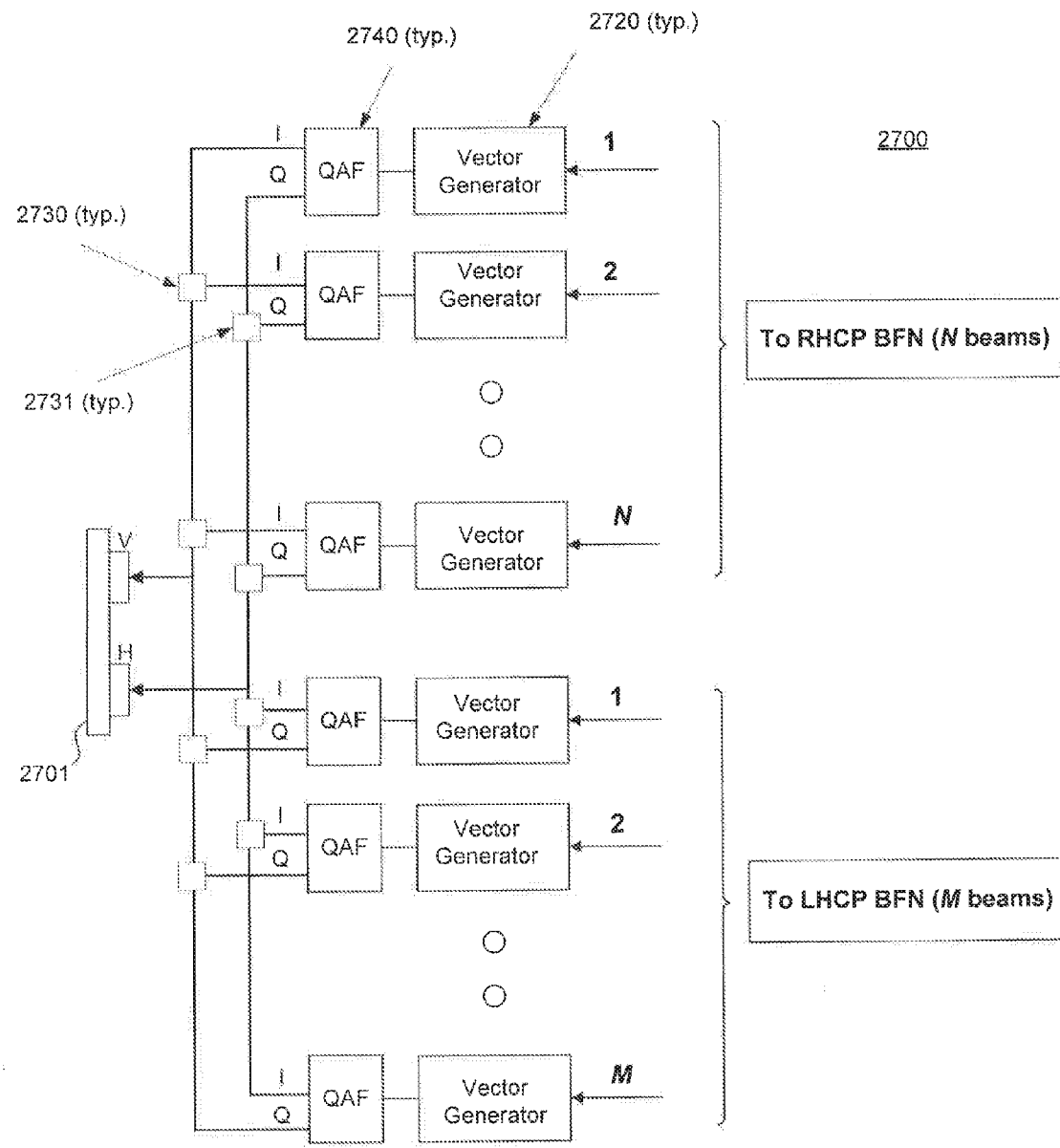
FIG. 27 illustrates another exemplary embodiment of a dual-polarization multi-beam transmit architecture.

In an exemplary embodiment, transmit architecture 2700 adjusts for the input beam having either RHCP or LHCP by alternating which output signal of QAF 2740 is communicated to each active power combiner. For example, and as illustrated in FIG. 27, for a RHCP beam, a vertical polarized signal is connected to an I vector output of QAF 2740, in contrast, for a LHCP, a vertical polarized signal is connected to a Q vector output of QAF 2740. In an exemplary embodiment, transmit architecture 2700 forms a dual polarized output signal from circular polarized input beams using (M+N) vector generators.

Although FIGS. 24-27 illustrate a one dimensional phased array, a two dimensional phased array is also contemplated and would be understood by one skilled in the art.

In an exemplary embodiment, software reconfiguration of the vector generators occurs in real-time as the system is operating, which enables a phased array antenna to have the capabilities previously described. Additionally, in the exemplary embodiment, there are no hardware changes that require physical and/or manual operations for polarization changing or system alterations, in other words, in an exemplary embodiment, the phased array antenna is fully electronically adjusted, which results in greater degrees of freedom compared to typical systems. Furthermore, the dynamic control of signal polarization of a phased array antenna has numerous applications.

In one application embodiment, dynamic control of signal polarization is implemented for secure communications by utilizing polarization hopping. Communication security can be enhanced by changing the polarization of a communications signal at a rate known to other authorized users. An unauthorized user will not know the correct polarization for any given instant and if using a constant polarization, the unauthorized user would only have the correct polarization for brief instances in time. A similar application to polarization hopping for secure communications is to use polarization hopping for signal scanning. In other words, the polarization of the antenna can be continuously adjusted to monitor for signal detection.

In an exemplary embodiment, dynamic control of signal polarization facilitates radar target identification using a single antenna. Radar target identification systems use information from multiple polarizations to provide increased target identification information. Additionally, a reflected signal's polarization and signal strength can be changed by the object off which it reflects. Thus, in an exemplary embodiment, a single antenna is configured to receive multiple polarizations and produce better identification due to acquiring more information about the target.

4 Color System:

In the field of consumer satellite RF communication, a satellite will typically transmit and/or receive data (e.g., movies and other television programming, internee data, and/or the like) to consumers who have personal satellite dishes at their home. More recently, the satellites may transmit/receive data from more mobile platforms (such as, transceivers attached to airplanes, trains, and/or automobiles). It is anticipated that increased use of handheld or portable satellite transceivers will be the norm in the future. Although sometimes described in this document in connection with home satellite transceivers, the prior art limitations now discussed may be applicable to any personal consumer terrestrial transceivers (or transmitters or receivers) that communicate with a satellite.

A propagating radio frequency (RF) signal can have different polarizations, namely linear, elliptical, or circular. Linear polarization consists of vertical polarization and horizontal polarization, whereas circular polarization consists of left-hand circular polarization (LHCP) and right-hand circular polarization (RHCP). An antenna is typically configured to pass one polarization, such as LHCP, and reject the other polarization, such as RHCP.

Also, conventional very small aperture terminal (VSAT) antennas utilize a fixed polarization that is hardware dependant. The basis polarization is generally set during installation of the satellite terminal, at which point the manual configuration of the polarizer hardware is fixed. For example, a polarizer is generally set for LHCP or RHCP and fastened into position. To change polarization in a conventional VSAT antenna might require unfastening the polarizer, rotating it 90° to the opposite circular polarization, and then refastening the polarizer. Clearly this could not be done with much frequency and only a limited number (on the order of 5 or maybe 10) of transceivers could be switched per technician in a given day.

Unlike a typical single polarization antenna, some devices are configured to change polarizations without disassembling the antenna terminal. As an example, a prior embodiment is the use of "baseball" switches to provide electronically commandable switching between polarizations. The rotation of the "baseball" switches causes a change in polarization by connecting one signal path and terminating the other signal path. However, each "baseball" switch requires a separate rotational actuator with independent control circuitry, which increases the cost of device such that this configuration is not used (if at all) in consumer broadband or VSAT terminals, but is instead used for large ground stations with a limited number of terminals.

Furthermore, another approach is to have a system with duplicate hardware for each polarization. The polarization selection is achieved by completing or enabling the path of the desired signal and deselecting the undesired signal. This approach is often used in receive-only terminals, for example satellite television receivers having low-cost hardware. However, with two way terminals that both transmit and receive such as VSAT or broadband terminals, doubling the hardware greatly increases the cost of the terminal.

Conventional satellites may communicate with the terrestrial based transceivers via radio frequency signals at a particular frequency band and a particular polarization. Each combination of a frequency band and polarization is known as a "color". The satellite will transmit to a local geographic area with signals in a "beam" and the geographic area that can access signals on that beam may be represented by "spots" on a map. Each beam/spot will have an associated "color." Thus, beams of different colors will not have the same frequency, the same polarization, or both.

In practice, there is some overlap between adjacent spots, such that at any particular point there may be two, three, or more beams that are "visible" to any one terrestrial transceiver. Adjacent spots will typically have different "colors" to reduce noise/interference from adjacent beams.

In the prior art, broadband consumer satellite transceivers are typically set to one color and left at that setting for the life of the transceiver. Should the color of the signal transmitted from the satellite be changed, all of the terrestrial transceivers that were communicating with that satellite on that color would be immediately stranded or cut off. Typically, a technician would have to visit the consumer's home and manually change out (or possibly physically disassemble and re-assemble) the transceiver or polarizer to make the consumer's terrestrial transceiver once again be able to communicate with the satellite on the new "color" signal. The practical effect of this is that in the prior art, no changes are made to the signal color transmitted from the satellite.

For similar reasons, a second practical limitation is that terrestrial transceivers are typically not changed from one color to another (i.e. if they are changed, it is a manual process). Thus, there is a need for a new low cost method and device to remotely change the frequency and/or polarization of an antenna system. There is also a need for a method and device that may be changed nearly instantaneously and often.

In spot beam communication satellite systems, both frequency and polarization diversity are utilized to reduce interference from adjacent spot beams. In an exemplary embodiment, both frequencies and polarizations are re-used in other beams that are geographically separated to maximize communications traffic capacity. The spot beam patterns are generally identified on a map using different colors to identify the combination of frequency and polarity used in that spot beam. The frequency and polarity re-use pattern is then defined by how many different combinations (or "colors") are used.

Figure 28:
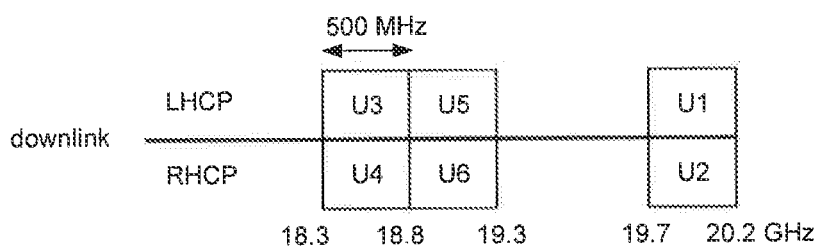
FIG. 28 illustrates an exemplary embodiment of color distribution.
Figure 28:
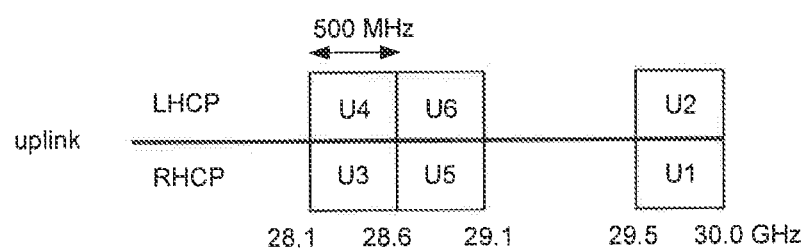
Figure 28:
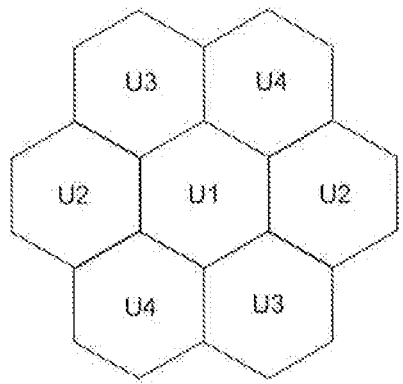
Figure 28:
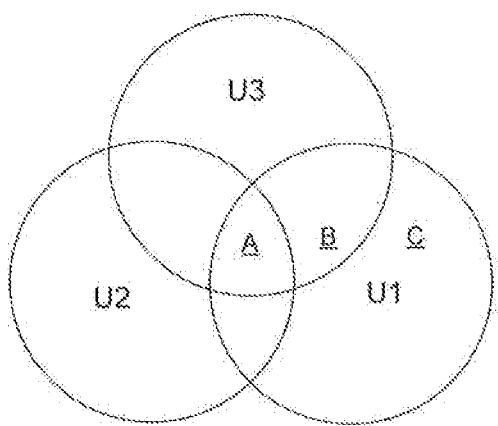

In accordance with various exemplary embodiments and with reference to FIG. 28, an antenna system is configured for frequency and polarization switching. In one specific exemplary embodiment, the frequency and polarization switching comprises switching between two frequency ranges and between two different polarizations. This may be known as four color switching. In other exemplary embodiments, the frequency and polarization switching comprises switching between three frequency ranges and between two different polarizations, for a total of six separate colors. Furthermore, in various exemplary embodiments, the frequency and polarization switching may comprise switching between two polarizations with any suitable number of frequency ranges. In another exemplary embodiment, the frequency and polarization switching may comprise switching between more than two polarizations with any suitable number of frequency ranges.

In accordance with various exemplary embodiments, the ability to perform frequency and polarization switching has many benefits in terrestrial microwave communications terminals. For example, doing so may facilitate increased bandwidth, load shifting, roaming, increased data rate/download speeds, improved overall efficiency of a group of users on the system, or improved individual data communication rates. Terrestrial microwave communications terminals, in one exemplary embodiment, comprise point to point terminals. In another exemplary embodiment, terrestrial microwave communications terminals comprise ground terminals for use in communication with any satellite, such as a satellite configured to switch frequency range and/or polarity of a RF signal broadcasted. These terrestrial microwave communications terminals are spot beam based systems.

In accordance with various exemplary embodiments, a satellite configured to communicate one or more RF signal beams each associated with a spot and/or color has many benefits in microwave communications systems. For example, similar to what was stated above for exemplary terminals in accordance with various embodiments, doing so may facilitate increased bandwidth, load shifting, roaming, increased data rate/download speeds, improved overall efficiency of a group of users on the system, or improved individual data communication rates. In accordance with another exemplary embodiment, the satellite is configured to remotely switch frequency range and/or polarity of a RF signal broadcasted by the satellite. This has many benefits in micro wave communications systems. In another exemplary embodiment, satellites are in communications with any suitable terrestrial microwave communications terminal, such as a terminal having the ability to perform frequency and/or polarization switching.

Prior art spot beam based systems use frequency and polarization diversity to reduce or eliminate interference from adjacent spot beams. This allows frequency reuse in non-adjacent beams resulting in increased satellite capacity and throughput. Unfortunately, in the prior art, in order to have such diversity, installers of such systems must be able to set the correct polarity at installation or carry different polarity versions of the terminal. For example, at an installation site, an installer might carry a first terminal configured for left hand polarization and a second terminal configured for right hand polarization and use the first terminal in one geographic area and the second terminal in another geographic area. Alternatively, the installer might be able to disassemble and reassemble a terminal to switch it from one polarization to another polarization. This might be done, for example, by removing the polarizer, rotating it 90°, and reinstalling the polarizer in this new orientation. These prior art solutions are cumbersome in that it is not desirable to have to carry a variety of components at the installation site. Also, the manual disassembly/reassembly steps introduce the possibility of human error and/or defects.

These prior art solutions, moreover, for all practical purposes, permanently set the frequency range and polarization for a particular terminal. This is so because any change to the frequency range and polarization will involve the time and expense of a service call. An installer would have to visit the physical location and change the polarization either by using the disassembly/re-assembly technique or by just switching out the entire terminal. In the consumer broadband satellite terminal market, the cost of the service call can exceed the cost of the equipment and in general manually changing polarity in such terminals is economically unfeasible.

In accordance with various exemplary embodiments, a low cost system and method for electronically or electro-mechanically switching frequency ranges and/or polarity is provided. In an exemplary embodiment, the frequency range and/or polarization of a terminal can be changed without a human touching the terminal. Stated another way, the frequency range and/or polarization of a terminal can be changed without a service call. In an exemplary embodiment, the system is configured to remotely cause the frequency range and/or polarity of the terminal to change.

In one exemplary embodiment, the system and method facilitate installing a single type of terminal that is capable of being electronically set to a desired frequency range from among two or more frequency ranges. Some exemplary frequency ranges include receiving 10.7 GHz to 12.75 GHz, transmitting 13.75 GHz to 14.5 GHz, receiving 18.3 GHz to 20.2 GHz, and transmitting 28.1 GHz to 30.0 GHz. Furthermore, other desired frequency ranges of a point-to-point system fall within 15 GHz to 38 GHz. In another exemplary embodiment, the system and method facilitate installing a single type of terminal that is capable of being electronically set to a desired polarity from among two or more polarities. The polarities may comprise, for example, left hand circular, right hand circular, vertical linear, horizontal linear, or any other orthogonal polarization. Moreover, in various exemplary embodiments, a single type of terminal may be installed that is capable of electronically selecting both the frequency range and the polarity of the terminal from among choices of frequency range and polarity, respectively.

In an exemplary embodiment, transmit and receive signals are paired so that a common switching mechanism switches both signals simultaneously. For example, one "color" may be a receive signal in the frequency range of 19.7 GHz to 20.2 GHz using RHCP, and a transmit signal in the frequency range of 29.5 GHz to 30.0 GHz using LHCP. Another "color" may use the same frequency ranges but transmit using RHCP and receive using LHCP. Accordingly, in an exemplary embodiment, transmit and receive signals are operated at opposite polarizations. However, in some exemplary embodiments, transmit and receive signals are operated on the same polarization which increases the signal isolation requirements for self-interference free operation.

Thus, a single terminal type may be installed that can be configured in a first manner for a first geographical area and in a second manner for a second geographical area that is different from the first area, where the first geographical area uses a first color and the second geographical area uses a second color different from the first color.

In accordance with an exemplary embodiment, a terminal, such as a terrestrial microwave communications terminal, may be configured to facilitate load balancing, in accordance with another exemplary embodiment, a satellite may be configured to facilitate load balancing. Load balancing involves moving some of the load on a particular satellite, or point-to-point system, from one polarity/frequency range "color" or "beam" to another. In an exemplary embodiment, the load balancing is enabled by the ability to remotely switch frequency range and/or polarity of either the terminal or the satellite.

Thus, in exemplary embodiments, a method of load balancing comprises the steps of remotely switching frequency range and/or polarity of one or more terrestrial microwave communications terminals. For example, system operators or load monitoring computers may determine that dynamic changes in system bandwidth resources has created a situation where it would be advantageous to move certain users to adjacent beams that may be less congested. In one example, those users may be moved back at a later time as the loading changes again. In an exemplary embodiment, this signal switching (and therefore this satellite capacity "load balancing") can be performed periodically. In other exemplary embodiments, load balancing can be performed on many terminals (e.g., hundreds or thousands of terminals) simultaneously or substantially simultaneously. In other exemplary embodiments, load balancing can be performed on many terminals without the need for thousands of user terminals to be manually reconfigured.

In one exemplary embodiment, dynamic control of signal polarization is implemented for secure communications by utilizing polarization hopping. Communication security can be enhanced by changing the polarization of a communications signal at a rate known to other authorized users. An unauthorized user will not know the correct polarization for any given instant and if using a constant polarization, the unauthorized user would only have the correct polarization for brief instances in time. A similar application to polarization hopping for secure communications is to use polarization hopping for signal scanning. In other words, the polarization of the antenna can be continuously adjusted to monitor for signal detection.

In an exemplary embodiment, the load balancing is performed as frequently as necessary based on system loading. For example, load balancing could be done on a seasonal basis. For example, loads may change significantly when schools, colleges, and the like start and end their sessions. As another example, vacation seasons may give rise to significant load variations. For example, a particular geographic area may have a very high load of data traffic. This may be due to a higher than average population density in that area, a higher than average number of transceivers in that area, or a higher than average usage of data transmission in that area. In another example, load balancing is performed on an hourly basis. Furthermore, load balancing could be performed at any suitable time, in one example, if maximum usage is between 6-7 PM then some of the users in the heaviest loaded beam areas could be switched to adjacent beams in a different time zone. In another example, if a geographic area comprises both office and home terminals, and the office terminals experience heaviest loads at different times than the home terminals, the load balancing may be performed between home and office terminals. In yet another embodiment, a particular area may have increased localized signal transmission traffic, such as related to high traffic within businesses, scientific research activities, graphic/video intensive entertainment data transmissions, a sporting event or a convention. Stated another way, in an exemplary embodiment, load balancing may be performed by switching the color of any subgroup(s) of a group of transceivers.

In an exemplary embodiment, the consumer broadband terrestrial terminal is configured to determine, based on pre-programmed instructions, what colors are available and switch to another color of operation. For example, the terrestrial terminal may have visibility to two or more beams (each of a different color). The terrestrial terminal may determine which of the two or more beams is better to connect to. This determination may be made based on any suitable factor. In one exemplary embodiment, the determination of which color to use is based on the data rate, the download speed, and/or the capacity on the beam associated with that color. In other exemplary embodiments, the determination is made randomly, or in any other suitable way.

This technique is useful in a geographically stationary embodiment because loads change over both short and long periods of time for a variety of reasons and such self adjusting of color selection facilitates load balancing. This technique is also useful in mobile satellite communication as a form of "roaming". For example, in one exemplary embodiment, the broadband terrestrial terminal is configured to switch to another color of operation based on signal strength. This is, in contrast to traditional cell phone type roaming, where that roaming determination is based on signal strength. In contrast, here, the color distribution is based on capacity in the channel. Thus, in an exemplary embodiment, the determination of which color to use may be made to optimize communication speed as the terminal moves from one spot to another. Alternatively, in an exemplary embodiment, a color signal broadcast by the satellite may change or the spot beam may be moved and still, the broadband terrestrial terminal may be configured to automatically adjust to communicate on a different color (based, for example, on channel capacity).

Figure 29A:
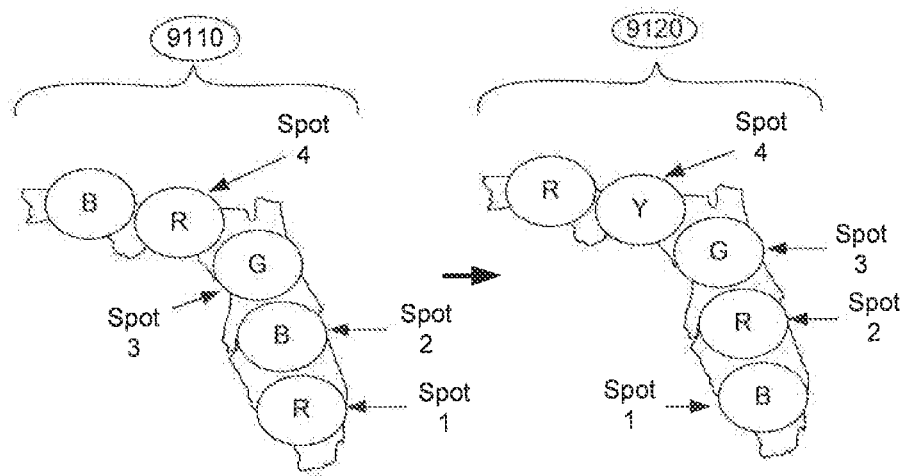
FIGS. 29A-29C illustrate various satellite spot beam multicolor agility methods in accordance with exemplary embodiments.

In accordance with another exemplary embodiment, a satellite is configured to communicate one or more RF signal beams each associated with a spot and/or color. In accordance with another exemplary embodiment, the satellite is configured to remotely switch frequency range and/or polarity of a RF signal broadcasted by the satellite. In another exemplary embodiment, a satellite may be configured to broadcast additional colors. For example, an area and/or a satellite might only have 4 colors at a first time, but two additional colors, (making 6 total colors) might be dynamically added at a second time. In this event, it may be desirable to change the color of a particular spot to one of the new colors. With reference to FIG. 29A, spot 4 changes from "red" to then new color "yellow". In one exemplary embodiment, the ability to add colors may be a function of the system's ability to operate, both transmit and/or receive over a wide bandwidth within one device and to tune the frequency of that device over that wide bandwidth.

In accordance with an exemplary embodiment, and with renewed reference to FIG. 28, a satellite may have a downlink, an uplink, and a coverage area. The coverage area may be comprised of smaller regions each corresponding to a spot beam to illuminate the respective region. Spot beams may be adjacent to one another and have overlapping regions. A satellite communications system has many parameters to work: (1) number of orthogonal time or frequency slots (defined as color patterns hereafter); (2) beam spacing (characterized by the beam roll-off at the cross-over point); (3) frequency reuse patterns (the re-use patterns can be regular in structures, where a uniformly distributed capacity is required); and (4) numbers of beams (a satellite with more beams will provide more system flexibility and better bandwidth efficiency). Polarization may be used as a quantity to define a re-use pattern in addition to time or frequency slots. In one exemplary embodiment, the spot beams may comprise a first spot beam and a second spot beam. The first spot beam may illuminate a first region within a geographic area, in order to send information to a first plurality of subscriber terminals. The second spot beam may illuminate a second region within the geographic area and adjacent to the first region, in order to send information to a second plurality of subscriber terminals. The first and second regions may overlap.

The first spot beam may have a first characteristic polarization. The second spot beam may have a second characteristic polarization that is orthogonal to the first polarization. The polarization orthogonality serves to provide an isolation quantity between adjacent beams. Polarization may be combined with frequency slots to achieve a higher degree of isolation between adjacent beams and their respective coverage areas. The subscriber terminals in the first beam may have a polarization that matches the first characteristic polarization. The subscriber terminals in the second beam may have a polarization that matches the second characteristic polarization.

The subscriber terminals in the overlap region of the adjacent beams may be optionally assigned to the first beam or to the second beam. This optional assignment is a flexibility within the satellite system and may be altered through reassignment following the start of service for any subscriber terminals within the overlapping region. The ability to remotely change the polarization of a subscriber terminal in an overlapping region illuminated by adjacent spot beams is an important improvement in the operation and optimization of the use of the satellite resources for changing subscriber distributions and quantities. For example it may be an efficient use of satellite resources and improvement to the individual subscriber service to reassign a user or a group of users from a first beam to a second beam or from a second beam to a first beam. Satellite systems using polarization as a quantity to provide isolation between adjacent beams may thus be configured to change the polarization remotely by sending a signal containing a command to switch or change the polarization from a first polarization state to a second orthogonal polarization state. The intentional changing of the polarization may facilitate reassignment to an adjacent beam in a spot beam satellite system using polarization for increasing a beam isolation quantity.

The down link may comprise multiple "colors" based on combinations of selected frequency and/or polarizations. Although other frequencies and frequency ranges may be used, and other polarizations as well, an example is provided of one multicolor embodiment. For example, and with renewed reference to FIG. 28, in the downlink, colors U1, U3, and U5 are Left-Hand Circular Polarized ("LHCP") and colors U2, U4, and U6 are Right-Hand Circular Polarized ("RHCP"). In the frequency domain, colors U3 and U4 are from 18.3-18.8 GHz; U5 and U6 are from 18.8-19.3 GHz; and U1 and U2 are from 197-20.2 GHz. It will be noted that in this exemplary embodiment, each color represents a 500 MHz frequency range. Other frequency ranges may be used in other exemplary embodiments. Thus, selecting one of LHCP or RHCP and designating a frequency band from among the options available will specify a color. Similarly, the uplink comprises frequency/polarization combinations that can be each designated as a color. Often, the LHCP and RHCP are reversed as illustrated, providing increased signal isolation, but this is not necessary. In the uplink, colors U1, U3, and U5 are RHCP and colors U2, U4, and U6 are LHCP. In the frequency domain, colors U3 and U4 are from 28.1-28.6 GHz; U5 and U6 are from 28.6-29.1 GHz; and U1 and U2 are from 29.5-30.0 GHz. It will be noted that in this exemplary embodiment, each color similarly represents a 500 MHz frequency range.

In an exemplary embodiment, the satellite may broadcast one or more RF signal beam (spot beam) associated with a spot and a color. This satellite is further configured to change the color of the spot from a first color to a second, different, color. Thus, with renewed reference to FIG. 29A, spot 1 is changed from "red" to "blue".

When the color of one spot is changed, it may be desirable to change the colors of adjacent spots as well. Again with reference to FIG. 29A, the map shows a group of spot colors at a first point in time, where this group at this time is designated 9110, and a copy of the map shows a group of spot colors at a second point in time, designated 9120. Some or all of the colors may change between the first point in time and the second point in time. For example spot 1 changes from red to blue and spot 2 changes from blue to red. Spot 3, however, stays the same. In this manner, in an exemplary embodiment, adjacent spots are not identical colors.

Some of the spot beams are of one color and others are of a different color. For signal separation, the spot beams of similar color are typically not located adjacent to each other. In an exemplary embodiment, and with reference again to FIG. 28, the distribution pattern illustrated provides one exemplary layout pattern for four color spot beam frequency re-use. It should be recognized that with this pattern, color U1 will not be next to another color U1, etc. It should be noted, however, that typically the spot beams will over lap and that the spot beams may be better represented with circular areas of coverage. Furthermore, it should be appreciated that the strength of the signal may decrease with distance from the center of the circle, so that the circle is only an approximation of the coverage of the particular spot beam. The circular areas of coverage may be overlaid on a map to determine what spot beam(s) are available in a particular area.

In accordance with an exemplary embodiment, the satellite is configured to shift one or more spots from a first geographic location to a second geographic location. This may be described as shifting the center of the spot from a first location to a second location. This might also be described as changing the effective size (e.g. diameter) of the spot. In accordance with an exemplary embodiment, the satellite is configured to shift the center of the spot from a first location to a second location and/or change the effective size of one or more spots. In the prior art, it would be unthinkable to shift a spot because such an action would strand terrestrial transceivers. The terrestrial transceivers would be stranded because the shifting of one or more spots would leave some terrestrial terminals unable to communicate with a new spot of a different color.

However, in an exemplary embodiment, the transceivers are configured to easily switch colors. Thus, in an exemplary method, the geographic location of one or more spots is shifted and the color of the terrestrial transceivers may be adjusted as needed.

Figures 29B, 29C:
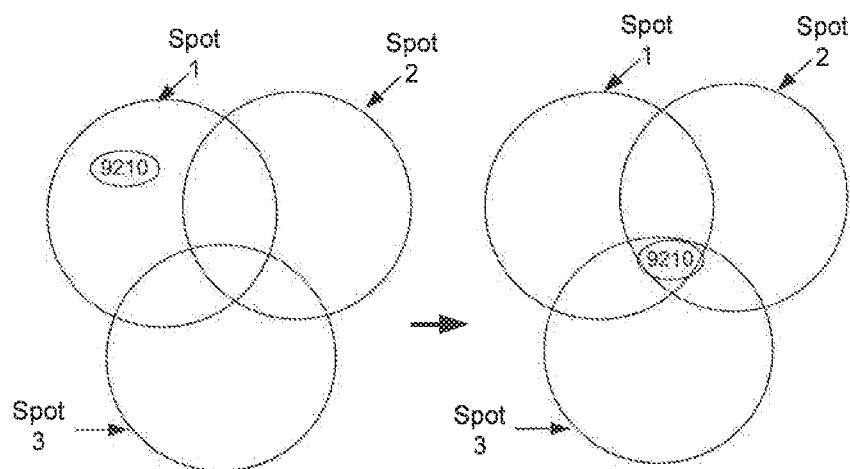

In an exemplary embodiment, the spots are shifted such that a high load geographic region is covered by two or more overlapping spots. For example, with reference to FIGS. 29B and 29C, a particular geographic area 9210 may have a very high load of data traffic. In this exemplary embodiment, area 9210 is only served by spot 1 at a first point in time illustrated by FIG. 29B. At a second point in time illustrated by FIG. 29C, the spots have been shifted such that area 9210 is now served or covered by spots 1, 2, and 3. In this embodiment, terrestrial transceivers in area 9210 may be adjusted such that some of the transceivers are served by spot 1, others by spot 2, and yet others by spot 3. In other words, transceivers in area 9210 may be selectively assigned one of three colors. In this manner, the load in this area can be shared or load-balanced.

In an exemplary embodiment, the switching of the satellites and/or terminals may occur with any regularity. For example, the polarization may be switched during the evening hours, and then switched back during business hours to reflect transmission load variations that occur over time. In an exemplary embodiment, the polarization may be switched thousands of times during the life of elements in the system.

In one exemplary embodiment, the color of the terminal is not determined or assigned until installation of the terrestrial transceiver. This is in contrast to units shipped from the factory set as one particular color. The ability to ship a terrestrial transceiver without concern for its "color" facilitates simpler inventory processes, as only one unit (as opposed to two or four or more) need be stored, in an exemplary embodiment, the terminal is installed, and then the color is set in an automated manner (i.e. the technician can't make a human error) either manually or electronically. In another exemplary embodiment, the color is set remotely such as being assigned by a remote central control center, in another exemplary embodiment, the unit itself determines the best color and operates at that color.

As can be noted, the determination of what color to use for a particular terminal may be based on any number of factors. The color may based on what signal is strongest, based on relative bandwidth available between available colors, randomly assigned among available colors, based on geographic considerations, based on temporal considerations (such as weather, bandwidth usage, events, work patterns, days of the week, sporting events, and/or the like), and or the like. Previously, a terrestrial consumer broadband terminal was not capable of determining what color to use based on conditions at the moment of install or quickly, remotely varied during use.

In accordance with an exemplary embodiment, the system is configured to facilitate remote addressability of subscriber terminals. In one exemplary embodiment, the system is configured to remotely address a specific terminal. The system may be configured to address each subscriber terminal. In another exemplary embodiment, a group of subscriber terminals may be addressable. This may occur using any number of methods now known, or hereafter invented, to communicate instructions with a specific transceiver and/or group of subscriber terminals. Thus, a remote signal may command a terminal or group of terminals to switch from one color to another color. The terminals may be addressable in any suitable manner. In one exemplary embodiment, an IP address is associated with each terminal. In an exemplary embodiment, the terminals may be addressable through the modems or set top boxes (e.g. via the internet). Thus, in accordance with an exemplary embodiment, the system is configured for remotely changing a characteristic polarization of a subscriber terminal by sending a command addressed to a particular terminal. This may facilitate load balancing and the like. The sub-group could be a geographic sub group within a larger geographic area, or any other group formed on any suitable basis.

In this manner, an individual unit may be controlled on a one to one basis. Similarly, all of the units in a sub-group may be commanded to change colors at the same time. In one embodiment, a group is broken into small sub-groups (e.g., 100 sub groups each comprising 1% of the terminals in the larger grouping). Other sub-groups might comprise 5%, 10%, 20%, 35%, 50% of the terminals, and the like. The granularity of the subgroups may facilitate more fine tuning in the load balancing.

Thus, an individual with a four color switchable transceiver that is located at location A on the map (see FIG. 28, Practical Distribution illustration), would have available to them colors U1, U2, and U3. The transceiver could be switched to operate on one of those three colors as best suits the needs at the time. Likewise, location B on the map would have colors U1 and U3 available. Lastly, location C on the map would have color U1 available. In many practical circumstances, a transceiver will have two or three color options available in a particular area.

It should be noted that colors U5 and U6 might also be used and further increase the options of colors to use in a spot beam pattern. This may also further increase the options available to a particular transceiver in a particular location. Although described as a four or six color embodiment, any suitable number of colors may be used for color switching as described herein. Also, although described herein as a satellite, it is intended that the description is valid for other similar remote communication systems that are configured to communicate with the transceiver.

The frequency range/polarization of the terminal may be selected at least one of remotely, locally, manually, or some combination thereof. In one exemplary embodiment, the terminal is configured to be remotely controlled to switch from one frequency range/polarization to another. For example, the terminal may receive a signal from a central system that controls switching the frequency range/polarization. The central system may determine that load changes have significantly slowed down the left hand polarized channel, but that the right hand polarized channel has available bandwidth. The central system could then remotely switch the polarization of a number of terminals. This would improve channel availability for switched and non-switched users alike. Moreover, the units to switch may be selected based on geography, weather, use characteristics, individual bandwidth requirements, and/or other considerations. Furthermore, the switching of frequency range/polarization could be in response to the customer calling the company about poor transmission quality.

It should be noted that although described herein in the context of switching both frequency range and polarization, benefits and advantages similar to those discussed herein may be realized when switching just one of frequency or polarization.

The frequency range switching described herein may be performed in any number of ways. In an exemplary embodiment, the frequency range switching is performed electronically. For example, the frequency range switching may be implemented by adjusting phase shifters in a phased array, switching between fixed frequency oscillators or converters, and/or using a tunable dual conversion transmitter comprising a tunable oscillator signal. Additional aspects of frequency switching for use with the present invention are disclosed in U.S. application Ser. No. 12/614,293 entitled "DUAL CONVERSION TRANSMITTER WITH SINGLE LOCAL OSCILLATOR" which was filed on Nov. 6, 2009; the contents of which are hereby incorporated by reference in their entirety.

In accordance with another exemplary embodiment, the polarization switching described herein may be performed in any number of ways. In an exemplary embodiment, the polarization switching is performed electronically by adjusting the relative phase of signals at orthogonal antenna ports. In another exemplary embodiment, the polarization switching is performed mechanically. For example, the polarization switching may be implemented by use of a trumpet switch. The trumpet switch may be actuated electronically. For example, the trumpet switch may be actuated by electronic magnet, servo, an inductor, a solenoid, a spring, a motor, an electro-mechanical device, or any combination thereof. Moreover, the switching mechanism can be any mechanism configured to move and maintain the position of trumpet switch. Furthermore, in an exemplary embodiment, trumpet switch is held in position by a latching mechanism. The latching mechanism, for example, may be fixed magnets. The latching mechanism keeps trumpet switch in place until the antenna is switched to another polarization.

As described herein, the terminal may be configured to receive a signal causing switching and the signal may be from a remote source. For example, the remote source may be a central office. In another example, an installer or customer can switch the polarization using a local computer connected to the terminal which sends commands to the switch. In another embodiment, an installer or customer can switch the polarization using the television set-top box which in turn sends signals to the switch. The polarization switching may occur during installation, as a means to increase performance, or as another option for troubleshooting poor performance.

In other exemplary embodiments, manual methods may be used to change a terminal from one polarization to another. This can be accomplished by physically moving a switch within the housing of the system or by extending the switch outside the housing to make it easier to manually switch the polarization. This could be done by either an installer or customer.

Some exemplary embodiments of the above mentioned multi-color embodiments may benefits over the prior art. For instance, in an exemplary embodiment, a low cost consumer broadband terrestrial terminal antenna system may include an antenna, a transceiver in signal communication with the antenna, and a polarity switch configured to cause the antenna system to switch between a first polarity and a second polarity. In this exemplary embodiment, the antenna system may be configured to operate at the first polarity and/or the second polarity.

In an exemplary embodiment, a method of system resource load balancing is disclosed. In this exemplary embodiment, the method may include the steps of: (1) determining that load on a first spotbeam is higher than a desired level and that load on a second spotbeam is low enough to accommodate additional load; (2) identifying, as available for switching, consumer broadband terrestrial terminals on the first spot beam that are in view of the second spotbeam; (3) sending a remote command to the available for switching terminals; and (4) switching color in said terminals from the first beam to the second beam based on the remote command. In this exemplary embodiment, the first and second spot beams are each a different color.

In an exemplary embodiment, a satellite communication system is disclosed. In this exemplary embodiment, the satellite communication system may include: a satellite configured to broadcast multiple spotbeams; a plurality of user terminal antenna systems in various geographic locations; and a remote system controller configured to command at least some of the subset of the plurality of user terminal antenna systems to switch at least one of a polarity and a frequency to switch from the first spot beam to the second spotbeam. In this exemplary embodiment, the multiple spot beams may include at least a first spotbeam of a first color and a second spotbeam of a second color. In this exemplary embodiment, at least a subset of the plurality of user terminal antenna systems may be located within view of both the first and second spotbeams.

The following applications are related to this subject matter: U.S. application Ser. No. 12/759,123, entitled "ACTIVE BUTLER AND BLASS MATRICES,"; U.S. application Ser. No. 12/759,043, entitled "ACTIVE HYBRIDS FOR ANTENNA SYSTEMS,"; U.S. application Ser. No. 12/759,064, entitled "ACTIVE FEED FORWARD AMPLIFIER,"; U.S. application Ser. No. 12/759,130, entitled "ACTIVE PHASED ARRAY ARCHITECTURE,"; U.S. application Ser. No. 12/758,996, entitled "PRESELECTOR AMPLIFIER,"; U.S. application Ser. No. 12/759,148, entitled "ACTIVE POWER SPLITTER,"; U.S. application Ser. No. 12/759,112, entitled "HALF-DUPLEX PHASED ARRAY ANTENNA SYSTEM,"; U.S. application Ser. No. 12/759,113, entitled "DIGITAL AMPLITUDE CONTROL OF ACTIVE VECTOR GENERATOR,"; the contents of which are hereby incorporated by reference for any purpose in their entirety.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

The invention claimed is:

1. An active antenna polarizer configured to transmit an RF signal to a radiating element, the active antenna polarizer comprising:
   a splitter configured to receive an RF input signal, and wherein the splitter divides the RF input signal into a first RF intermediate signal and a second RE intermediate signal;
   a first vector generator configured to receive, from the splitter, and adjust the phase of the first RF intermediate signal; and
   a second vector generator in parallel with the first vector generator, wherein the second vector generator is configured to receive, from the splitter, and adjust the phase of the second RF intermediate signal;

wherein the first vector generator and the second vector generator individually comprise a first quadrant select in parallel with a second quadrant select and a first variable gain amplifier in parallel with a second variable gain amplifier.

2. The active antenna polarizer of claim 1, wherein the active antenna polarizer is configured to transmit an RF output signal with linear polarization from the first vector generator to the radiating element.

3. The active antenna polarizer of claim 1, wherein the active antenna polarizer is configured to transmit a differentially fed RF output signal with linear polarization from the first vector generator to the radiating element.

4. The active antenna polarizer of claim 1, wherein the active antenna polarizer is configured to transmit an RF output signal with dual linear polarization from the first and second vector generators to the radiating element.

5. The active antenna polarizer of claim 1, wherein the active antenna polarizer is configured to transmit a differentially fed RF output signal with at least one of dual linear polarization, circular polarization, and elliptical polarization from the first and second vector generators to the radiating element.

6. An active antenna polarizer configured to receive an RF signal from a radiating element, the active antenna polarizer comprising:
  a first vector generator in parallel with a second vector generator, wherein at least one of the first vector generator and the second vector generator is configured to receive at least one RF input signal from the radiating element;
  wherein the at least one of the first vector generator and the second vector generator is configured to adjust the phase of the at least one RF input signal and generate at least one intermediate RF signal, wherein the first vector generator and the second vector generator individually comprise a first quadrant select in parallel with a second quadrant select and a first variable gain amplifier in parallel with a second variable gain amplifier; and
  a combiner configured to receive and combine the at least one intermediate RF signal from the at least one of the first vector generator and the second vector generator, and wherein the combiner generates an RF output signal.

7. The active antenna polarizer of claim 6, wherein the at least one RF input signal received from the radiating element is an RF input signal with linear polarization received at the first vector generator.

8. The active antenna polarizer of claim 6, wherein the at least one RF input signal received from the radiating element is a differentially fed RF input signal with linear polarization received at the first vector generator.

9. The active antenna polarizer of claim 6, wherein the at least one RF input signal received from the radiating element is an RF input signal with dual linear polarization received at the first and second vector generators.

10. The active antenna polarizer of claim 6, wherein the at least one RF input signal received from the radiating element is a differentially fed RF input signal with at least one of dual linear polarization, circular polarization, and elliptical polarization received at the first and second vector generators.

11. A multiple radiating element transmitter circuit comprising:
  at least two subcircuits individually in communication with at least two radiating elements;
  a network of splitters configured to divide at least one input beam and communicate the divided input beam to the at least two subcircuits; and
  wherein each of the at least two subcircuits comprises at least one vector generator having a first quadrant select in parallel with a second quadrant select and a first variable gain amplifier in parallel with a second variable gain amplifier, and wherein each of the at least two subcircuits is configured to perform polarization tracking and beam steering, and wherein each of the at least two subcircuits communicate a signal to the respective at least two radiating elements for transmission.

12. The multiple radiating element transmitter circuit of claim 11, wherein the multiple radiating element transmitter circuit is configured to transmit a single beam, wherein the at least two subcircuits individually comprise:
  a splitter configured to divide the divided input beam received from the network of splitters, and wherein the splitter generates a first subcircuit signal and a second subcircuit signal; and
  a first vector generator configured to receive the first subcircuit signal and a second vector generator configured to receive the second subcircuit signal, and wherein the first vector generator and the second vector generator are configured to perform the polarization tracking and beam steering.

13. The multiple radiating element transmitter circuit of claim 11, wherein the multiple radiating element transmitter circuit is configured to transmit two beams, wherein the at least two subcircuits individually comprise:
  a first pair of vector generators in parallel configured to individually receive an input signal from the network of splitters and perform beam steering on the input signal;
  a combiner configured to receive and combine two signals from the first pair of vector generators, and wherein the combiner generates a combined output signal;
  a splitter configured to receive the combined output signal and generate a first subcircuit signal and a second subcircuit signal; and
  a second pair of vector generators in parallel configured to receive the first subcircuit signal and the second subcircuit signal respectively, and wherein the second pair of vector generators are configured to perform polarization tracking.

14. A multiple radiating element receiver circuit comprising:
  at least two subcircuits individually in communication with at least two radiating elements; and
  a network of combiners configured to receive intermediate signals from the at least two subcircuits and combine the intermediate signals into at least one output beam;
  wherein each of the at least two subcircuits comprises at least one vector generator having a first quadrant select in parallel with a second quadrant select and a first variable gain amplifier in parallel with a second variable gain amplifier, and wherein each of the at least two subcircuits is configured to perform polarization tracking and beam steering on a signal received from the respective at least two radiating elements.

15. The multiple radiating element receiver circuit of claim 14, wherein the multiple radiating element receiver circuit is configured to form a single beam, wherein the at least two subcircuits individually comprise:
  a first vector generator configured to receive a first signal from the respective at least two radiating elements and a second vector generator configured to receive a second signal from the respective at least two radiating elements, and wherein the first vector generator and the second vector generator are configured to perform the polarization tracking and beam steering; and a combiner configured to combine two signals from the first and second vector generators, and wherein the combiner generates a combined output signal for communication to the network of combiners.

16. The multiple radiating element receiver circuit of claim 14, wherein the multiple radiating element receiver circuit is configured to form two beams, wherein the at least two subcircuits individually comprise:
a first pair of vector generators in parallel configured to individually receive a first RF input signal and a second RF input signal from the respective at least two radiating elements, and wherein the first pair of vector generators are configured to perform polarization tracking on the first and second RF input signals;
a combiner configured to receive and combine the first and second RF input signals from the first pair of vector generators, and wherein the combiner generates a combined output signal;
a splitter configured to receive the combined output signal and generate a first subcircuit signal and a second subcircuit signal; and
a second pair of vector generators in parallel configured to receive the first subcircuit signal and the second subcircuit signal respectively, and wherein the second pair of vector generators are configured to perform beam steering.

17. A multiple radiating element transmitter circuit comprising:
at least two subcircuits individually in communication with at least two radiating elements;
a network of splitters configured to divide at least one input beam and communicate the divided input beam to the at least two subcircuits; and
wherein each of the at least two subcircuits is configured to perform polarization tracking and beam steering, and wherein each of the at least two subcircuits communicate a signal to the respective at least two radiating elements for transmission; and
wherein the multiple radiating element transmitter circuit is configured to transmit two beams, wherein the at least two subcircuits individually comprise;
a first pair of vector generators in parallel configured to individually receive an input signal from the network of splitters and perform beam steering on the input signal;
a combiner configured to receive and combine two signals from the first pair of vector generators, and wherein the combiner generates a combined output signal;
a splitter configured to receive the combined output signal and generate a first subcircuit signal and a second subcircuit signal; and
a second pair of vector generators in parallel configured to receive the first subcircuit signal and the second subcircuit signal respectively, and wherein the second pair of vector generators are configured to perform polarization tracking.

18. The multiple radiating element transmitter circuit of claim 17, wherein the combiner is one of an active power combiner or a passive combiner, and wherein the splitter is one of an active splitter or a passive splitter.

19. A multiple radiating element receiver circuit comprising:
at least two subcircuits individually in communication with at least two radiating elements; and
a network of combiners configured to receive intermediate signals from the at least two subcircuits and combine the intermediate signals into at least one output beam;
wherein each of the at least two subcircuits is configured to perform polarization tracking and beam steering on a signal received from the respective at least two radiating elements; and
wherein the multiple radiating element receiver circuit is configured to form two beams, wherein the at least two subcircuits individually comprise:
a first pair of vector generators in parallel configured to individually receive a first RF input signal and a second RF input signal from the respective at least two radiating elements, and wherein the first pair of vector generators are configured to perform polarization tracking on the first and second RF input signals;
a combiner configured to receive and combine the first and second RF input signals from the first pair of vector generators, and wherein the combiner generates a combined output signal;
a splitter configured to receive the combined output signal and generate a first subcircuit signal and a second subcircuit signal; and
a second pair of vector generators in parallel configured to receive the first subcircuit signal and the second subcircuit signal respectively, and wherein the second pair of vector generators are configured to perform beam steering.

20. The multiple radiating element receiver circuit of claim 19, wherein the combiner is one of an active power combiner or a passive combiner, and wherein the splitter is one of an active splitter or a passive splitter.

* * * * *

UNITED STATES PATENT AND TRADEMARK OFFICE
CERTIFICATE OF CORRECTION

PATENT NO. : 8,639,204 B2
APPLICATION NO. : 13/412901
DATED : January 28, 2014
INVENTOR(S) : David W. Corman, Rob Zienkewicz and David R. Saunders Page 1 of 1

It is certified that error appears in the above-identified patent and that said Letters Patent is hereby corrected as shown below:

In the Claims:

In Column 38, line 59, the "RF" after the word "second" is excluded in error and should be added in the place of "RE" that was included in error.

In Column 41, line 41, the ":" after the word "comprise" is excluded in error and should be added in the place of the ";" that was included in error.

Signed and Sealed this
Sixth Day of May, 2014

Michelle K. Lee
*Deputy Director of the United States Patent and Trademark Office*